United States Patent
Honda et al.

(10) Patent No.: US 6,990,015 B2
(45) Date of Patent: Jan. 24, 2006

(54) SEMICONDUCTOR MEMORY DEVICE USING TUNNELING MAGNETORESISTIVE ELEMENTS

(75) Inventors: Takeshi Honda, Tokyo (JP); Noboru Sakimura, Tokyo (JP); Tadahiko Sugibayashi, Tokyo (JP)

(73) Assignee: NEC Corporation, Tokyo (JP)

(*) Notice: Subject to any disclaimer, the term of this patent is extended or adjusted under 35 U.S.C. 154(b) by 475 days.

(21) Appl. No.: 10/329,463

(22) Filed: Dec. 27, 2002

(65) Prior Publication Data

US 2003/0123199 A1    Jul. 3, 2003

(30) Foreign Application Priority Data

Dec. 28, 2001   (JP)   ............................ 2001-399317
May 29, 2002   (JP)   ............................ 2002-156184

(51) Int. Cl.
  *G11C 11/15*   (2006.01)
(52) U.S. Cl. ........................ 365/173; 365/63; 365/158; 365/189.05

(58) Field of Classification Search ................ 365/173, 365/63, 158, 189.05
See application file for complete search history.

(56) References Cited

U.S. PATENT DOCUMENTS

| | | | |
|---|---|---|---|
| 6,188,615 B1 | 2/2001 | Perner et al. | |
| 6,191,989 B1 | 2/2001 | Luk et al. | |
| 6,477,077 B1 * | 11/2002 | Okazawa | 365/158 |
| 6,844,605 B2 * | 1/2005 | Nishimura | 365/173 |
| 2003/0156450 A1 * | 8/2003 | Higashi | 365/173 |

* cited by examiner

*Primary Examiner*—Tuan T. Nguyen
(74) *Attorney, Agent, or Firm*—Sughrue Mion, PLLC

(57) ABSTRACT

A semiconductor memory device which uses tunneling magnetoresistive element as memory cells and eliminates the temperature dependencies in a write margin and read margin in such a way as to be able to accurately output a write current at the time of writing the memory cells. The semiconductor memory device is constructed in such a way that main bit lines or main word lines are laid out so as to cross bit lines or word lines perpendicularly, and a main bit line selector or a main word line selector which respectively selects the main bit line or the main word line is arranged outside a memory cell array.

33 Claims, 52 Drawing Sheets

FIG. 5A (PRIOR ART)
FIG. 5B (PRIOR ART)
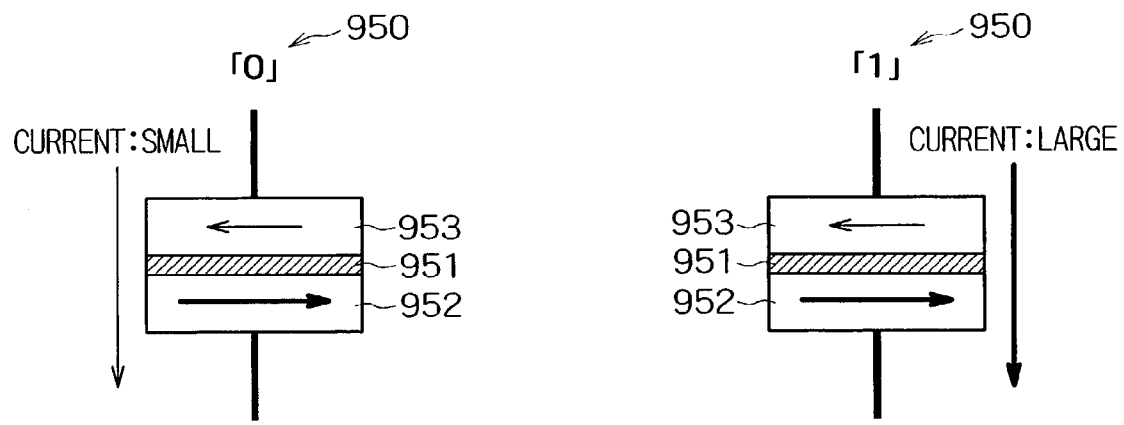
FIG. 6 (PRIOR ART)
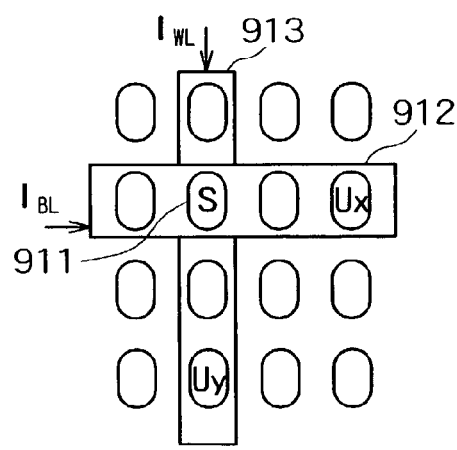

F I G. 26
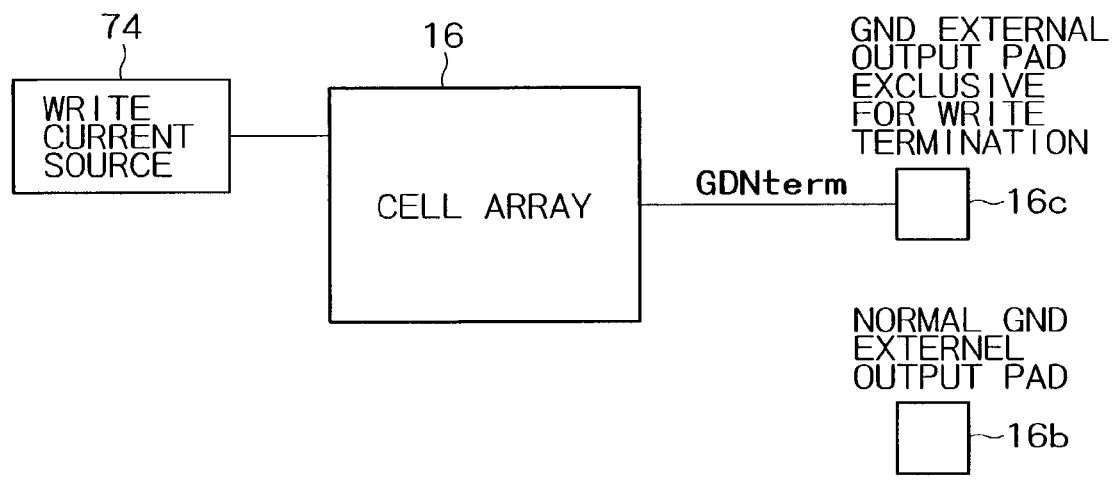

SEMICONDUCTOR MEMORY DEVICE USING TUNNELING MAGNETORESISTIVE ELEMENTS

BACKGROUND OF THE INVENTION

1. Field of the Invention

The present invention relates to a semiconductor memory device, such as an MRAM (Magnetic Random Access Memory), which uses magnetic materials including tunneling magnetoresistive elements (hereinafter called "TMR elements") or giant magnetoresistive elements (hereinafter called "GMR elements").

2. Description of the Related Art

Conventionally, a TMR element 900 is constructed as shown in FIGS. 1A and 1B.

In FIGS. 1A and 1B, the TMR element 900 has a pin layer 902, a tunneling insulator layer 903 and a free layer 904 laminated in order on a diode 901 and is connected in series to the diode 901.

The pin layer 902 is formed of a magnetic material and the direction of its magnetization is fixed at the time it is formed.

The free layer 904 is likewise formed of a magnetic material (e.g., NiFe) but in such a way that its magnetization is reversed by the current that is generated by a bit line 905 connected to the diode 901 and a word line 906 connected to the free layer 904 and passes the TMR element 900 in the up and down direction. "1" (FIG. 1A) or "0" (FIG. 1B) is assigned depending on the direction of the magnetization of the free layer 904.

The magnetic material in use here for the free layer 904 is so selected as to have such a property and shape that the magnetization is easily reversed when a magnetic field is applied in an obliquely rearward direction.

A semiconductor memory device which uses TMR elements with such a structure as memory cells is constructed, for example, as shown in FIG. 2.

In FIG. 2, a semiconductor memory device 910 comprises a plurality of memory cells 911 laid out in a matrix form, a plurality of bit lines (BL) 912 extending in parallel vertically under the individual memory cells 911, a plurality of word lines (WL) 913 extending in parallel horizontally above the individual memory cells 911, an X-side write current source circuit 914, an X selector 914a, a Y-side write current source circuit 915, a Y selector 915a, a terminating power supply circuit 916 an X termination circuit 916a and a Y termination circuit 916b.

Each memory cell 911 is constituted by the above-described TMR element 900 and a current is made to flow in the memory cell 911 by the associated bit line 912 and word line 913 so that the direction of the magnetization of the free layer 904 can be reversed.

According to the semiconductor memory device 910 with such a structure, as one memory cell 911 is selected and a current is made to flow between the bit line 912 and word line 913 associated with that memory cell 911, it is possible to allow the current to flow only in the selected memory cell 911 and reverse the direction of the magnetization to write data of "0" or "1".

The principle of the data writing operation will be discussed by referring to FIGS. 3A through 3C.

The magnetization of the free layer 904 of the TMR element 900 is reversed when a magnetic field of an intensity greater than a certain level is applied to the free layer 904. The characteristic curve of the magnetic field is called an asteroid curve.

Magnetic fields (see FIGS. 3B and 3C) which fit inside the asteroid curve are formed in the memory cells 911 on the selected bit line 912 or the selected word line 913, and a current which makes the combined magnetic field outside the asteroid curve as shown in FIG. 3A is set in the selected memory cell 911.

The principle of a data reading operation will be discussed by referring to FIG. 4.

As each TMR element 900 is equivalent to a variable resistor whose resistance changes in accordance with whether the value of data is "0" or "1", the semiconductor memory device 910 is expressed by an equivalent circuit shown in FIG. 4 because of the diode 901 being connected in series to the TMR element 900.

Because a voltage of 1.2 V is applied to an unselected bit line 912 and a selected word line 913, therefore, the current flows only in the selected memory cell 911. A current value sense amplifier 917 pulls in the current in such a way that a voltage of about 0.3 V is applied between the pin layer 902 and the free layer 904 of the TMR element 900 with respect to a threshold value of 0.7 V of the diode 901. If this current value, when measured, is greater than a reference current set beforehand, data is judged as "0", and if the current value is smaller than the reference current, data is judged as "1".

A semiconductor memory device which uses transistors in place of the diodes 901 is known as disclosed in, for example, U.S. Pat. No. 6,191,989, and a semiconductor memory device which uses neither diodes nor transistors is also known as disclosed in, for example, U.S. Pat. No. 6,188,615.

Although those semiconductor memory devices differ in operations in read mode, their operations in write mode are carried out in the same way as the writing operation of the semiconductor memory device 910 that uses the diodes.

A conventional MRAM cell is constructed as shown in FIGS. 5A and 5B.

In FIGS. 5A and 5B, an MRAM cell 950 is constructed in such a way that a tunneling insulator layer 951 is held by a plurality of ferromagnetic materials, i.e., a fixed ferromagnetic layer 952 and a free ferromagnetic layer 953.

The fixed ferromagnetic layer 952 is formed of a material which has a large coercive force and is designed in such a way that magnetization is fixed in one direction by magnetic coupling or the like of the material with an antiferromagnetic material.

The free ferromagnetic layer 953 is designed in such a way that the magnetization can be reversed by the action of an external magnetic field or the like.

This structure allows the MRAM cell 950 to be stable when the magnetizations of the fixed ferromagnetic layer 952 and the free ferromagnetic layer 953 are parallel or antiparallel to each other and to store information of "0" (FIG. 5A) and information of "1" (FIG. 5B) in the respective two cases.

In the state of "0" or the parallel state, the tunnel current is large, whereas in the state of "1" or the antiparallel state, the tunnel current is small. By detecting the difference between the values of the tunnel currents, therefore, information of "0" or "1" stored in the MRAM cell 950 can be read out.

In case where a semiconductor memory device is constructed to have a memory cell array comprising MRAM cells with such a structure, writing and reading to and from the MRAM cells as individual memory cells can be performed in manners similar to those of the above-described semiconductor memory device 910.

While data writing to each memory cell 911 in the semiconductor memory device 910 is carried out by the magnetic field that is formed by orthogonal currents flowing through the bit line 912 and word line 913 as shown in FIG. 6, data writing cannot be done if the write currents are too small. If the write currents are too large, data is not written in not only the selected memory cell 911 but also the adjoining memory cells 911 connected to the same bit line 912 and the same word line 913 in some cases.

It was therefore necessary to accurately set the values of the currents flowing through the bit line 912 and word line 913 at the time of writing data.

While the asteroid curve depends on the film thickness of the magnetic material, the film thickness has a distribution in the surface of a semiconductor wafer at the time of manufacture and thus varies memory cell by memory cell.

Further, the characteristics of the write current source circuits 914 and 915 would vary chip by chip and it was not possible to completely eliminate the variation.

The variations in the film thickness and the characteristics of the write current source circuits reduce the write margin of each memory cell 911 of the semiconductor memory device 910 and lower the yield of the memory cells 911.

Because the asteroid curve has a temperature dependency, the reversed magnetic field (minimum write current) generally becomes smaller as the temperature gets higher. FIG. 7 shows the results of measuring the reversed magnetic field of permalloy with a size of 1 $\mu$m× 2 $\mu$m and a thickness of 5 nm at 25° C., 75° C. and 125° C. It is apparent from the diagram that as the temperature rises, the reversed current of the magnetic film becomes smaller at a rate of about 2%/10° C.

Generally, the operation guaranteeing temperature of a semiconductor device is about 75° C. or lower, but the write current at 75° C. in FIG. 7 is dropped about 10%. The use of the write current at room temperature (25° C.) directly at a high temperature therefore causes disturbance in unselected memory cells. At that time, the current driving performance of the write current source circuit falls with a rise in temperature, so that while the write current decreases slightly, not large enough to follow up a reduction in reversed current. Such a reduction in reversed current which is originated from a temperature rise becomes more notable as the miniaturization of memory cells goes further.

It is also known that a rise in temperature reduces the read margin. It is generally known that the resistance R and conductance G of a TMR element have voltage dependencies as shown in FIGS. 8A and 8B and have temperature dependencies as shown in FIGS. 8C and 8D.

Because the MR ratio and the current difference also have temperature dependencies as shown in FIGS. 8E and 8F, therefore, the read margin drops as the temperature rises.

The read current in, for example, an MRAM is a tunnel current between magnetic materials, so that as the temperature rises, the magnetization of the magnetic film is reduced and the tunneling probability is increased by thermal excitation. This increases the tunnel current and abruptly decreases the magnetoresistance ratio, thus reducing the read margin. Such a reduction in read margin would have a greater temperature dependency as the miniaturization of the memory cells would get finer.

SUMMARY OF THE INVENTION

Accordingly, it is an object of the invention to provide a semiconductor memory device, particularly, an MRAM, which can accurately output the necessary and sufficient write current even in case where the margin for the write current value is small and reduces changes in write margin and read margin caused by a temperature change.

A semiconductor memory device according to one aspect of the present invention comprises a memory cell array having a plurality of tunneling magnetoresistive elements laid out in a hierarchical matrix form; a plurality of bit lines for letting a current to flow in those memory cells which are aligned in one direction; a plurality of word lines for letting a current to flow in those memory cells which are aligned in the other direction in such a way as to cross the bit lines; an X decoder for selecting a word line with respect to a selected memory cell; a Y decoder for selecting a bit line with respect to the selected memory cell, whereby data is written in the selected memory cell located at an intersection of the selected word line and the selected bit line by a combined magnetic field generated by letting a current to flow in the selected word line and bit line; and main bit lines which supply a write current from a write current source to the bit lines and are laid out in such a way as to cross the bit lines perpendicularly.

This structure of the semiconductor memory device eliminates the need to provide a main bit line selector in the memory cell array, so that the sizes of transistors which constitute the main bit line selector can be made sufficiently large while hardly influencing the size of the chip which constitutes the semiconductor memory device. This can make the value of the write current that passes the main bit line selector sufficiently large, so that writing to a desired memory cell can be done accurately with a stable write current.

The semiconductor memory device may further comprise a main bit line selector, located outside the memory cell array on a same side as the X decoder, for selecting a main bit line.

This structure of the semiconductor memory device can permit a stable write current to flow without enlarging the area of the chip that constitutes the semiconductor memory device.

According to the second aspect of the invention, there is provided a semiconductor memory device comprising a memory cell array having a plurality of tunneling magnetoresistive elements laid out in a hierarchical matrix form; a plurality of bit lines for letting a current to flow in those memory cells which are aligned in one direction; a plurality of word lines for letting a current to flow in those memory cells which are aligned in the other direction in such a way as to cross the bit lines; an X decoder for selecting a word line with respect to a selected memory cell; a Y decoder for selecting a bit line with respect to the selected memory cell, whereby data is written in the selected memory cell located at an intersection of the selected word line and the selected bit line by a combined magnetic field generated by letting a current to flow in the selected word line and bit line; and main word lines which supply a write current from a write current source to the word lines and are laid out in such a way as to cross the word lines perpendicularly.

This structure of the semiconductor memory device eliminates the need to provide a main word line selector in the memory cell array, so that the sizes of transistors which constitute the main word line selector can be made sufficiently large while hardly influencing the size of the chip which constitutes the semiconductor memory device. This can make the value of the write current that passes the main word line selector sufficiently large, so that writing to a desired memory cell can be done accurately with a stable write current.

This semiconductor memory device may further comprise a main word line selector, located outside the memory cell array on a same side as the Y decoder, for selecting a main word line.

According to the third aspect of the invention, there is provided a semiconductor memory device comprising a memory cell array having a plurality of tunneling magnetoresistive elements laid out in a matrix form; a plurality of bit lines for letting a current to flow in those memory cells which are aligned in one direction; a plurality of word lines for letting a current to flow in those memory cells which are aligned in the other direction in such a way as to cross the bit lines; an X decoder for selecting a word line with respect to a selected memory cell; a Y decoder for selecting a bit line with respect to the selected memory cell, whereby data is written in the selected memory cell located at an intersection of the selected word line and the selected bit line by a combined magnetic field generated by letting a current to flow in the selected word line and bit line; and a first circuit for changing a write current from a write current source independently depending on a direction of the write current and fixing a value of the changed write current.

With this structure of the semiconductor memory device, the first circuit can set the optimal write current for each memory cell and can ensure accurate data writing without making the write current too large or too small but by a relatively large operational margin.

According to the fourth aspect of the invention, there is provided a semiconductor memory device which uses at least one tunneling magnetoresistive element, wherein two or more of at least some of tunneling magnetoresistive elements constitute a first memory element, the tunneling magnetoresistive elements are connected in series to one another when the first memory element is in read mode, and at least a part of the first memory element is used as a memory location for a defective portion of the semiconductor memory device.

With this structure of the semiconductor memory device, the first memory element which is comprised of two or more tunneling magnetoresistive elements does not need a sense amplifier. Even the use of the first memory element for saving various setting values or the like would not result in a large increase in the area of the chip constituting the semiconductor memory device and can allow at least a part of the first memory element to be used to save the address of, for example, a defective memory cell.

In the semiconductor memory device according to the third aspect of the invention, the first circuit may have a register circuit having a capability of fixing a value, the register circuit may include a first memory element comprised of two or more of at least some of tunneling magnetoresistive elements in such a way that the tunneling magnetoresistive elements are connected in series to one another when the first memory element is in read mode, and at least a part of the first memory element may be used as a memory location for a defective portion of the semiconductor memory device.

This structure of the semiconductor memory device can allow the first circuit to be designed in a small area.

In the semiconductor memory device according to the third aspect of the invention, the first circuit can change a write current value for a bit line or a word line in accordance with an address of the selected memory cell.

With this structure of the semiconductor memory device, the write current does not become too large or too small depending on the address of a memory cell to be written, and accurate data writing to memory cells can be carried out with the write current within an operational margin.

In the semiconductor memory device according to the third aspect of the invention, a terminating power supply for terminating the write current may have a test mode for stopping a power supply circuit, and an external terminal for leading a node of the terminating power supply to outside.

This structure of the semiconductor memory device can ensure accurate measurement of the write current so that the first circuit can be adjusted more precisely.

The semiconductor memory device according to the third aspect of the invention, the write current source may have a basic transistor and an adjusting transistor as output transistors and the basic transistor in the output transistors may have a minimum gate length while the adjusting transistor has a gate length greater than the minimum value.

This structure of the semiconductor memory device can output the accurate write current without increasing the occupying area of the write current source.

In the semiconductor memory device according to any one of the first and second aspects of the invention and their modifications, each of the main bit lines may be designed as complementary main bit lines one of which is connected to the write current source and the other one of which is fixed to a termination to thereby distinguishably write "0" or "1" in a selected memory cell.

This structure of the semiconductor memory device can simplify the write current source on the bit line side and can allow the first circuit to be designed compact.

In this semiconductor memory device, the selected memory cell may be connected to a sense amplifier in read mode by using both of the complementary main bit lines.

This structure of the semiconductor memory device can increase the operational margin in read mode.

The semiconductor memory device may further include exclusive circuit, separate from a selector for selecting a bit line, as a circuit for fixing a potential of unselected bit lines.

This structure of the semiconductor memory device can prevent the occupying area of the selector from increasing.

In the semiconductor memory device, a power supply line for a terminating power supply in write mode may be separated from other power supply lines in a chip which constitutes the semiconductor memory device.

This structure of the semiconductor memory device can permit the potential of the terminating power supply to be held at the ground potential accurately so that the first circuit can be adjusted more precisely.

According to the fifth aspect of the invention, there is provided a semiconductor memory device comprising a memory cell array having a plurality of tunneling magnetoresistive elements laid out in a hierarchical matrix form; a plurality of bit lines, formed in a sub array, for letting a current to flow in those memory cells which are aligned in one direction; a plurality of word lines, formed in a sub array, for letting a current to flow in those memory cells which are aligned in the other direction in such a way as to cross the bit lines; an X decoder for selecting a word line with respect to a selected memory cell; a Y decoder for selecting a bit line with respect to the selected memory cell, whereby data is written in the selected memory cell located at an intersection of the selected word line and the selected bit line by a combined magnetic field generated by letting a current to flow in the selected word line and bit line; and a switching element through which potentials of unselected word lines or unselected bit lines are fixed, while potentials of the other ones of the unselected word lines and unselected bit lines are fixed via associated memory cells.

With this structure of the semiconductor memory device, unselected word lines or bit lines are not driven by the switching element and is connected to the associated bit line or word line via the associated memory cell, so that the bit line or word line is connected to the terminating power supply. In case where the resistances of the memory cells are high but the operational time of the memory cells can be slow, therefore, the chip that constitutes the semiconductor memory device can be designed in a small area with a simple structure without using NOR gates and NMOS transistors or the like.

In the semiconductor memory device according to any one of the first and second aspects of the invention and their modifications and the fifth aspect of the invention, each of the main word lines may be designed as complementary main word lines one of which is connected to the write current source and the other one of which is fixed to a termination to thereby change a direction of the write current.

This structure of the semiconductor memory device can simplify the write current source on the word line side and can allow the first circuit to be designed compact.

In this semiconductor memory device, the selected memory cell may be connected to a sense amplifier in read mode by using both of the complementary main word lines.

This structure of the semiconductor memory device can increase the operational margin in read mode.

In the semiconductor memory device, according to any one of the first and second aspects of the invention and their modifications and the fifth aspect of the invention, a write main bit line and a read main bit line may be separately provided as each of the main bit lines.

This structure of the semiconductor memory device can permit the read main bit line to be connected to the associated bit line via the read-only switching element, so that a transistor with a narrow gate width can be used for the switching element without considering the write current. This can eliminate the influence of the parasitic capacitor of the transistor and can thus speed up data reading.

In the semiconductor memory device according to any one of the first and second aspects of the invention and their modifications and the fifth aspect of the invention, a selection switch element provided in a sub array may have a logical sum operation function for ORing an output of the X decoder or the Y decoder and a block select signal.

This structure of the semiconductor memory device can reduce the number of circuit elements through which the block select signal passes, thus reducing the load and shortening the access time.

In this semiconductor memory device, the block select signal may include information of operation modes including a write or read mode.

This structure of the semiconductor memory device can eliminate the need to output information on an operation mode, such as a write mode or read mode, via a separate signal line, thus ensuring data writing and reading to and from the memory cells with fewer interconnections.

According to the sixth aspect of the invention, there is provided a semiconductor memory device comprising a memory cell array having a plurality of tunneling magnetoresistive elements laid out in a matrix form; a plurality of bit lines for letting a current to flow in those memory cells which are aligned in one direction; a plurality of word lines for letting a current to flow in those memory cells which are aligned in the other direction in such a way as to cross the bit lines; an X decoder for selecting a word line with respect to a selected memory cell; and a Y decoder for selecting a bit line with respect to the selected memory cell, whereby data is written in the selected memory cell located at an intersection of the selected word line and the selected bit line by a combined magnetic field generated by letting a current to flow in the selected word line and bit line, a temperature dependency of an output current of a write current source being set as a value between a temperature dependency of a magnetization reversal characteristic of the selected memory cell and a temperature dependency of a magnetization reversal characteristic of unselected memory cells.

With this structure of the semiconductor memory device, the temperature dependency of the output current of the write current source is set as a value between the temperature dependency of a magnetization reversal characteristic of the selected memory cell and a temperature dependency of a magnetization reversal characteristic of unselected memory cells. The output current of the write current source therefore has the temperature dependency that is suitable for the negative temperature dependency of the magnetization reversal characteristic of the memory cells, so that the ratio of the reversed magnetic field of the unselected memory cells to the magnetic field generated by the interconnections becomes constant irrespective of the temperature. This makes it difficult to cause a so-called disturbance so that the write margin does not become smaller with a rise in temperature and a predetermined write margin can be secured.

In this semiconductor memory device, the temperature dependency of the output current of the write current source may be generated by a voltage from a reference potential circuit, and a part of the reference potential circuit may be a band-gap reference circuit.

This structure of the semiconductor memory device can allow the use of the band-gap reference circuit for generating a reference voltage, which is generally used in semiconductor memory devices. This makes it unnecessary to additionally prepare a reference voltage generating circuit, thus contributing to making the circuit area smaller. In addition, the use of the circuit and process that have already been established can shorten the development stage of the semiconductor memory device and can ensure the fabrication of a highly reliable semiconductor memory device.

In this semiconductor memory device, the reference potential circuit may use a tunneling magnetoresistive element as a resistor element.

This structure of the semiconductor memory device makes smaller the possibility that the temperature dependency of the reversed current of the memory cells and the temperature dependency of the write current from the write current source deviate from the designed values due to a process variation, thus improving the yield.

According to the seventh aspect of the invention, there is provided a semiconductor memory device comprising a memory cell array having a plurality of tunneling magnetoresistive elements laid out in a matrix form; a plurality of bit lines for letting a current to flow in those memory cells which are aligned in one direction; a plurality of word lines for letting a current to flow in those memory cells which are aligned in the other direction in such a way as to cross the bit lines; an X decoder for selecting a word line with respect to a selected memory cell; and a Y decoder for selecting a bit line with respect to the selected memory cell, whereby data is written in the selected memory cell located at an intersection of the selected word line and the selected bit line by a combined magnetic field generated by letting a current to flow in the selected word line and bit line, a temperature dependency of an output voltage of a read circuit being set to be matched with a temperature dependency of the tunneling magnetoresistive elements.

With this structure of the semiconductor memory device, the output voltage of the read circuit is set to an adequate voltage suitable for the negative temperature dependency of the magnetoresistive elements of the memory cells. This maximizes the sense current at an arbitrary temperature, thus making it possible to keep a predetermined large read margin.

In this semiconductor memory device, the temperature dependency of the output voltage of the read circuit may be generated by a voltage from a reference potential circuit, and a part of the reference potential circuit may be a band-gap reference circuit.

This structure of the semiconductor memory device can allow the use of the band-gap reference circuit for generating a reference voltage, which is generally used in semiconductor memory devices. This makes it unnecessary to additionally prepare a reference voltage generating circuit, thus contributing to making the circuit area smaller. In addition, the use of the circuit and process that have already been established can shorten the development stage of the semiconductor memory device and can ensure the fabrication of a highly reliable semiconductor memory device.

In this semiconductor memory device, the band-gap reference circuit may use a tunneling magnetoresistive element as a resistor element.

This structure of the semiconductor memory device makes smaller the possibility that the temperature dependency of the reversed current of the memory cells and the temperature dependency of the read current from the read circuit deviate from the designed values due to a process variation, thus improving the yield.

In the semiconductor memory device according to any one of the seventh aspect of the invention and its modifications, the semiconductor memory device may be an MRAM (Magnetic Random Access Memory) and a memory cell current in read mode may be about 10 μA.

This structure of the semiconductor memory device can guarantee the write margin and read margin even when the semiconductor memory device is an MRAM.

In the semiconductor memory device according to any one of the sixth and seventh aspects of the invention and their modifications, a temperature compensation circuit for setting a temperature dependency may use a sub threshold current.

This structure of the semiconductor memory device can ensure the setting of the temperature dependency, thus making it possible to stably guarantee the write margin and read margin.

In the semiconductor memory device according to any one of the sixth and seventh aspects of the invention and their modifications, a temperature compensation circuit for setting a temperature dependency may have a trimming circuit capable of adjusting a temperature dependency of an output current.

This structure of the semiconductor memory device can easily adjust the temperature dependency of the output current with a simple structure.

BRIEF DESCRIPTION OF THE DRAWINGS

FIGS. 5A and 5B are schematic perspective views showing the operational principle of a memory cell which uses a conventional MRAM element;

FIG. 6 is a schematic diagram showing the principle of the writing operation of a semiconductor memory device using the memory cells in FIGS. 5A and 5B;

FIG. 26 is a block diagram showing the GND interconnection for termination in the semiconductor memory device in FIG. 22;

DETAILED DESCRIPTION OF THE PREFERRED EMBODIMENTS

Preferred embodiments of the invention will now be described with reference to the accompanying drawings.

(First Embodiment)

To begin with, a semiconductor memory device according to the first embodiment of the invention will be discussed referring to FIGS. 9 to 21.

Figure 1A:
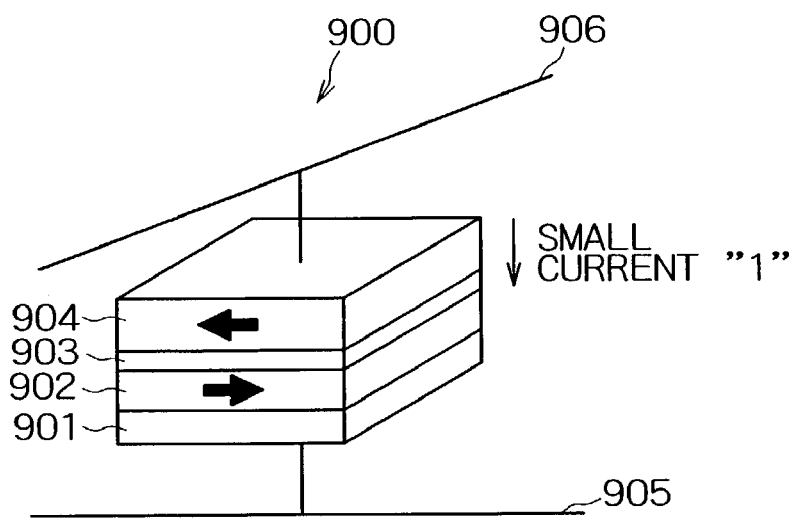
FIGS. 1A and 1B are schematic perspective views showing the operational principle of a memory cell which uses a conventional TMR element.
Figure 1B:
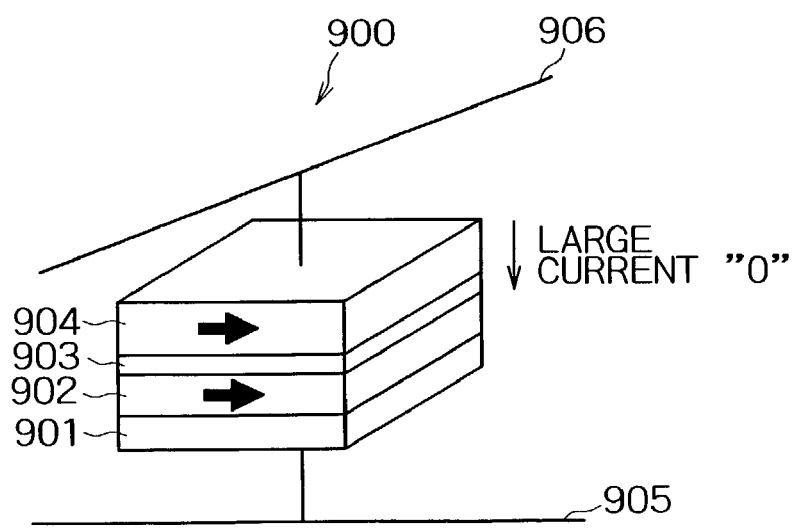
Figure 2:
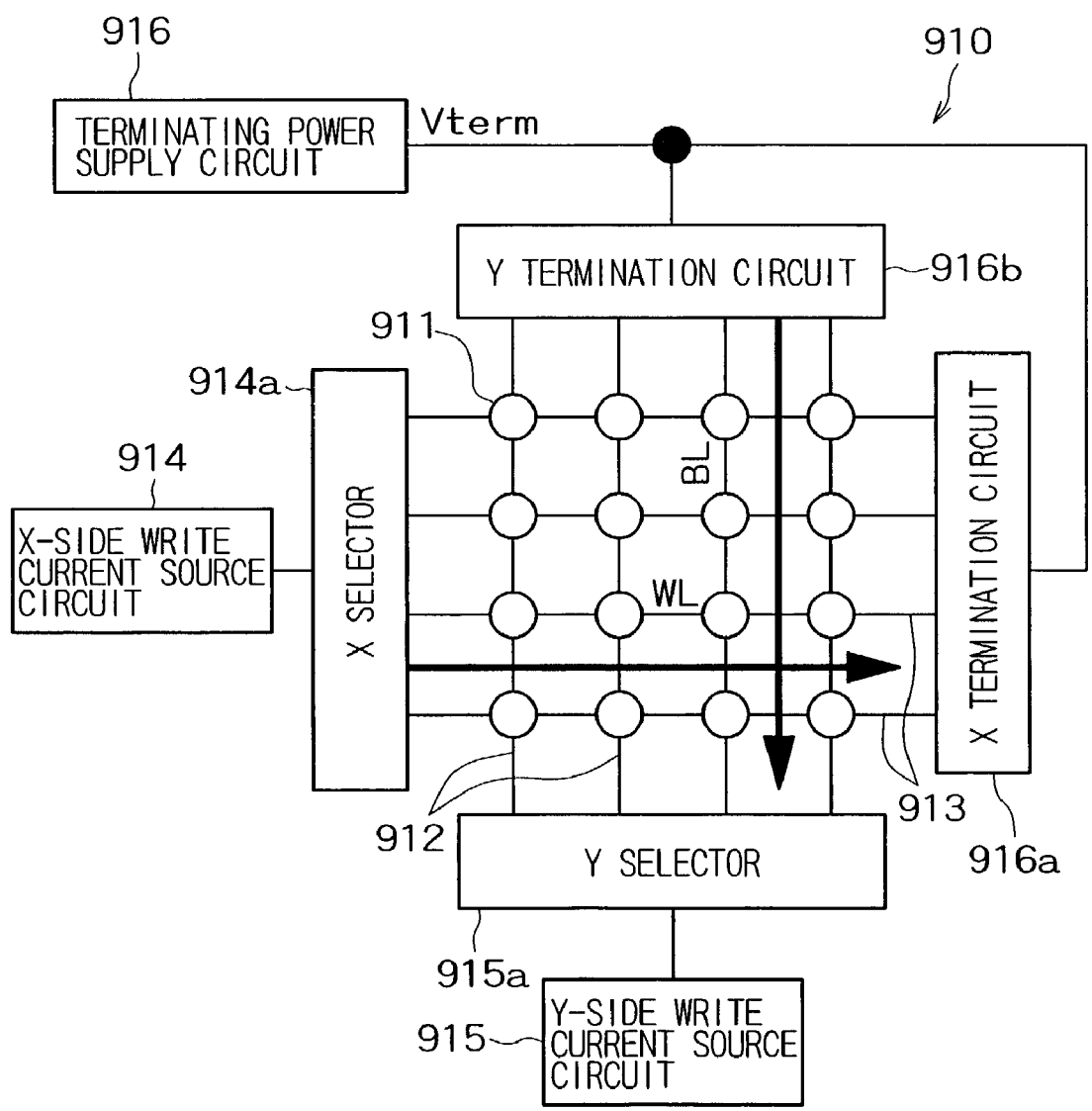
FIG. 2 is a schematic diagram showing the principle of the writing operation of a semiconductor memory device using the memory cells in FIGS. 1A and 1B.
Figure 3A:
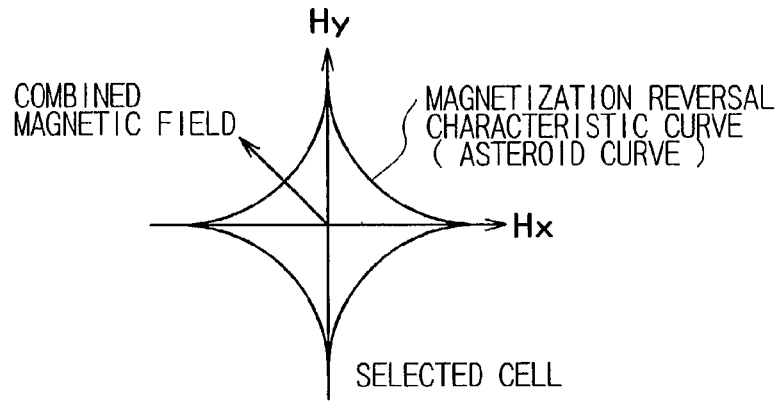
FIGS. 3A through 3C are diagrams depicting asteroid characteristics of a TMR element.
Figure 3B:
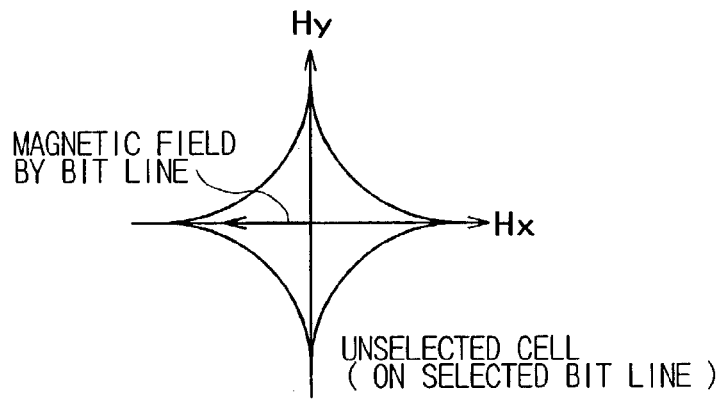
Figure 3C:
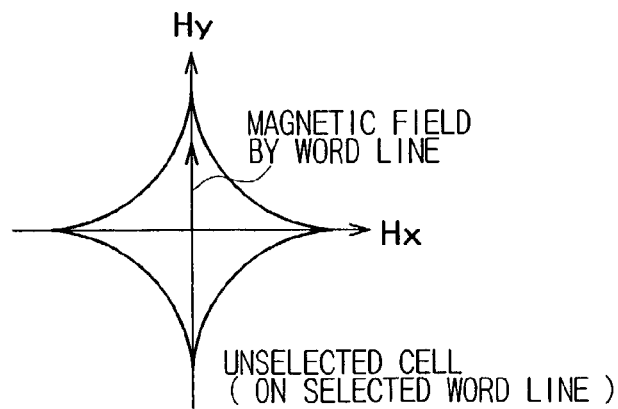
Figure 4:
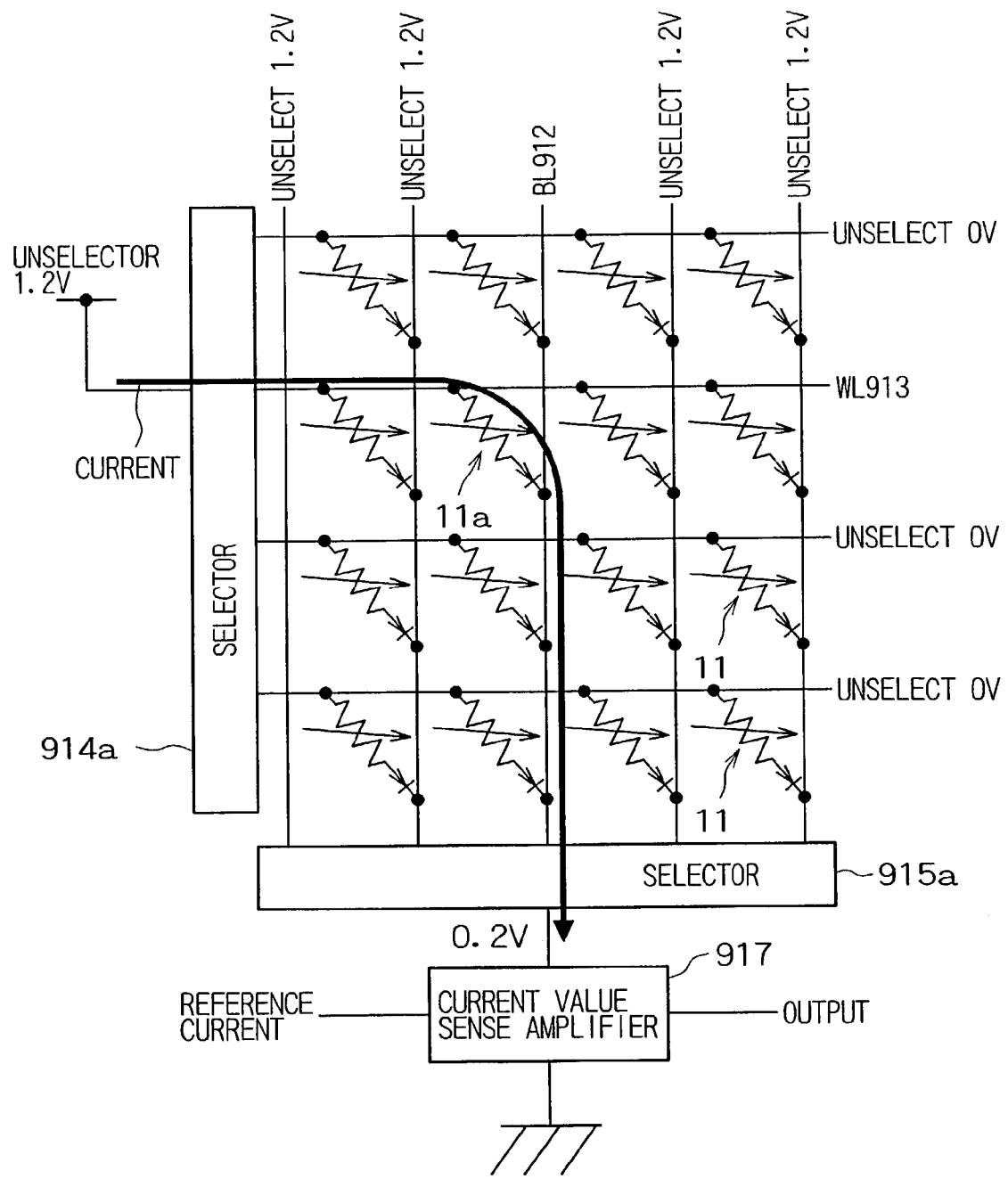
FIG. 4 is a block diagram showing the state of an example of a conventional semiconductor memory device which uses TMR elements and diodes in write mode.
Figure 7:
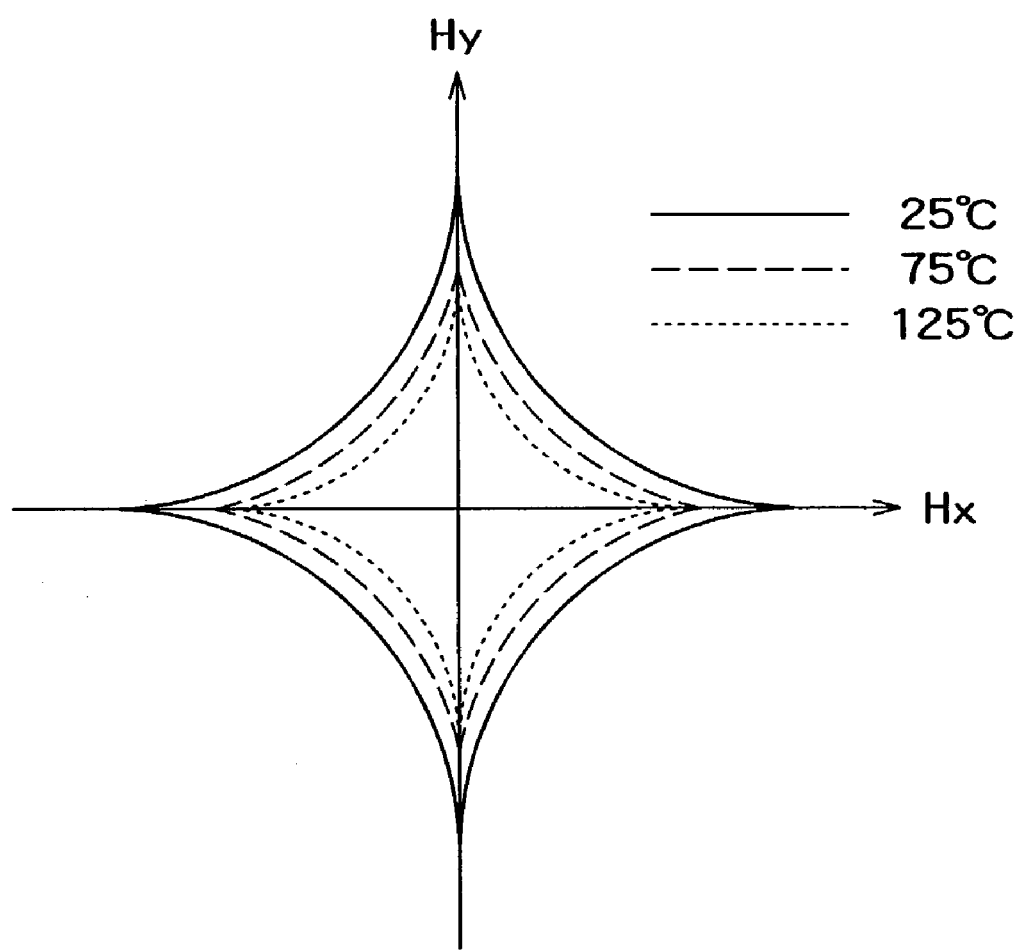
FIG. 7 is a diagram showing the temperature dependencies of the asteroid characteristics of a conventional TMR element and MRAM element.
Figure 8A:
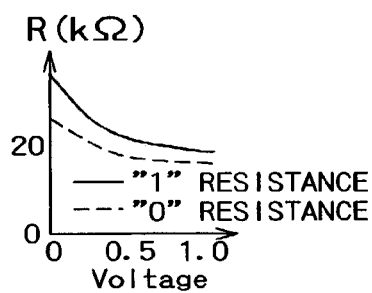
FIGS. 8A and 8B are graphs showing the voltage dependencies of the conventional TMR element.
Figure 8B:
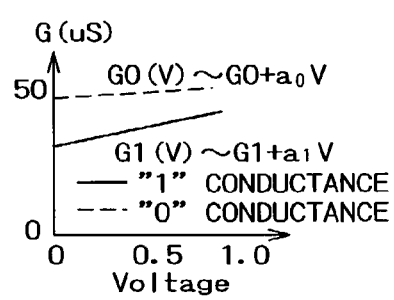
Figure 8C:
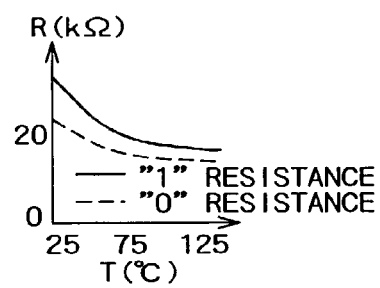
FIGS. 8C and 8D are graphs showing the temperature dependencies of the conventional TMR element.
Figure 8D:
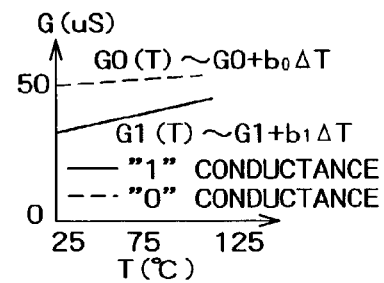
Figure 8E:
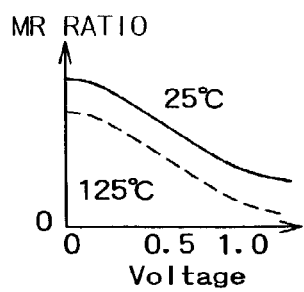
FIGS. 8E and 8F are graphs showing the temperature dependencies of the MR ratio and current difference of the conventional TMR element.
Figure 8F:
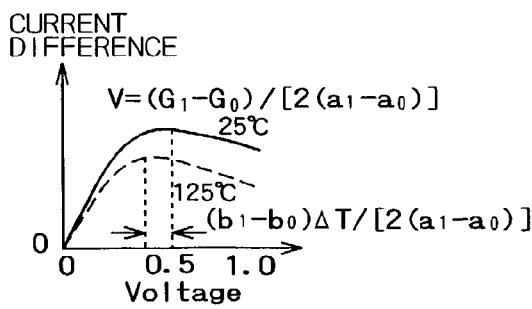
Figure 9:
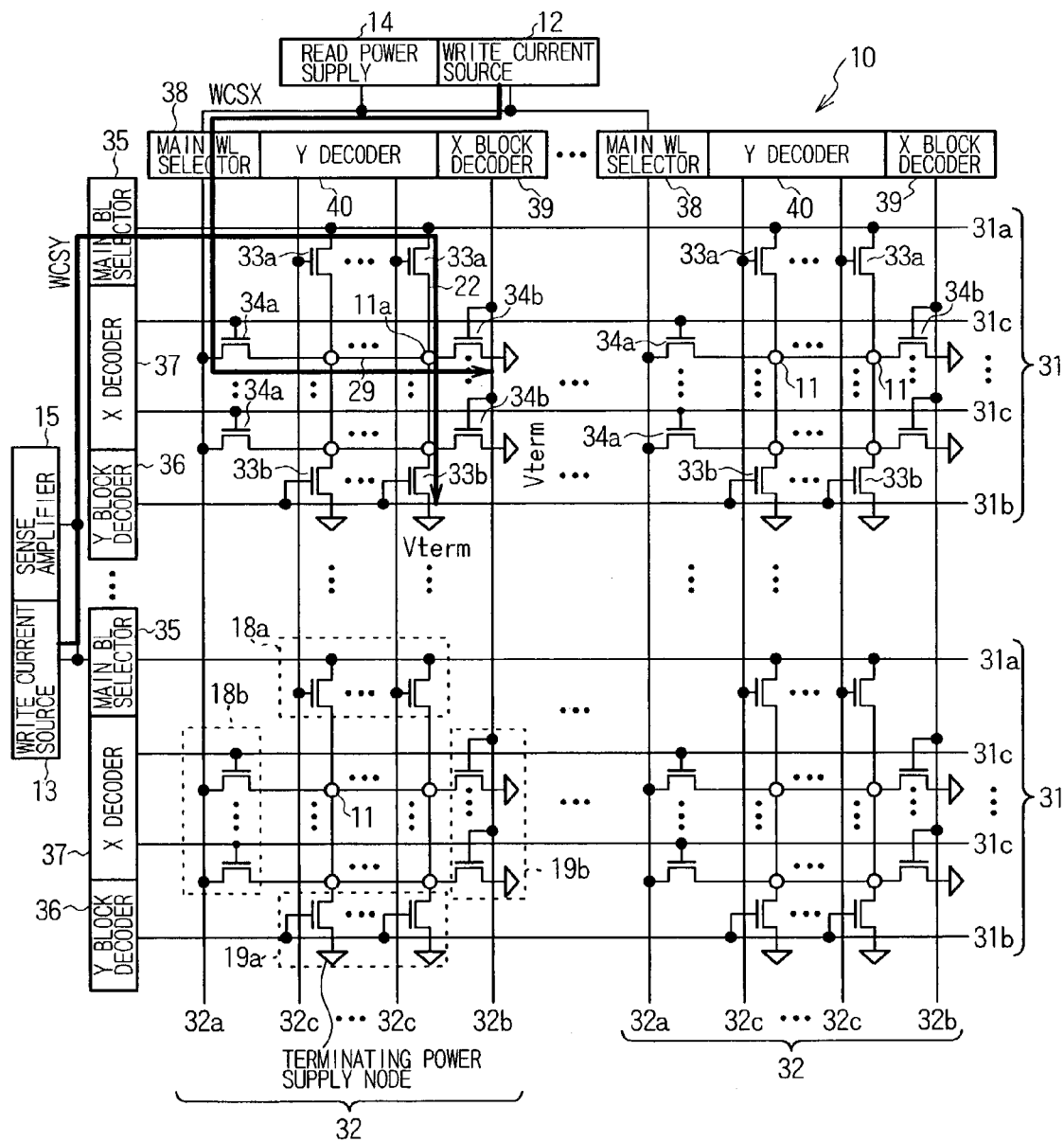
FIG. 9 is a block diagram showing the state of a semiconductor memory device according to a first embodiment of the invention in write mode.

FIG. 9 is a block diagram showing the state of a semiconductor memory device 10 according to the first embodiment.

As shown in FIG. 9, the semiconductor memory device 10 includes a plurality of memory cells 11 laid out in a matrix form, write current sources 12 and 13 for executing data writing to the individual memory cells 11, and a read power supply 14 and a sense amplifier 15 which work in reading data from the individual memory cells 11.

FIG. 9 shows the state of the semiconductor memory device 10 in write mode and shows, in thick lines, those selectors, transistors and so forth which are turned on at the time of writing a memory cell 11a.

A current flows to the memory cell 11a from the write current source 12 via a main word line selector 38, a main word line 32a and a word line 29 and a current also flows to the memory cell 11a from the write current source 13 via a main bit line selector 35, a main bit line 31a and a bit line 22, thereby writing data to the memory cell 11a.

The structure of each memory cell 11 will be discussed referring to FIG. 10.

Figure 10:
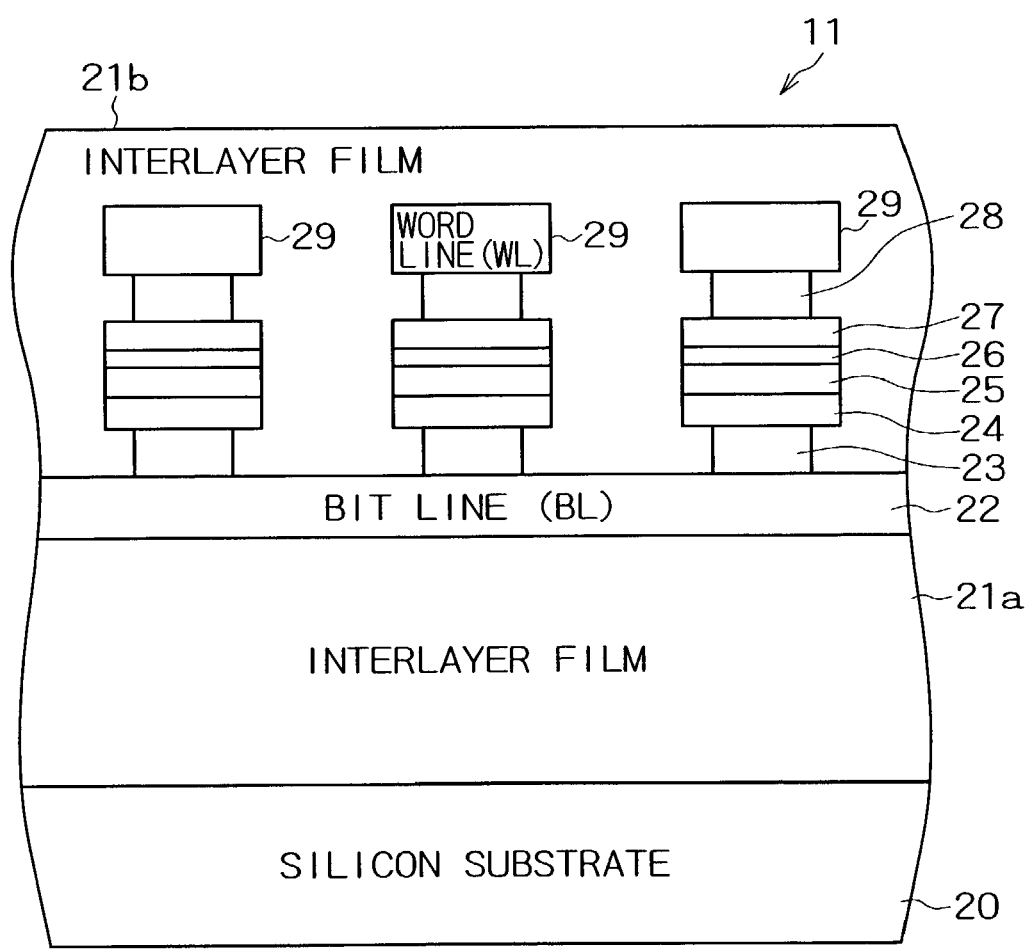
FIG. 10 is an enlarged cross-sectional view showing the structure of a TMR element used as a memory element in the semiconductor memory device in FIG. 9.

In FIG. 10, each of the memory cells 11 is comprised of an associated one of plural bit lines (BL) 22, formed on a silicon substrate 20 via an interlayer film 21a and horizontally extending in parallel, an associated one of pin-layer fixing antiferromagnetic layers 24 laid out on the bit lines 22 in a matrix form via contacts 23, a pin layer 25 of a ferromagnetic material, a tunneling insulator layer 26 and a free layer 27 of a ferromagnetic material formed in the named order on the antiferromagnetic layer 24, an associated one of plural word lines (WL) 29, formed on the free layers 27 via contacts 28 and extending in parallel in a direction perpendicular to the surface of the drawing sheet, and an interlayer film 21a which covers the mentioned elements 22 to 29.

The memory cells 11, each constituted by a TMR element 30 which comprises the pin layer 25, the tunneling insulator layer 26 and the free layer 27, are laid out in a matrix form as each memory cell 11 is formed at the intersection of the bit line 22 and the word line 29 both of which have hierarchical structures and extend perpendicularly to each other.

Figure 11:
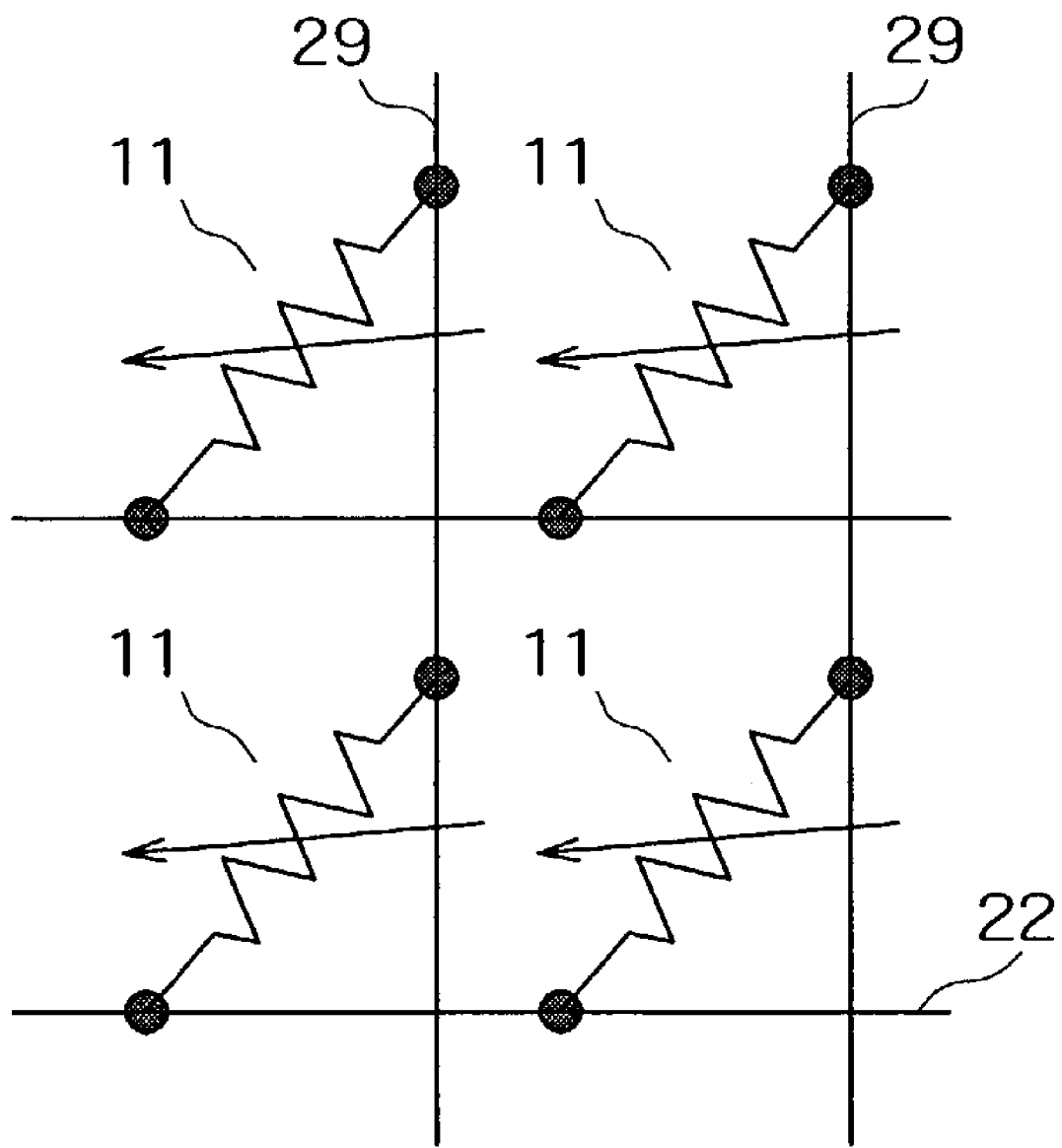
FIG. 11 is an equivalent circuit diagram of four TMR elements in FIG. 11.

Each memory cell 11 is represented by a variable resistor as shown in an equivalent circuit in FIG. 11.

The bit lines 22 are laid in such a way as to be divided into groups each of which crosses a predetermined number of word lines 29 with respect to the vertical direction and constitutes an X block.

The word lines 29 are likewise laid in such a way as to be divided into groups each of which crosses a predetermined number of bit lines 22 with respect to the horizontal direction and constitutes a Y block.

The semiconductor memory device 10 has main bit lines (MBL) 31 laid out hierarchically in such a way as to cross the bit lines (BL) 22 perpendicularly and main word lines (MWL) 32 laid out hierarchically in such a way as to cross the word lines (WL) 29 perpendicularly.

In a case shown in FIG. 9, a main bit line 31a is connected to the top ends of the individual bit lines 22 via upper switching transistors 33a, respectively.

The lower ends of the individual bit lines 22 are connected to a terminating power supply (not shown) via lower switching transistors 33b, respectively. Each switching transistor 33b has its gate connected to a lower main bit line 31b.

The upper main bit line 31a has its left end connected to the main bit line selector 35 and the lower main bit line 31b has its left end connected to a Y block decoder 36.

In the case shown in FIG. 9, a main word line 32a is connected to the left ends of the individual word lines 29 via left switching transistors 34a, respectively.

The right ends of the individual word lines 29 are connected to a terminating power supply (not shown) via right switching transistors 34b, respectively. Each switching transistor 34b has its gate connected to a right main word line 32b.

The left main bit line 32a has its upper end connected to the main word line selector 38 and the right main word line 32b has its upper end connected to an X block decoder 39.

Further, main word lines 32c are laid along the individual bit lines 22 between the main word lines 32a and 32b and are connected to the gates of the switching transistors 33a that are connected to the upper ends of the bit lines 22. The upper ends of those main word lines 32c are connected to a Y decoder 40.

Also, main bit lines 31c are laid along the individual word lines 29 between the main bit lines 31a and 31b and are connected to the gates of the switching transistors 34a that are connected to the left ends of the word lines 29. The left ends of those main bit lines 31c are connected to a X decoder 37.

The write current source 12 and the read power supply 14 are both connected to the main word line selector 38, and the write current source 13 and the sense amplifier 15 are both connected to the main bit line selector 35.

The write current source 12 is a bidirectional power supply, while the write current source 13 is a unidirectional power supply.

A Y selector circuit 18a is comprised of the main bit line selector 35, the Y block decoder 36 and the Y decoder 40, and an X selector circuit 18b is comprised of the main word line selector 38, the X block decoder 39 and an X decoder 37.

A Y termination circuit 19a is comprised of the transistors 33b whose gates are connected to the main bit line 31b, and an X termination circuit 19b is comprised of the transistors 34b whose gates are connected to the main word line 32b.

In this case, the potentials of an unselected bit line 22 and unselected word line 29 are set to a voltage Vterm of the unillustrated terminating power supply.

The voltage Vterm is, for example, 0.8 V, an intermediate voltage between a voltage Vcc (e.g., 2.5 V) of the write current sources 12 and 13 as an external voltage and a ground potential GND (e.g., 0 V). The reason why the voltage Vterm is not exactly the middle of the voltage Vcc and the ground potential GND is that a single NMOS transistor which makes it harder for the current to flow as the source potential becomes higher is used as a selector.

Figure 12:
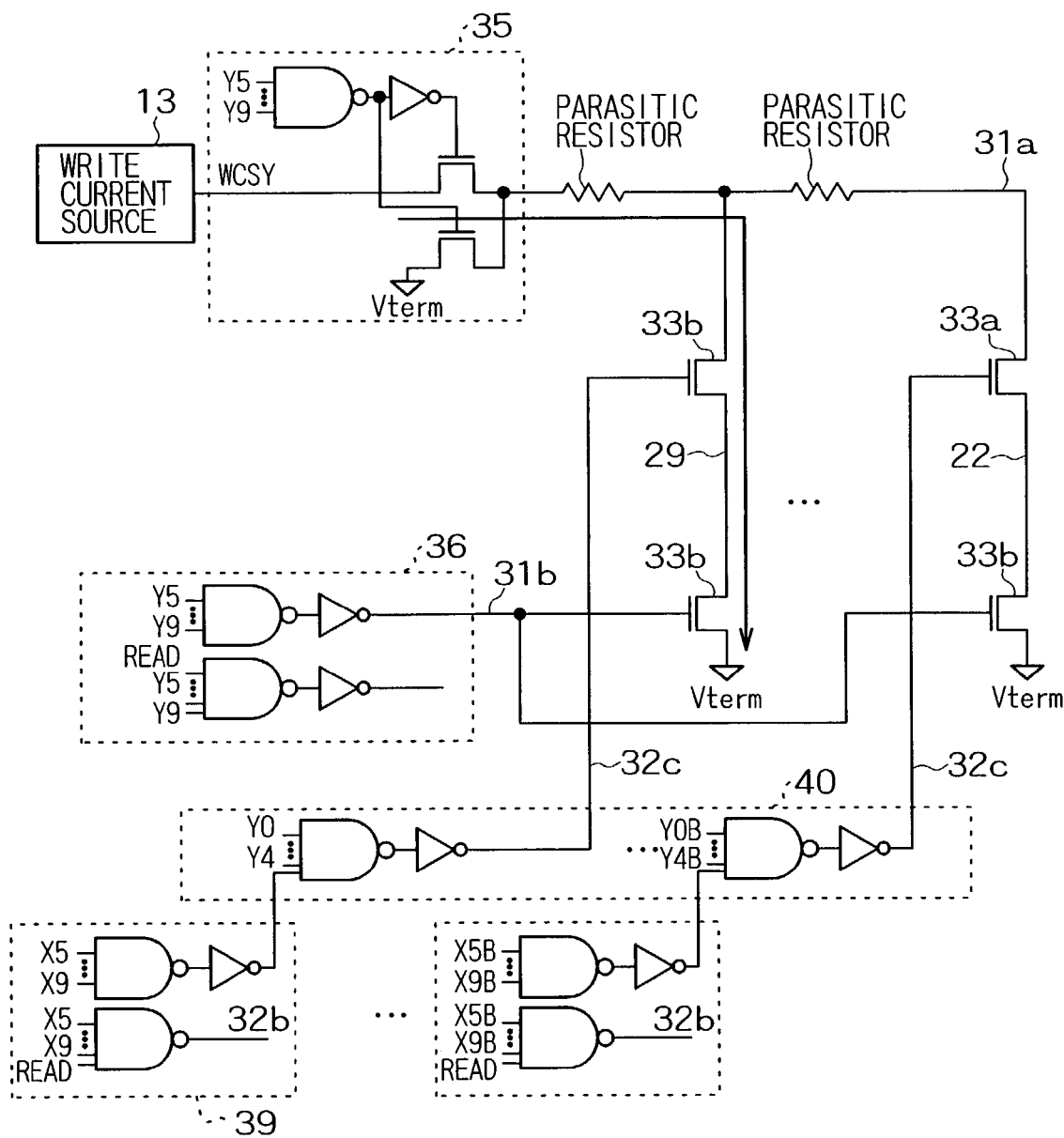
FIG. 12 is a circuit diagram of a write circuit system in the semiconductor memory device in FIG. 9.

FIG. 12 presents a circuit diagram of a write circuit system in the semiconductor memory device 10, which includes parasitic resistors of the interconnections, and shows, in a thick line, that selector and those transistors and so forth which are turned on at the time of writing the memory cell 11a.

In FIG. 12, a bit line 22 is selected by the main bit line selector 35, the Y decoder 40 and the Y block decoder 36.

An block select signal on the X side is input to the Y decoder 40 which includes logics of some X addresses.

A signal READ is input to the Y block decoder 36 so that the bit lines 22 in a selected block are not connected to the writing terminal in read mode where a signal 31b is enabled.

In write mode, the parasitic resistor of the interconnection produces a potential difference between the band the bit line 22 word line 29, causing the current to flow to the memory cell 11. As the memory cell 11 has a resistance of about 1 MΩ and the write current is about 2 mA, however, the current that leaks in the memory cell 11 becomes equal to or smaller than 1 μA. Therefore, the leak current does not influence the writing operation of the memory cell 11.

In case where the write current is let to flow in a bit line 22 distant from the write current source 13, the parasitic resistor of the interconnection becomes large, resulting in a large voltage drop. The write current source 13 which is constituted as a part in the semiconductor memory device 10 takes a simple structure as shown in FIG. 13.

Figure 13:
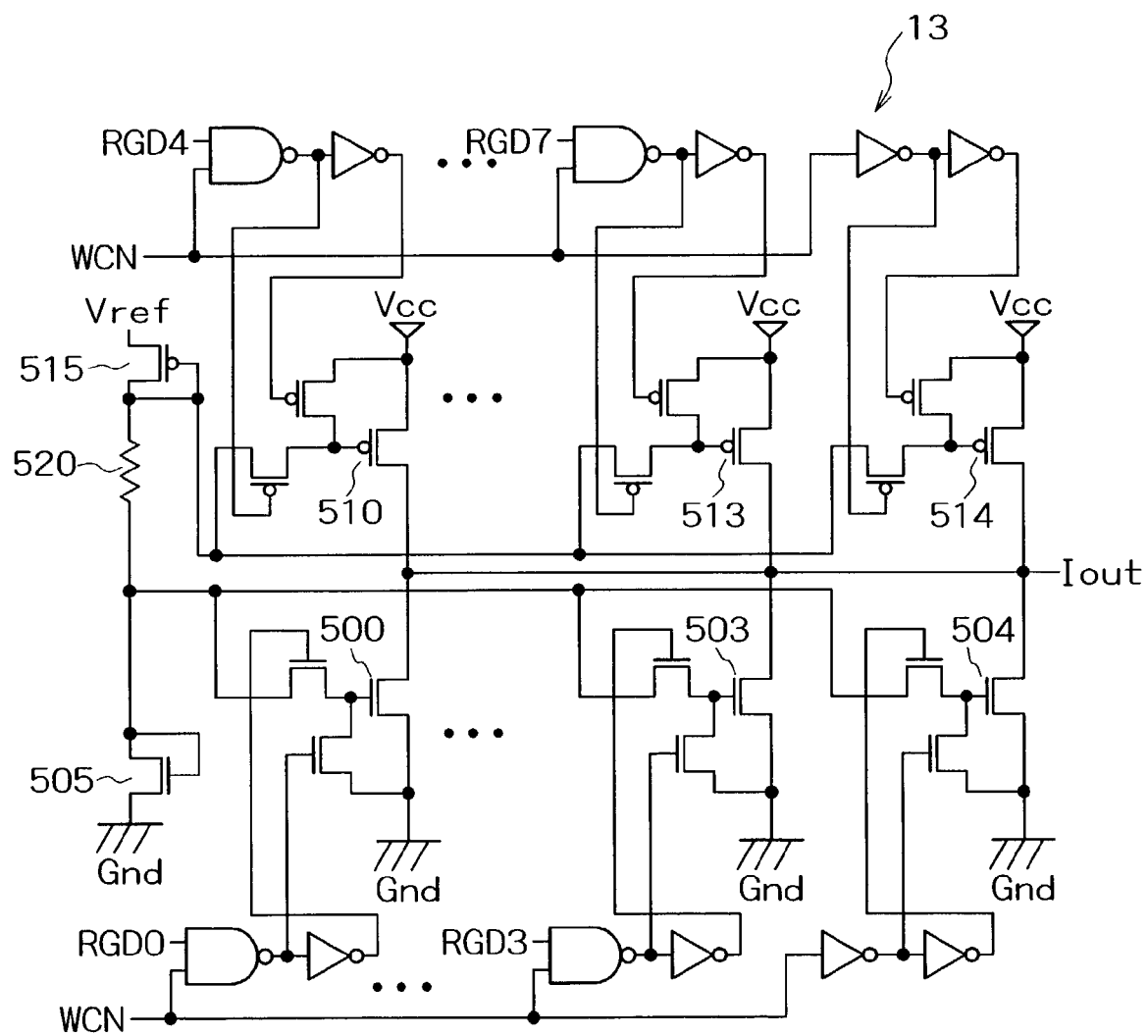
FIG. 13 is a circuit diagram showing the structure of a write current source on the bit line side in the semiconductor memory device in FIG. 9.

The following will describe the operation of the write current source 13 only on the lower half side in FIG. 13 which is constituted by NMOS transistors for writing "0". For the upper half side in FIG. 13 which is constituted by PMOS transistors for writing "1", the operation is the same except that it is reversed, so that its description will be omitted.

In FIG. 13, a reference current which is determined by the potential of a reference voltage Vref and the resistance of a resistor element 520 flows from a transistor 505 to transistors 500, ..., 503 and 504. The current driving performance of the transistor 504 is set in such a way that a basic current value is generated.

The transistors 500 to 503 are designed in such a way as to be able to adjust the current in, for example, 16 steps so that a variation in transistor characteristic, a variation in magnetic property (asteroid characteristic) and the influence of the output current caused by a change in the output impedance of the write current source 13 by the parasitic resistor can be adjusted.

As the basic output transistor 504 needs the maximum driving performance, it has a shortest gate length (L) allowable by the setting rules. The other output transistors 500 to 503 are provided for adjustment and thus need accurate current performance ratios (e.g., the transistor 501 has a double the current performance of the transistor 500, the transistor 502 has four times the current performance of the transistor 500 and the transistor 503 has eight times the current performance of the transistor 500), so that the transistors 500 to 503 have long gate lengths. In this example, the transistor 504 has a gate length L of 0.25 µm while the other transistors 500-503 have a gate length L of 0.5 µm.

Figure 14:
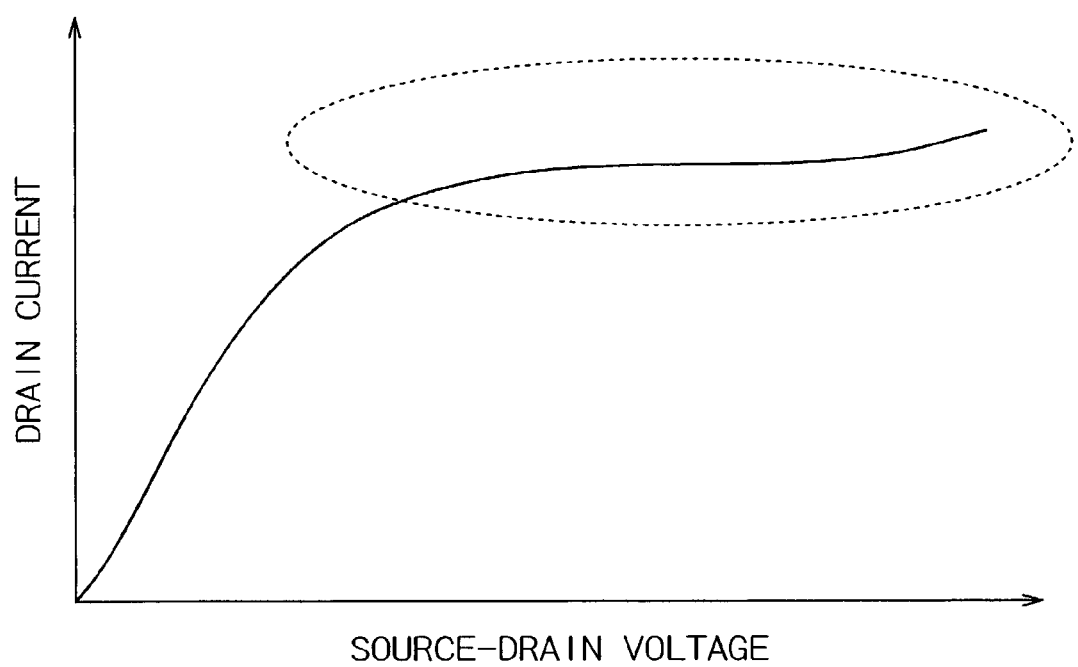
FIG. 14 is graph showing the typical current characteristic of an MOS transistor.

With the above-described structure, the write current source 13 reduces the influence of the saturation characteristic of an MOS transistor as shown in FIG. 14 (the saturation area is narrow and is not flat), reducing a variation in the current performance of that adjusting portion which finally performs adjustment and allowing an accurate current to be output. Therefore, a larger current can be let to flow by a smaller area.

PMOS transistors 515, 510, . . . , 513 and 514 for writing "1" illustrated in the upper half side in FIG. 13 are constituted in a similar way as the transistors 500 to 504.

A signal WCN is enabled in writing "0" or a signal WCP is enabled in writing "1" and adjustment of the current in that case is executed by signals RGD0 to RGD7.

In this case, the to-be-adjusted amounts of a variation in transistor characteristic and a variation in magnetic property do not depend on the address of a memory cell 11 and are constant, while the to-be-adjusted amount of a change in output current caused by the parasitic resistor is not constant. Therefore, it is necessary to input the address of a memory cell 11 to the circuit that determines the signals RGD0 to RGD7.

The circuit that determines the signals RGD0 to RGD7 (hereinafter called "first circuit") is constructed as shown in, for example, FIG. 15.

Figure 15:
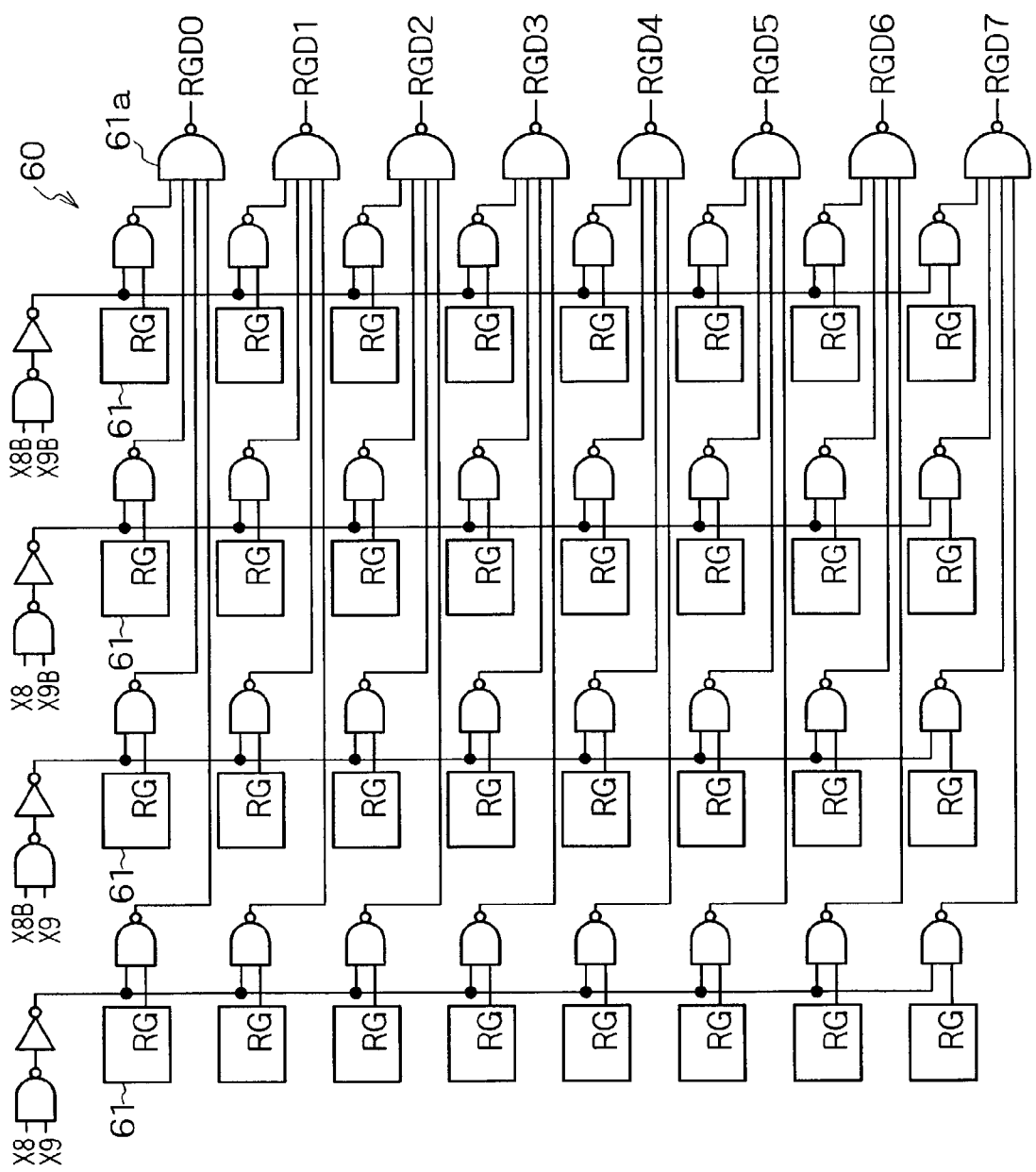
FIG. 15 is a circuit diagram showing the structure of a first circuit in the semiconductor memory device in FIG. 9.

In FIG. 15, a first circuit 60 has four registers 61 and an AND circuit 61a, which adds the outputs of the four registers 61 and sends out the added output, in accordance with each of the signals RGD0 to RGD7.

A combination of upper addresses X8 and X9 of a signal for selecting a cell array and X8B and X9B which are respectively inverted signals of X8 and X9 is input to each register 61. A registers 61 is selected by the combination of those upper addresses.

With respect to "0" or "1", the selected register outputs an associated one of the signals RGD0 to RGD7 in such a way that the current suitable for the associated address is output from the write current source 13. The value of the register circuit is temporarily set in the function test conducted at the time of fabricating a memory LSI prior to shipment and is set after conducting a test to check if writing is possible with a margin.

Figure 16:
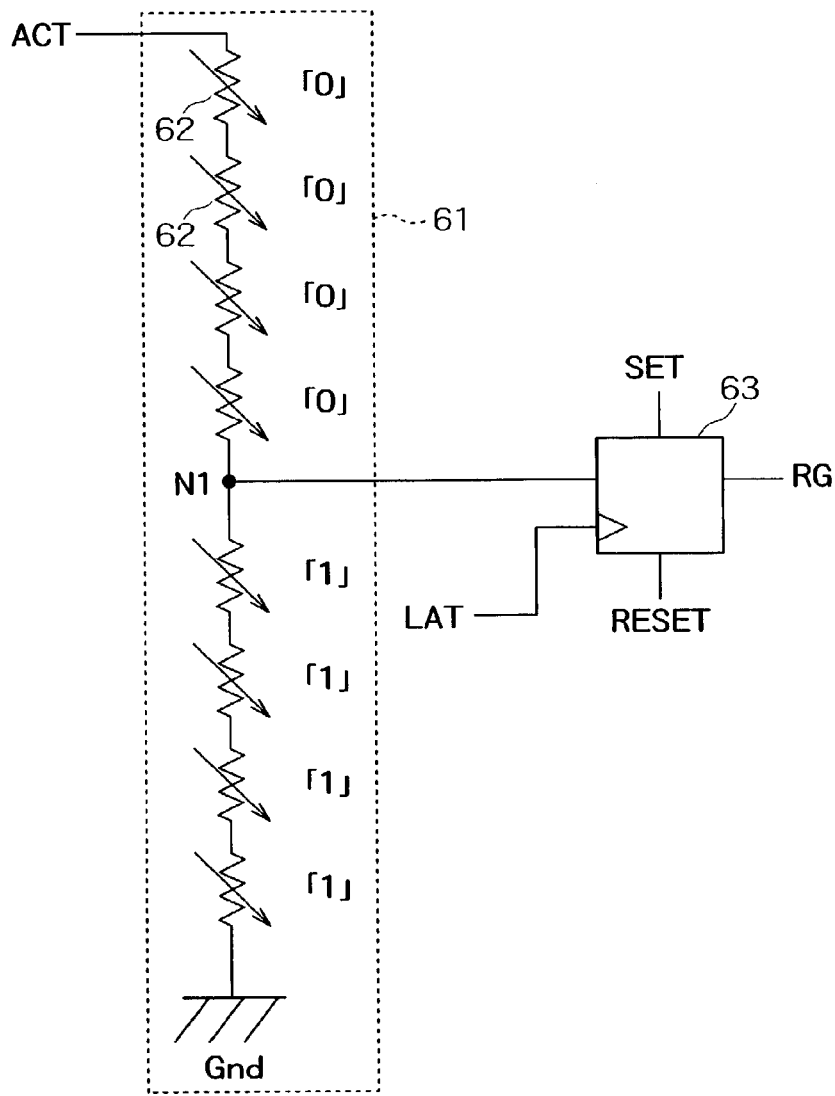
FIG. 16 is a circuit diagram showing the structure of a register circuit to be used in the first circuit in FIG. 15.
Figure 17:
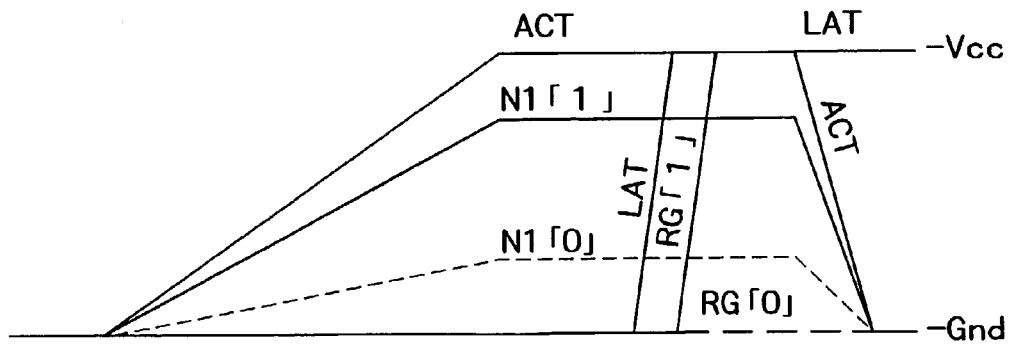
FIG. 17 is graph showing operational waveforms at the time the register circuit in FIG. 16 is powered up.

Those registers are constructed as shown in, for example, FIG. 16.

In FIG. 16, the register 61 comprises plural (eight in the illustrated case) TMR elements 62 as memory elements and is constructed in such a way that a value at an intermediate node N1 of the TMR elements 62 is latched in a D flip-flop circuit 63 by signals LAT and ACT which are generated inside the chip when powered up.

Figure 18:
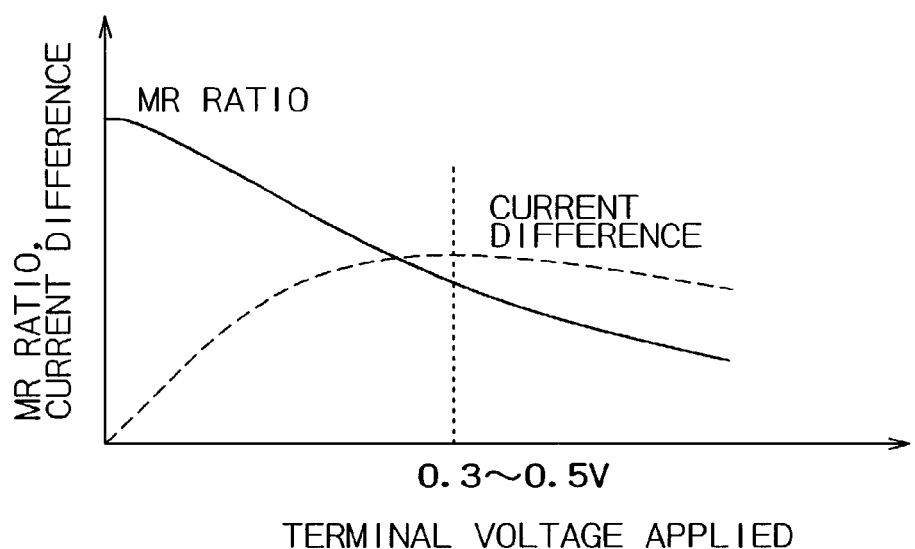
FIG. 18 is a graph showing the typical characteristics of the MR ratio and current difference of a TMR element.

The characteristic of the TMR element 62 changes depending on a voltage applied across the TMR element 62 as shown in FIG. 18. That is, as a current is detected in ordinary memory cells, a terminal voltage is set to about 0.3 to 0.5 V in such a way that the current difference becomes maximum (about 20%), As the terminal voltage becomes lower, however, the ratio of the output voltage (the resistance ratio or so-called MR ratio) becomes higher; for example, the output voltage ratio becomes about 40% in the vicinity of the terminal voltage of 0 V. Therefore, a signal whose level is close to a CMOS level is acquired by laying out the TMR elements 62 in series and writing opposite values on the power supply side and the GND side. For the sake of simplicity, a writing circuit for the TMR elements 62 is omitted from the illustrated circuit.

Although this register 61 needs two or more TMR element 62, it does not need a sense amplifier and the circuit can thus be simplified.

Figure 19:
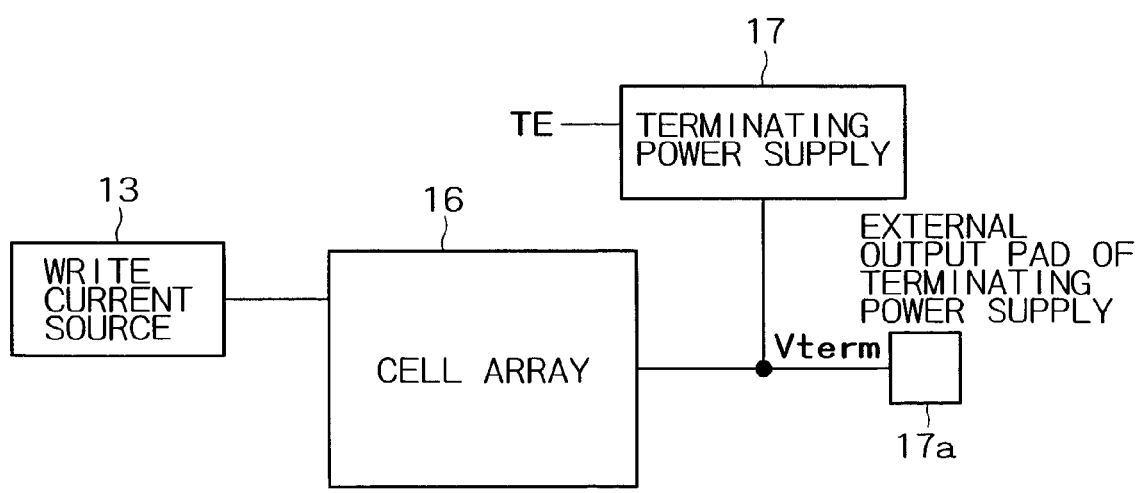
FIG. 19 is a schematic diagram showing a terminating power supply in the semiconductor memory device in FIG. 9.

In the semiconductor memory device 10, a terminating power supply 17 to be connected to a memory cell array 16 comprising memory cells 11 is provided with an external output pad 17a for testing as shown in FIG. 19.

Accordingly, while a signal TE, which is enabled in current measuring mode, is enabled, the power supply circuit of the terminating power supply 17 becomes inactive so that the current value of the write current source 13 is measured directly by the testing external output pad 17a.

In this manner, it is possible to accurately set the register value by not only performing a writing test but also directly measuring the current value.

Figure 20:
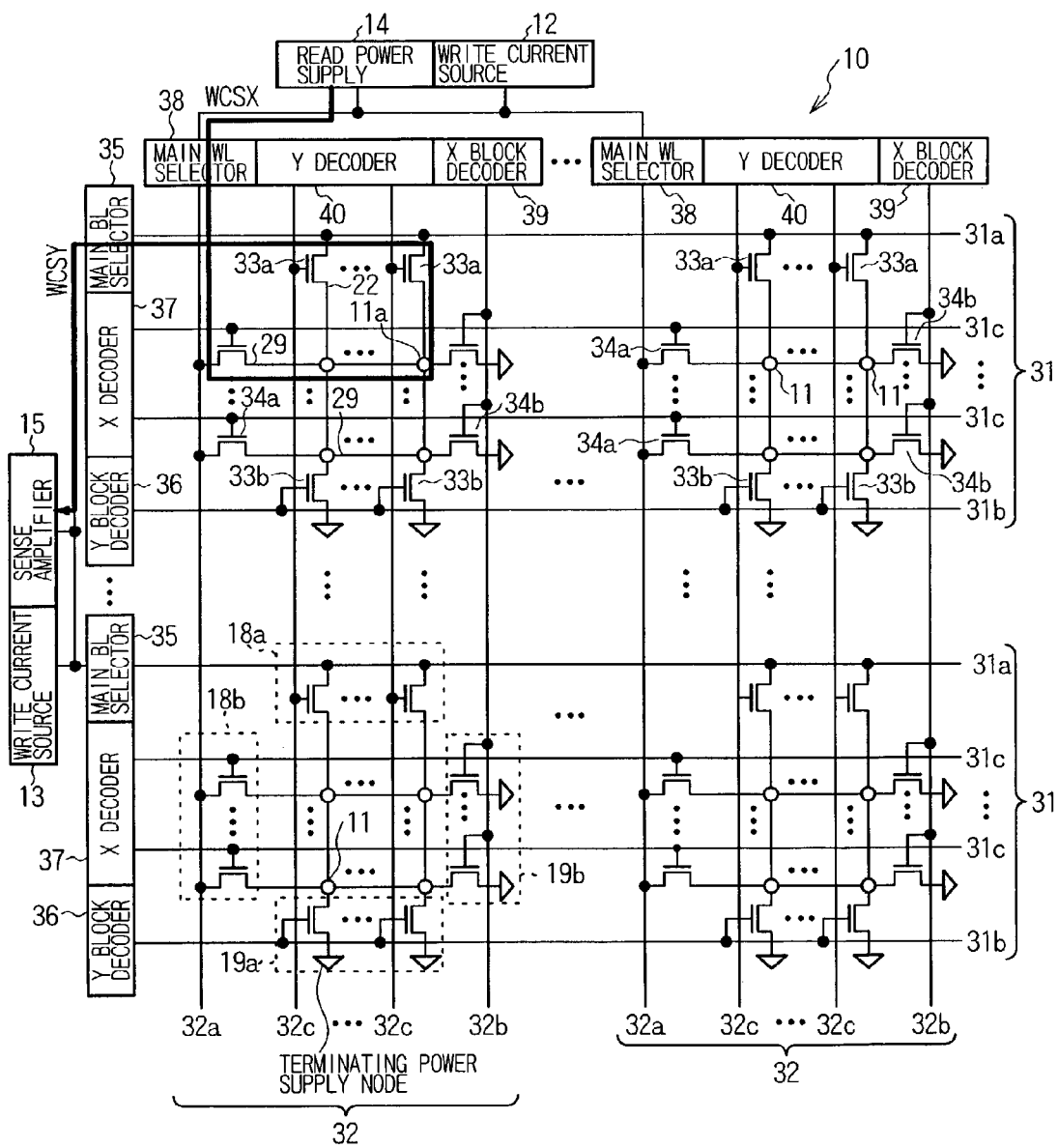
FIG. 20 is a block diagram showing the state of the semiconductor memory device in FIG. 9 in read mode.

FIG. 20 shows the state of the semiconductor memory device 10 in FIG. 9 in read mode and shows, in a thick line, those selectors, transistors and so forth which are turned on at the time of reading the memory cell 11a.

In this example, the current from the read power supply 14 flows to the memory cell 11a via the main word line selector 38, the main word line 32a and the word line 29, at which time the current also flows to the other memory cells 11.

Figure 21:
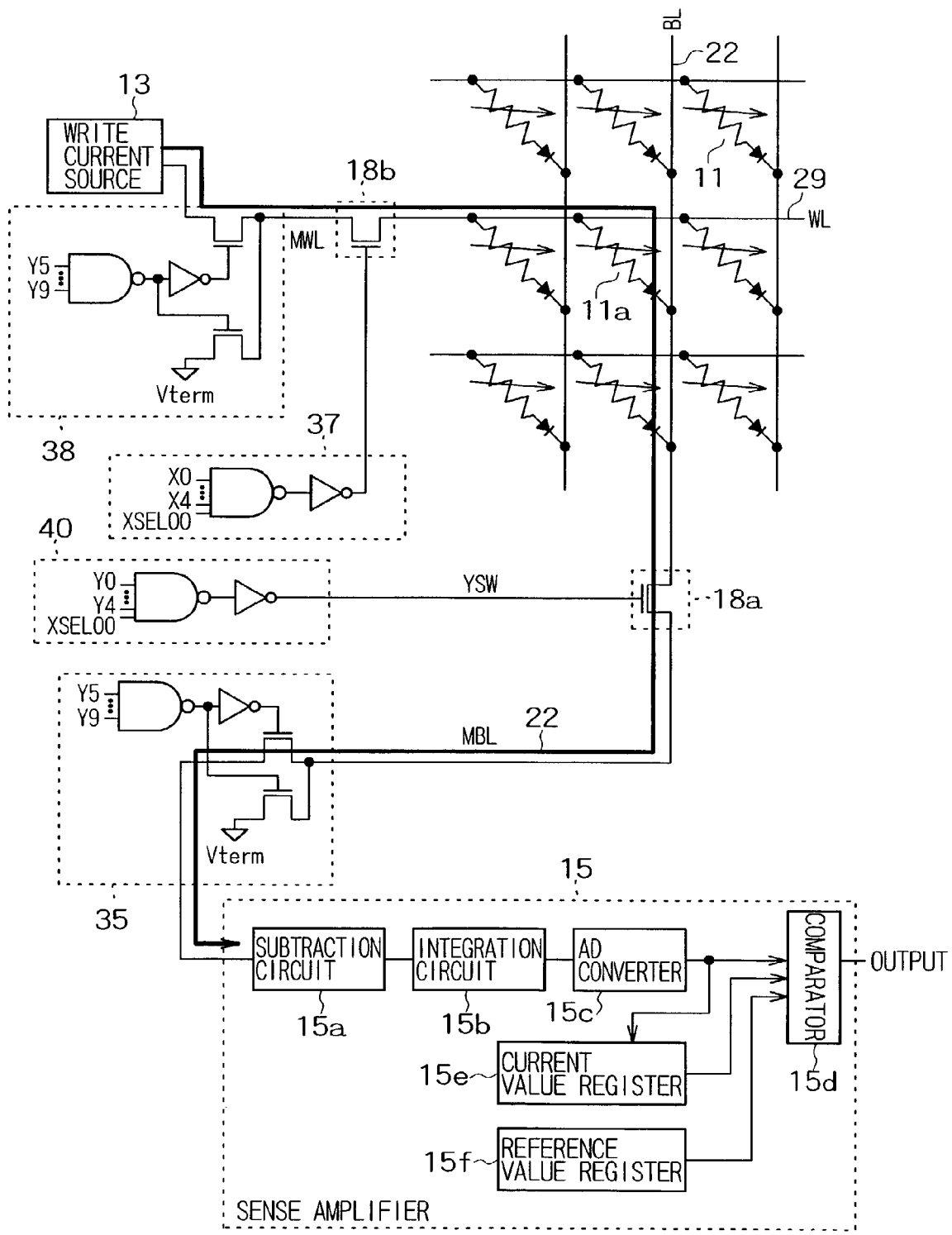
FIG. 21 is a circuit diagram of a read circuit system in the semiconductor memory device in FIG. 20.

At this time, the rough value of the current value of the unneeded current component that flows in unselected memory cells 11 as shown in an equivalent circuit in FIG. 21 (the memory cells 11 being shown as variable resistors) is known beforehand, so that the current value is detected by subtracting the rough value in a subtraction circuit 15a in the sense amplifier 15, then integrating a minute current value in an integration circuit 15b and converting the integral value to a digital current value by an AD converter 15c.

At that time, the digital current value should be saved in a current value register 15e temporarily so that the digital current value is not influenced by a variation in the characteristics of the individual memory cells 11. After "0" is written in the memory cell 11a, the current value is read out again in a similar way and the re-read digital current value is compared with the digital current value stored in the current value register 15e by a comparator 15d. The comparator 15d determines that data in the memory cell 11a is "1" when the difference between those digital current values exceeds an allowable error range, and determines that data in the memory cell 11a is "0" when the difference between those digital current values lies within the allowable error range. The error range is saved in a reference value register 15f at that time.

This way, judgment on "0" or "1" is accurately executed by a so-called self-reference system, without being influenced by a variation in the characteristics of the individual memory cells.

In this case, as the main bit lines 31 are laid perpendicular to the bit lines 22, the main bit line selector 35 need not be provided in the memory cell array 16. This can permit transistors 35a (see FIG. 12) which constitute the main bit line selector 35 to be designed larger without practically influencing the chip size, thus ensuring the stable flow of the write current.

(Second Embodiment)

Figure 22:
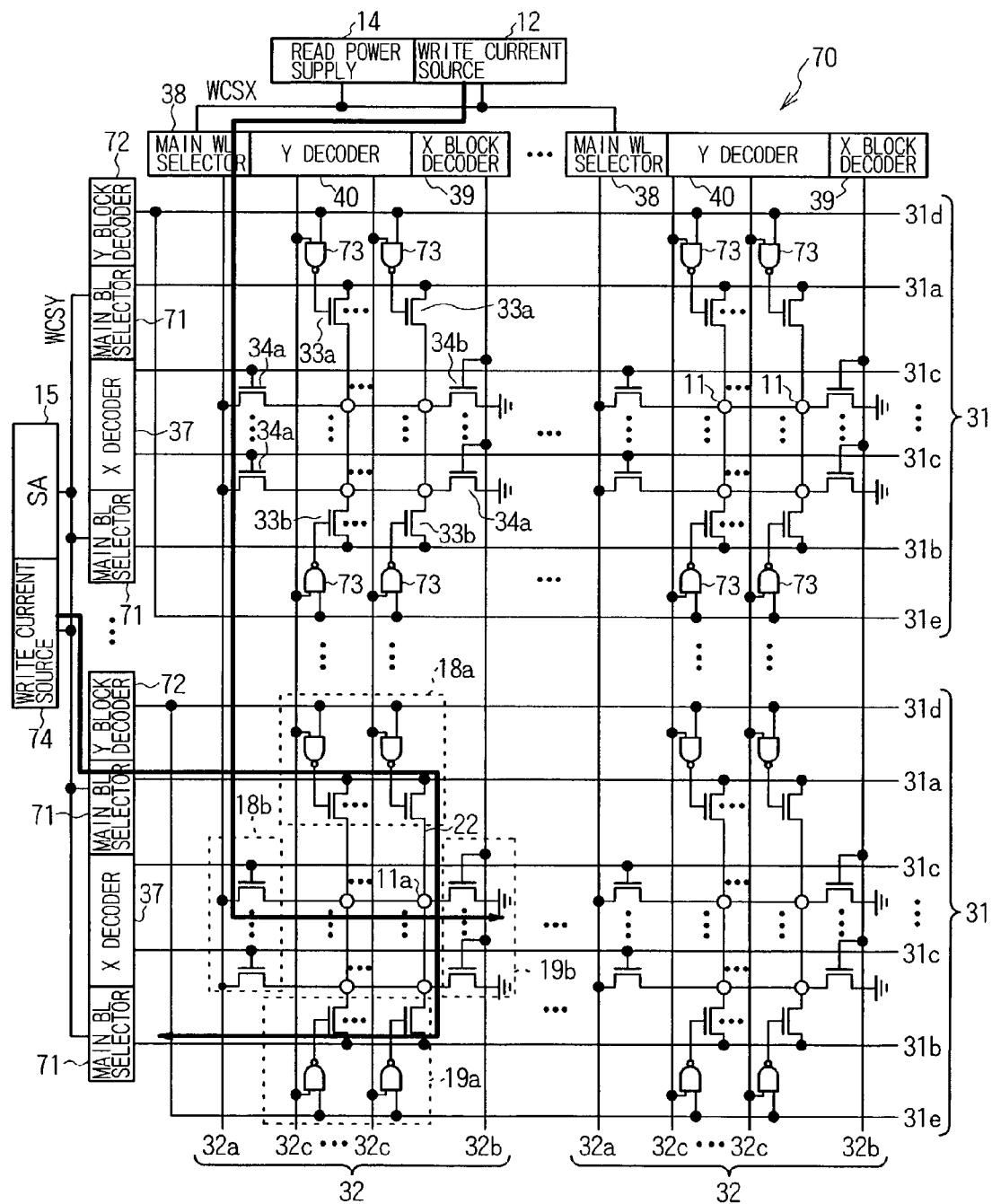
FIG. 22 is a block diagram showing the state of a semiconductor memory device according to a second embodiment of the invention in write mode.

FIG. 22 is a block diagram showing the state of a semiconductor memory device 70 according to the second embodiment of the invention.

Because the semiconductor memory device 70 in FIG. 22 has almost the same structure as the semiconductor memory device 10 shown in FIG. 9, same reference symbols are given to those components which are the same as the corresponding components of the semiconductor memory device 10 and their otherwise redundant description will be omitted.

In FIG. 22, the semiconductor memory device 70 differs from the semiconductor memory device 10 shown in FIG. 9 in the structures of the main bit line selector, Y selector circuit and write current source.

FIG. 22 shows the state of the semiconductor memory device 70 in write mode and shows, in thick lines, those selectors, transistors and so forth which are turned on at the time of writing the memory cell 11a.

Main bit line selectors 71 are respectively connected to the main bit lines 31a and 31b, and a Y block decoder 72 is connected to main bit lines 31d and 31e which are further provided outside the main bit lines 31a and 31b respectively.

Those main bit lines 31d and 31e are respectively connected to one input terminals of NAND gates 73 whose outputs are connected to the gates of the transistors 33a and 33b. The other input terminals of NAND gates 73 are connected to the respective main word lines 32c.

In this case, the lower end of each bit line 22 is not connected to the terminating power supply but to the main bit line 31b so that it is held to an internal ground potential Gterm separate from the other ground potential.

Figure 23:
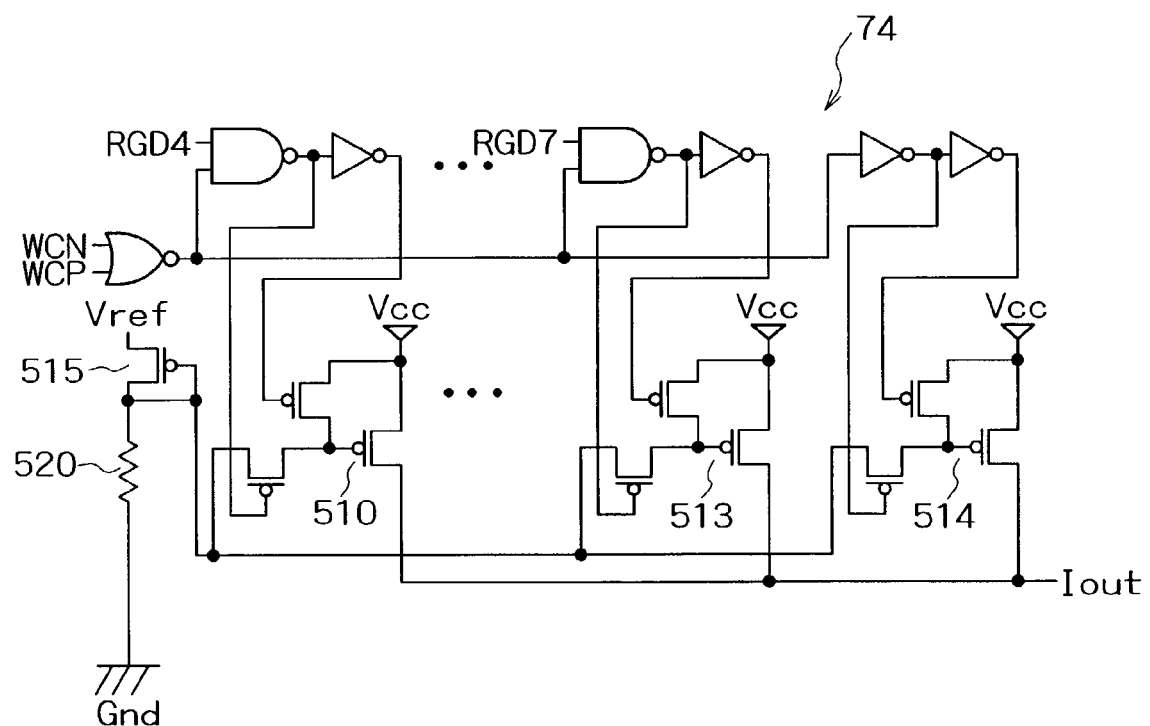
FIG. 23 is a circuit diagram showing the structure of a write current source on the bit line side in the semiconductor memory device in FIG. 22.

As shown in FIG. 23, a write current source 74 is a unidirectional power supply which lets the current to flow in one direction only and whose output portion is comprised of only PMOS transistors. The write current source 74 is designed smaller in size and area than the write current source 13.

Write data of "0" or "1" is written by selecting the complementary main bit line 31a or 31b by means of the main bit line selectors 71, not by the output current from the write current source 74.

In this case, as the above-described first circuit 60 does not also require the intermediate node N1, the number of TMR elements 62 that constitute the first circuit 60 can be reduced to about a half.

Figure 24:
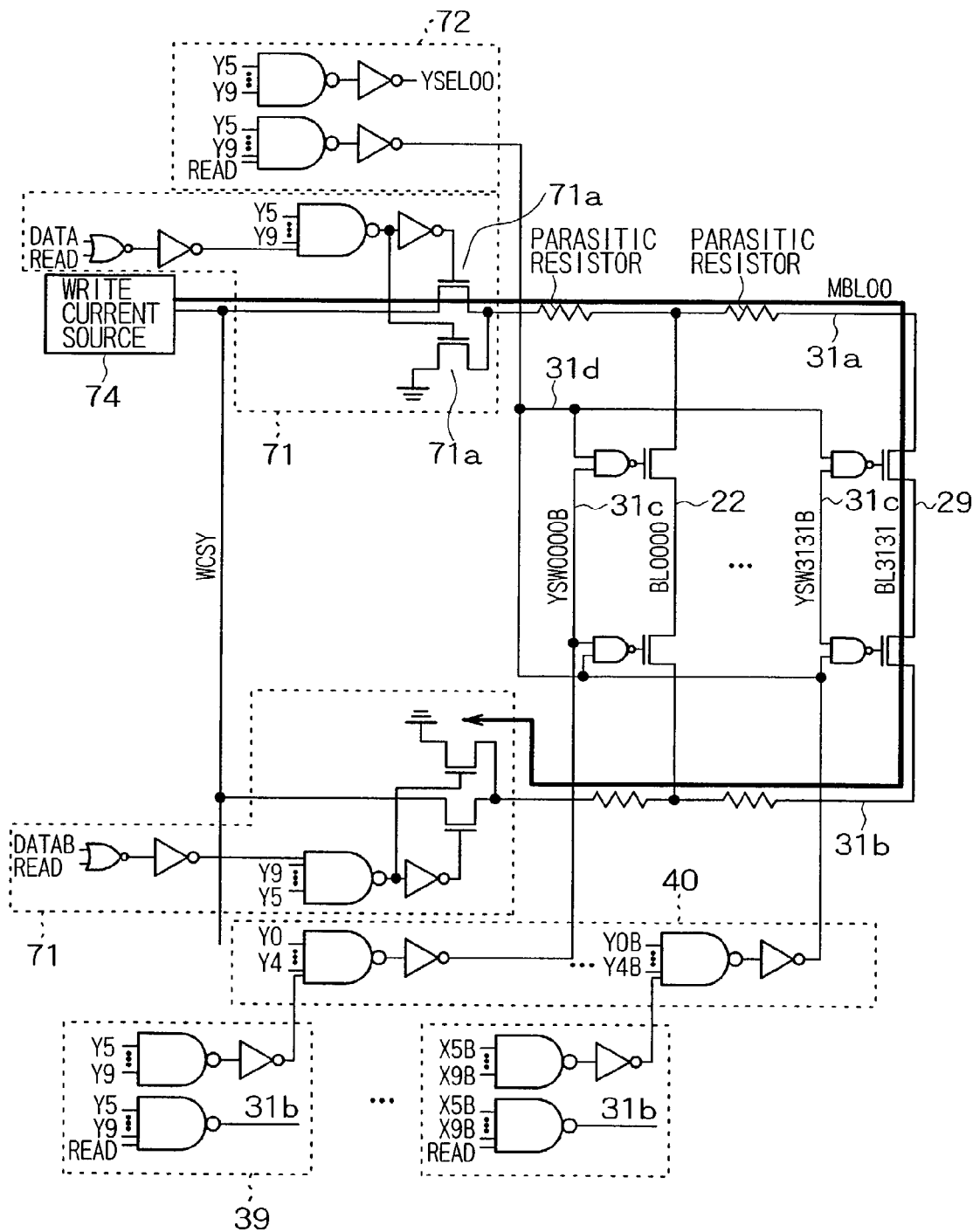
FIG. 24 is a circuit diagram of a write circuit system in the semiconductor memory device in FIG. 22.

FIG. 24 is a circuit diagram of a write circuit system in the semiconductor memory device 70.

In FIG. 24, one of the complementary main bit lines 31a and 31b is selected by a write data signal DATA and its inverted signal DATAB, and the other one is fixed to the termination potential.

This structure can make the source-gate potential of an NMOS transistor 71a of the main bit line selector 71 approximately the same as the power supply voltage, so that the transistor 71a of the selector 71 can be made smaller. This compensates for an area increased by the NAND gates 73 in the memory cell array 16.

In this case, as the flow distance of the current flowing in the main bit line 31 becomes approximately double, the influence of the parasitic resistors of the interconnections by the main bit lines 31d and 31e becomes greater as compared with the case of the semiconductor memory device 10 in FIG. 9. This requires stricter adjustment of the current based on the address of a memory cell 11 in the semiconductor memory device 10 in FIG. 9.

Figure 25:
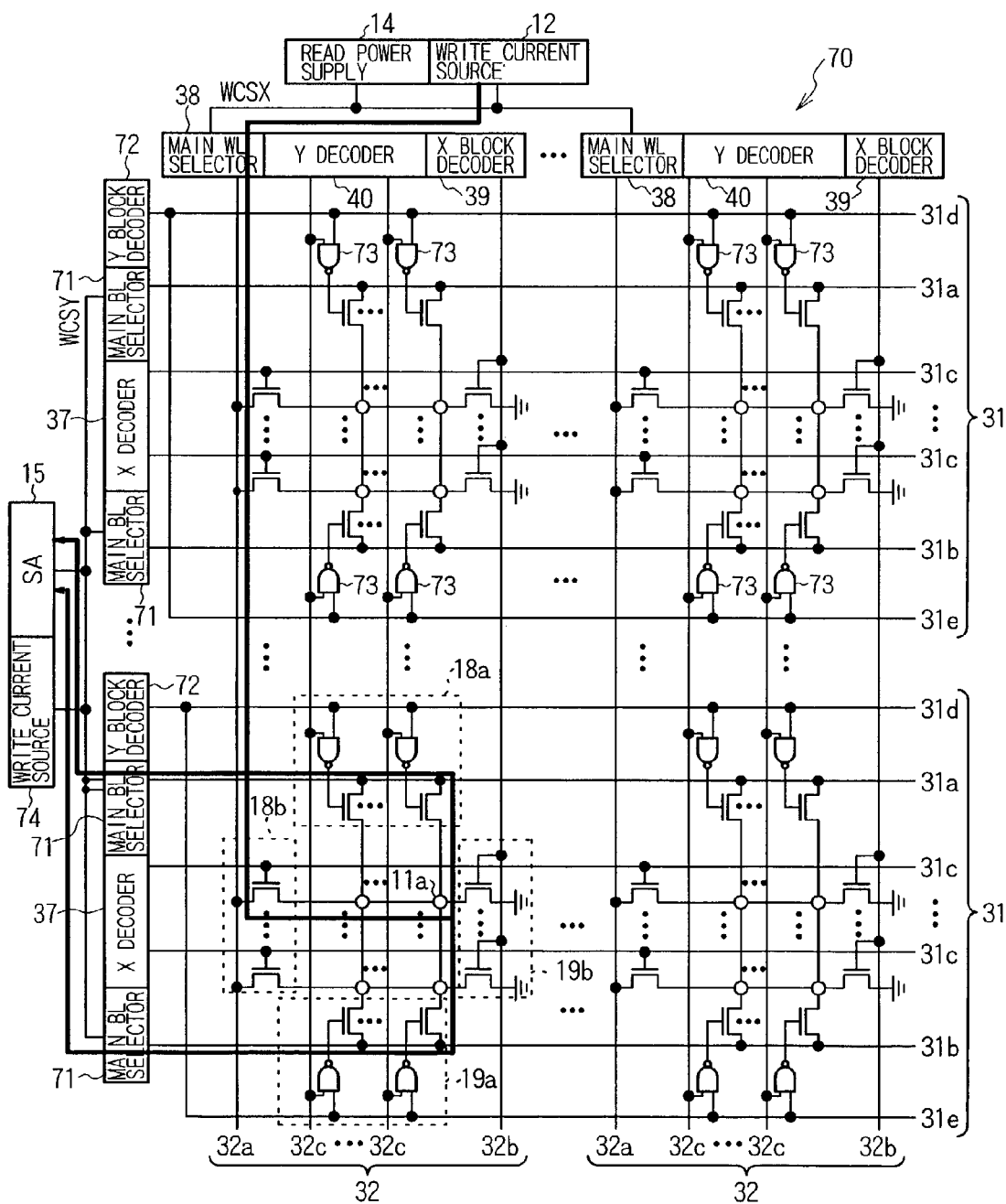
FIG. 25 is a block diagram showing the state of the semiconductor memory device in FIG. 22 in read mode.

FIG. 25 is a block diagram showing the state of the semiconductor memory device 70 in read mode.

FIG. 25 shows those transistors which are enabled in read mode in thick lines.

In this case, regardless of data, both of the bit lines 31a and 31b are used by a read signal READ which is enabled in read mode. As both sides of the word line 29 are set on, the current per the transistor 71a of the main bit line selector 71 becomes about a half. A voltage drop in the main bit line selector 71 therefore decreases, thus making is possible to more precisely control the voltage to be applied to the memory cells 11 each comprised of a TMR element. Because the characteristic of the TMR element is changed by the voltage to be applied across the TMR element as shown in FIG. 18, the operational margin of the TMR element can be improved.

Further, in order to accurately measure the write current generated from the write current source 74, a GND external output pad 16c exclusive for write termination for leading out the internal ground potential Gterm of the memory cell array 16 is provided in addition to a normal GND external output pad 16b, as shown in FIG. 26.

The GND external output pad 16c can allow accurate measurement of the write current from the write current source 74 at the time the write current source 74 is adjusted in a wafer state before shipment.

(Third Embodiment)

Figure 27:
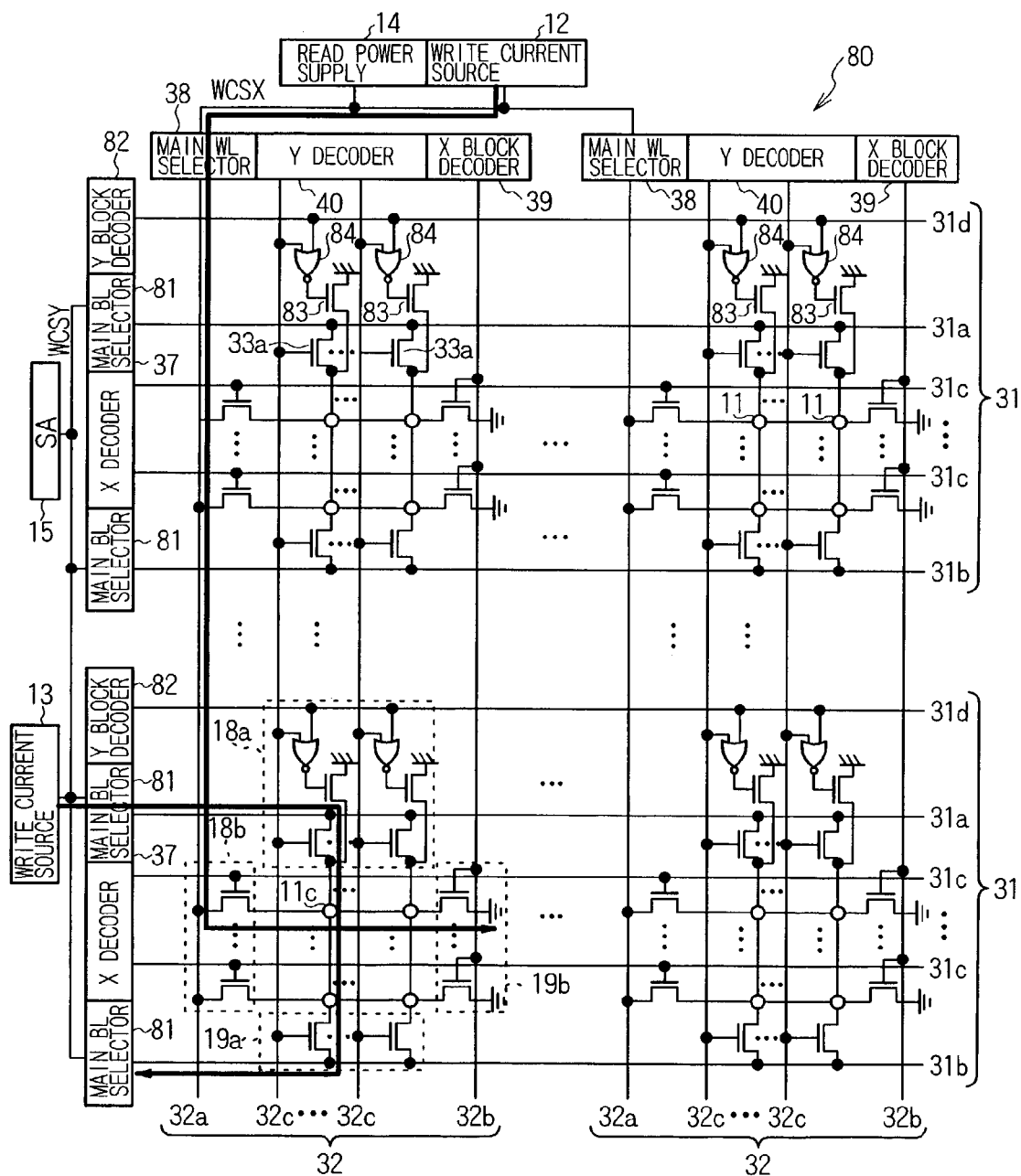
FIG. 27 is a block diagram showing the state of a semiconductor memory device according to a third embodiment of the invention in write mode.

FIG. 27 is a block diagram showing the state of a semiconductor memory device 80 according to the third embodiment of the invention.

Because the semiconductor memory device 80 in FIG. 27 has almost the same structure as the semiconductor memory device 70 shown in FIG. 22, same reference symbols are given to those components which are the same as the corresponding components of the semiconductor memory device 70 and their otherwise redundant description will be omitted.

In FIG. 27, the semiconductor memory device 80 differs from the semiconductor memory device 70 shown in FIG. 22 in the structures of the main bit line selector, Y selector circuit and write current source.

FIG. 27 shows the state of the semiconductor memory device 80 in write mode and shows, in thick lines, those selectors, transistors and so forth which are turned on at the time of writing the memory cell 11a.

Main bit line selectors 81 are respectively connected to the main bit lines 31a and 31b, and a Y block decoder 82 is connected to the main bit line 31d which is further provided outside the main bit line 31a.

The main bit line 31d is connected to one input terminals of NOR gates 84 whose output terminals are connected to the gates of NMOS transistors 83 each of which that are connected between the opposite sides of the associated transistors 33a to the main bit line 31a and the GND. The other input terminals of NOR gates 84 are connected to the respective main word lines 32c.

In this case, the lower end of each bit line 22 is connected to the main bit line 31b.

Accordingly, the bit line 22 corresponding to unselected memory cells 11 is held to the internal ground potential Gterm separated from the other ground potential via the NMOS transistors 83 that are turned on by the associated NOR gates 84.

In this case, as the semiconductor memory device 80 differs from the semiconductor memory device 70 according to the second embodiment in the circuit structures at both ends of each bit line 22, the layout becomes more difficult but the main bit line selector 81 can be constituted by fewer transistors. The semiconductor memory device 80 can therefore be designed smaller in area.

Figure 28:
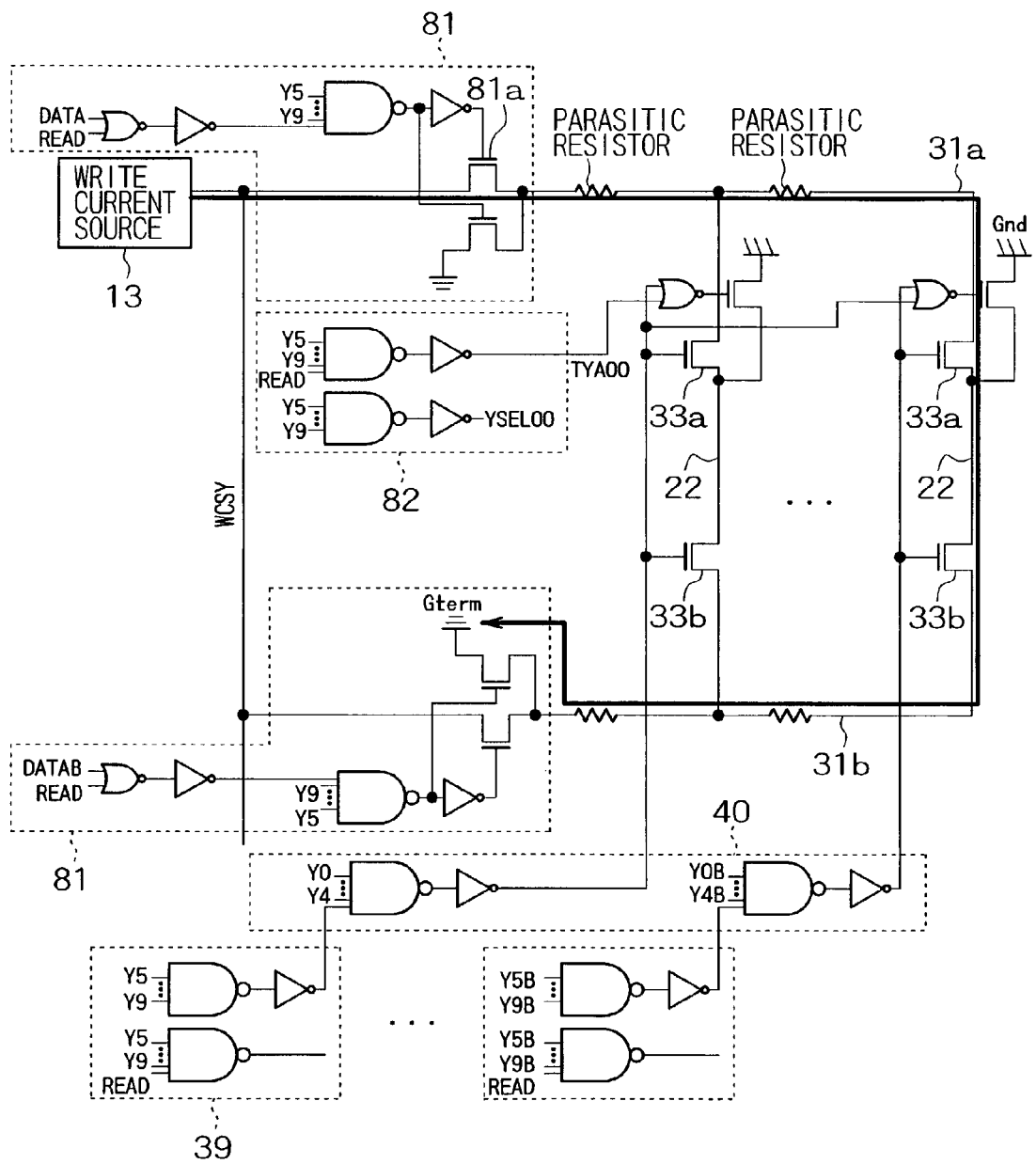
FIG. 28 is a circuit diagram of a write circuit system in the semiconductor memory device in FIG. 27.

FIG. 28 is a circuit diagram of a write circuit system in the semiconductor memory device 80.

In FIG. 28, the main bit line 31a is enabled by the write data signal DATA and its inverted signal DATAB, and the main bit line 31b is fixed to the termination potential.

With this structure, as in the case of the semiconductor memory device 70 according to the second embodiment shown in FIG. 23, the flow distance of the current flowing in the main bit line 31 becomes approximately double, so that the influence of the parasitic resistors of the interconnections by the main bit lines 31d and 31e becomes greater as compared with the case of the semiconductor memory device 10 in FIG. 9. This requires stricter adjustment of the current based on the address of a memory cell 11 in the semiconductor memory device 10 in FIG. 9.

Figure 29:
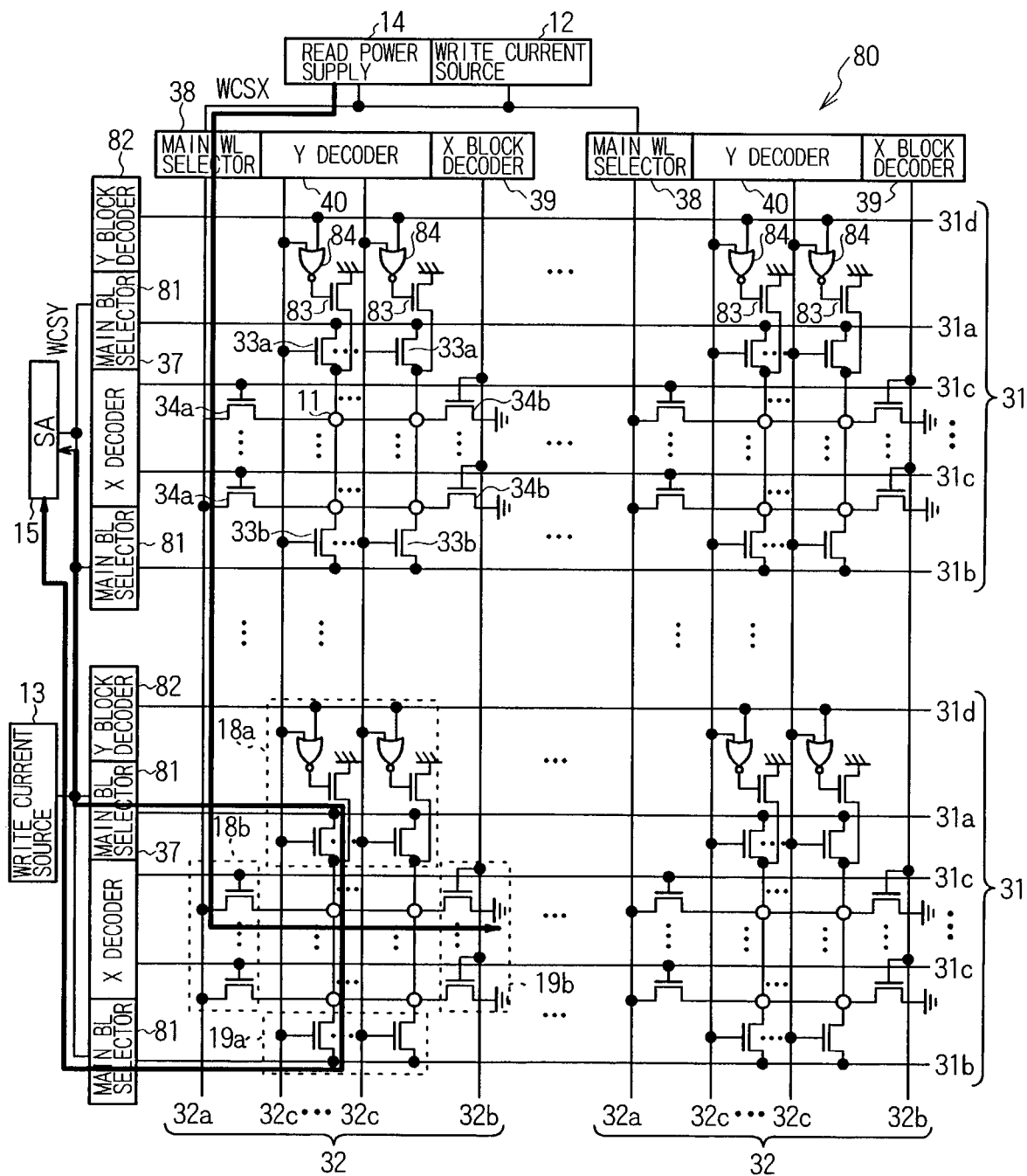
FIG. 29 is a block diagram showing the state of the semiconductor memory device in FIG. 27 in read mode.

FIG. 29 is a block diagram showing the state of the semiconductor memory device 80 in read mode.

FIG. 29 shows those transistors which are enabled in read mode in thick lines.

In this case, regardless of data, both of the bit lines 31a and 31b are used by a read signal READ which is enabled in read mode. As both sides of the word line 29 are set on, the current per a transistor 81a of the main bit line selector 81 becomes about a half. A voltage drop in the main bit line selector 81 therefore decreases, thus making is possible to more precisely control the voltage to be applied to the memory cells 11 each comprised of a TMR element.

(Fourth Embodiment)

Figure 30:
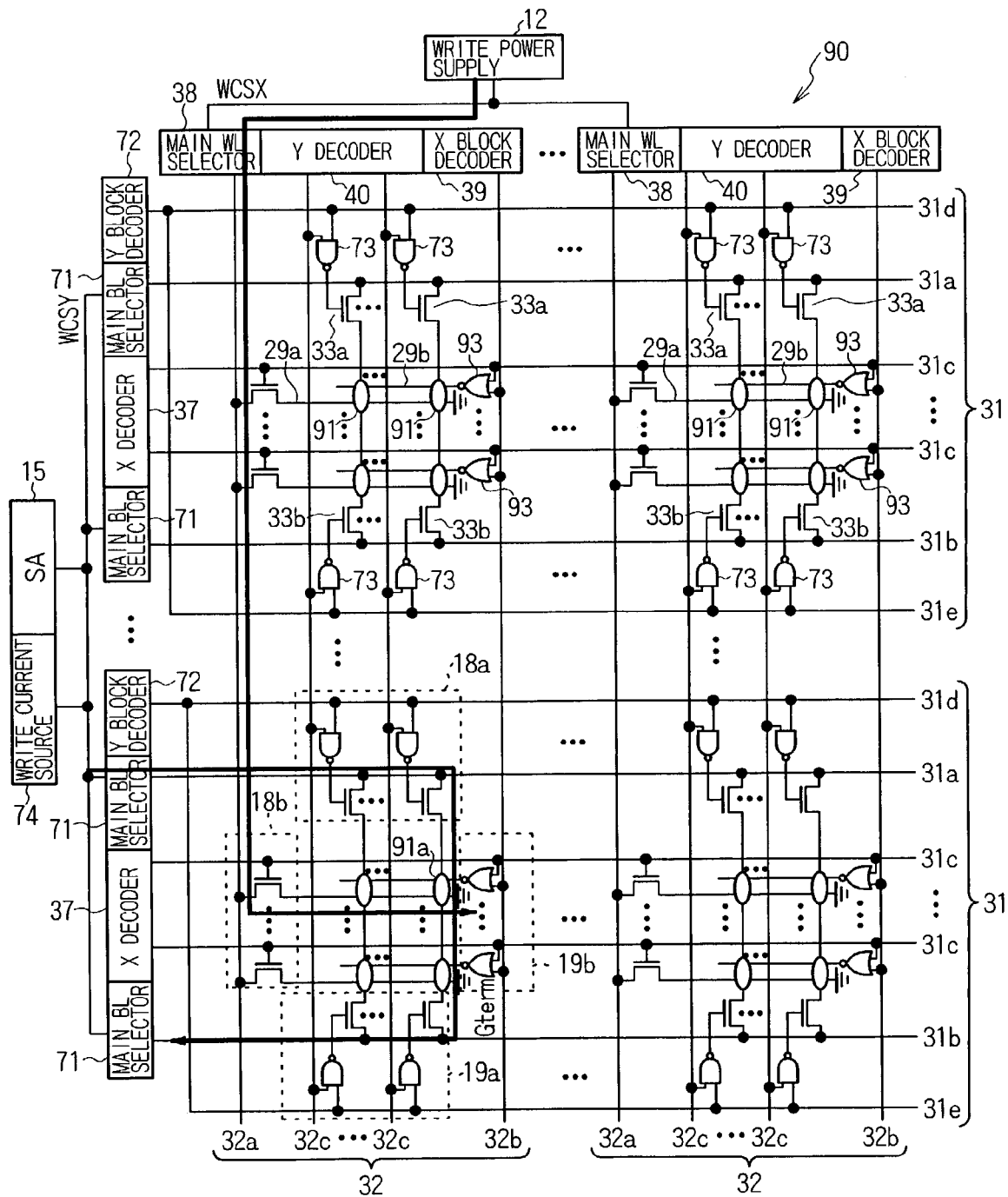
FIG. 30 is a block diagram showing the state of a semiconductor memory device according to a fourth embodiment of the invention in write mode.

FIG. 30 is a block diagram showing the state of a semiconductor memory device 90 according to the fourth embodiment of the invention.

Because the semiconductor memory device 90 in FIG. 30 has almost the same structure as the semiconductor memory device 70 shown in FIG. 22, same reference symbols are given to those components which are the same as the corresponding components of the semiconductor memory device 70 and their otherwise redundant description will be omitted.

In FIG. 30, the semiconductor memory device 90 differs from the semiconductor memory device 70 shown in FIG. 22 in the structures of the memory cells and X termination circuit.

FIG. 30 shows the state of the semiconductor memory device 90 in write mode and shows, in thick lines, those selectors, transistors and so forth which are turned on at the time of writing the memory cell 11a.

Figure 31:
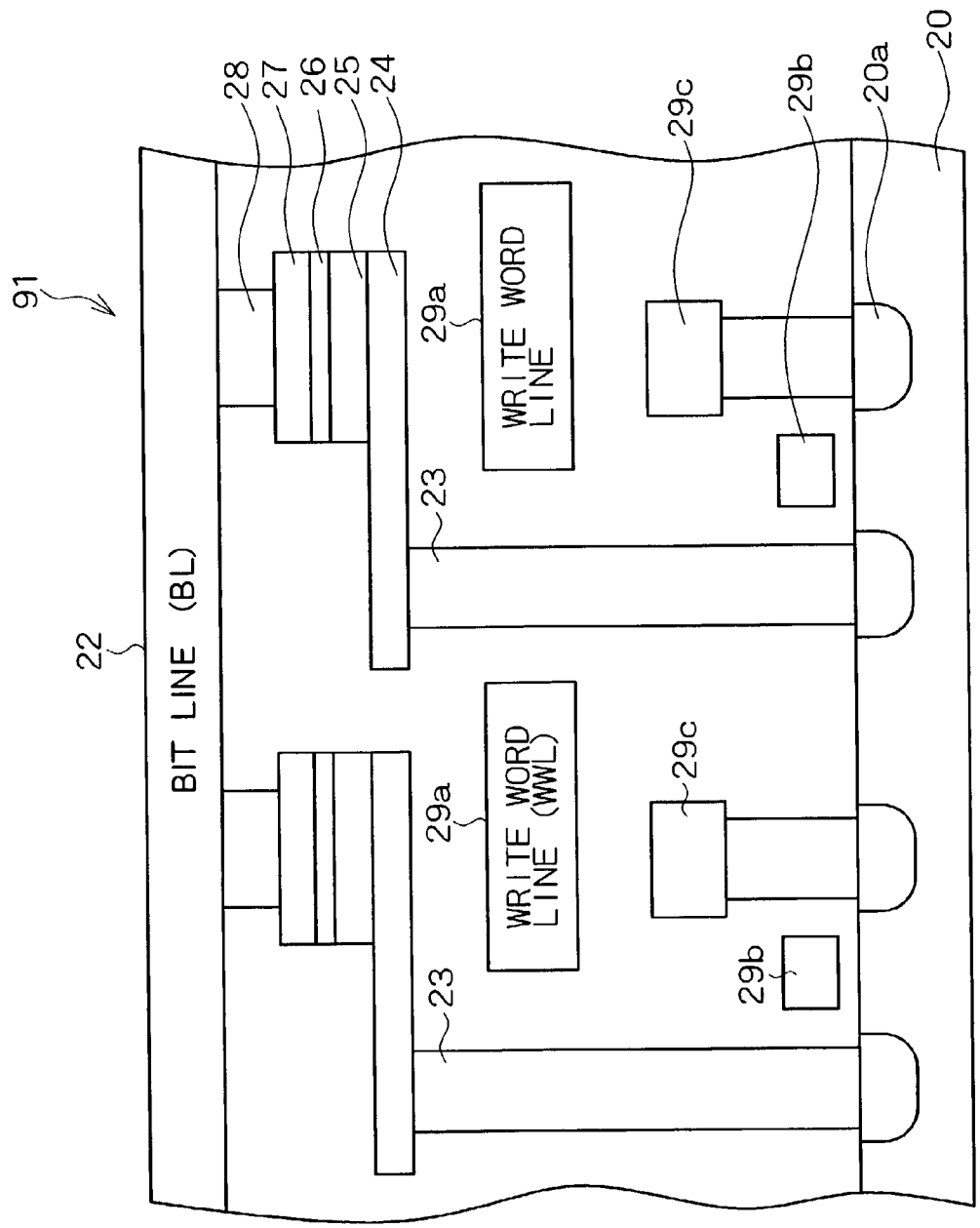
FIG. 31 is an enlarged cross-sectional view showing the structure of a TMR element used as a memory element in the semiconductor memory device in FIG. 30.

In this case, as shown in FIG. 31, each memory cell 91 has a TMR element comprised of the pin-layer fixing antiferromagnetic layer 24, the pin layer 25, the tunneling insulator layer 26, the free layer 27 and a contact 28 laminated in the named order on a contact 28 formed on the silicon substrate 20 via a diffusion layer 20a. The bit line 22 is formed on the contacts 28.

In the memory cell 91, the word line 29 is separated into a write word line 29a and a read word line 29b.

Those write word line 29a and read word line 29b are formed in the interlayer film 21a and a GND line 29c is formed between the word lines 29a and 29b.

Figure 32:
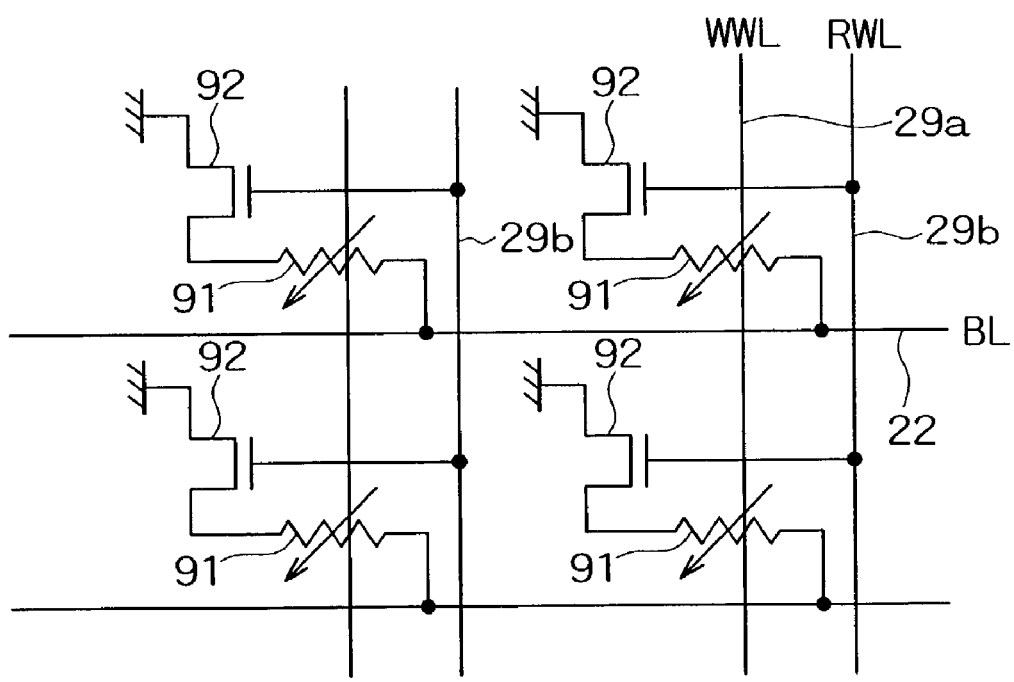
FIG. 32 is an equivalent circuit diagram of four TMR elements in FIG. 31.

As shown in FIG. 32, the memory cell 91 is represented by an equivalent circuit of a variable resistor. The left end of the write word line 29a is connected to the main word line 32a via a transistor 92 whose gate is connected to the main word line 32c. The right end of the write word line 29a is directly connected to the terminating power supply.

The read word line 29b is connected with the output terminal of a NAND gate 93 one of whose input terminals is connected to the main word line 32b while the other input terminal is connected to a main bit line 31c.

With this structure, selection of a bit line 22 is carried out in the same manner as done in the semiconductor memory device 70 according to the second embodiment, and selection of a write word line 29a is done by the transistor 92 connected to the left end of each write word line 29a.

In this case, because data writing to the memory cells 91 can be executed, regardless of the reading method for the memory cells 91, the structure can be adapted to the semiconductor memory device 80 according to the third embodiment shown in FIG. 27 with respect to data writing.

Figure 33:
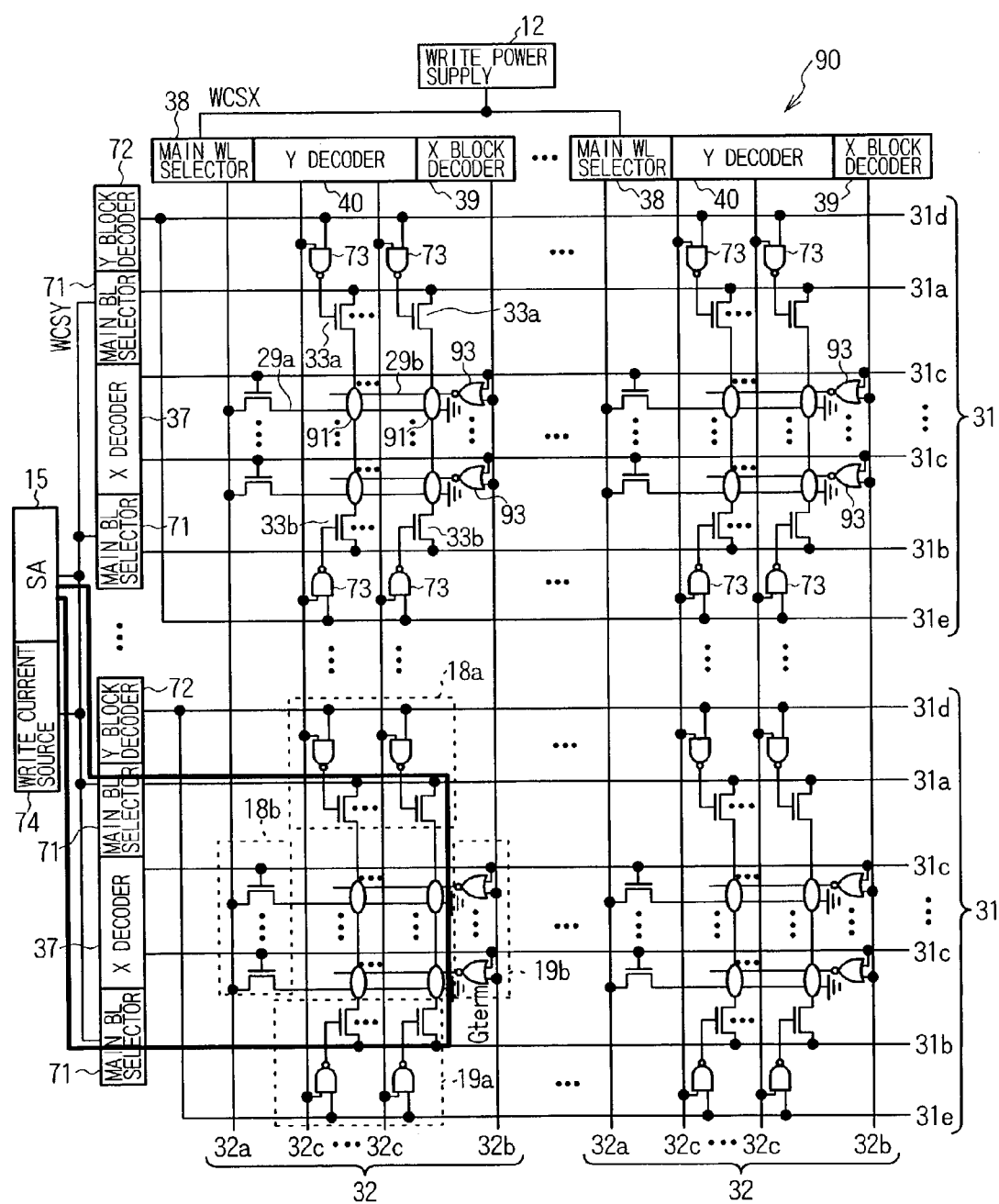
FIG. 33 is a block diagram showing the state of the semiconductor memory device in FIG. 30 in read mode.
Figure 34:
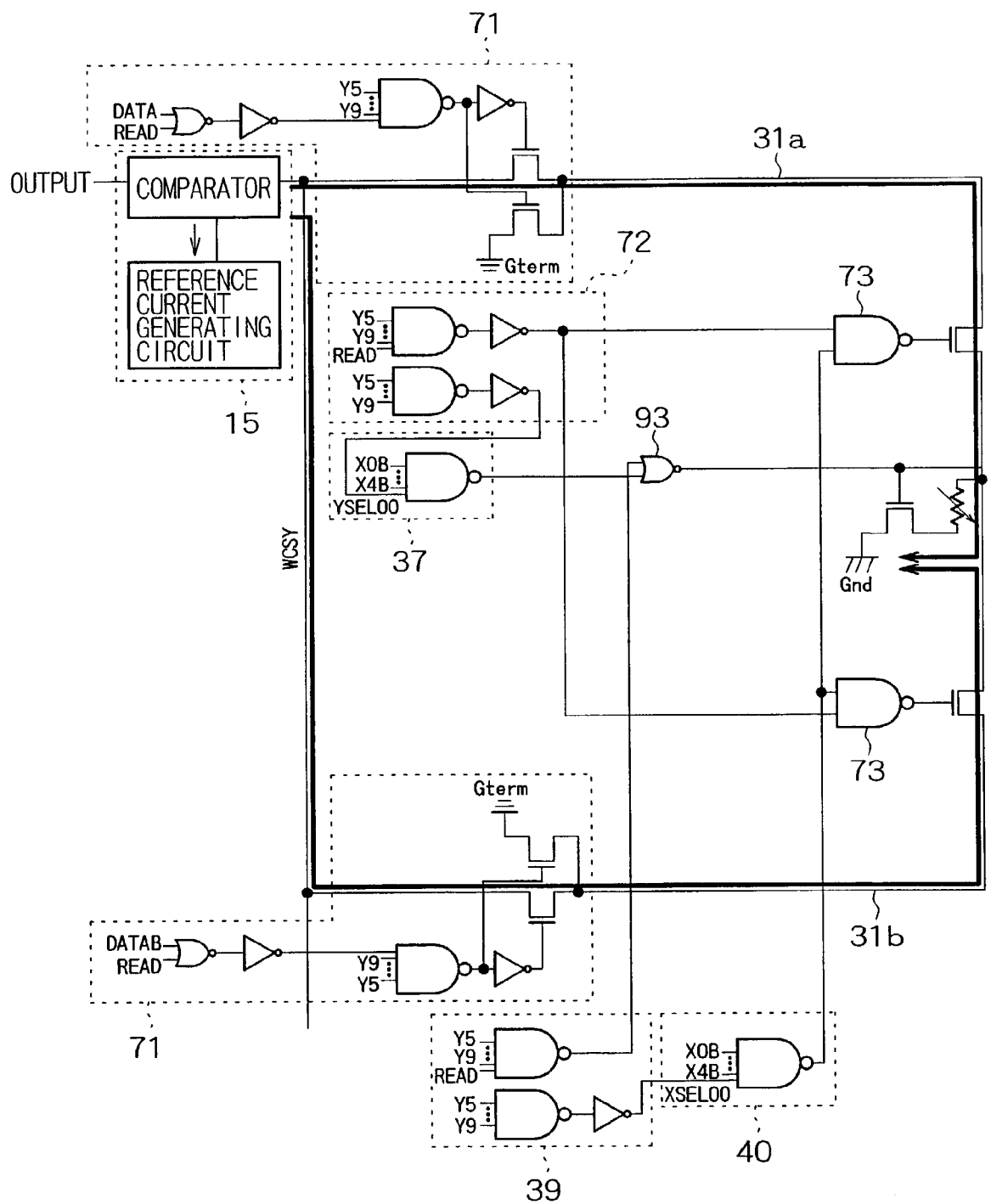
FIG. 34 is a circuit diagram of a read circuit system in the semiconductor memory device in FIG. 30.

FIG. 33 presents a block diagram showing the state of the semiconductor memory device 90 in read mode. FIG. 34 presents a circuit diagram of a read circuit system including the parasitic resistor of the interconnection in the semiconductor memory device 90 and shows, in a thick line, those selectors, transistors and so forth which are turned on at the time of reading a memory cell 91a.

A signal current flows from the sense amplifier 15 to the GND line 29c of the memory cell 91a via the main bit line 31a and the bit line 22. The sense amplifier 15 compares this signal current with the reference current and determines that the signal current is "0" when the signal current is greater than the reference current but determines that the signal current is "0" when it is smaller than the reference current.

(Fifth Embodiment)

Figure 35:
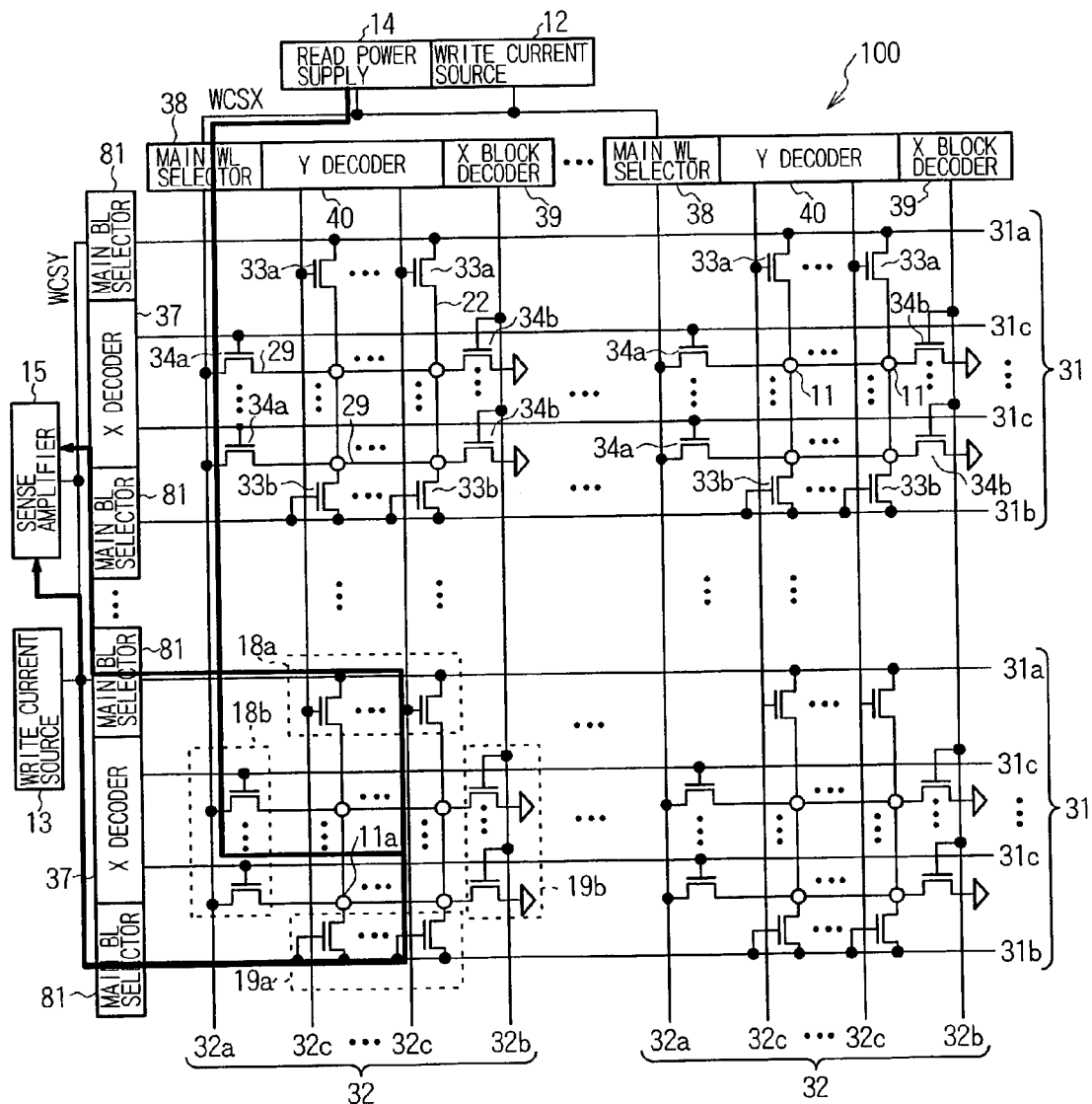
FIG. 35 is a block diagram showing the state of a semiconductor memory device according to a fifth embodiment of the invention in read mode.

FIG. 35 is a block diagram showing the state of a semiconductor memory device 100 according to the fifth embodiment of the invention.

Because the semiconductor memory device 100 in FIG. 35 is a modification of the semiconductor memory device 80 according to the third embodiment shown in FIG. 27 and same reference symbols are given to those components which are the same as the corresponding components of the semiconductor memory device 80 and their otherwise redundant description will be omitted.

In FIG. 35, the semiconductor memory device 100 differs from the semiconductor memory device 80 shown in FIG. 27 in that the NOR gates 84 and NMOS transistors 83 are eliminated.

FIG. 35 shows the state of the semiconductor memory device 100 in read mode and shows, in thick lines, those selectors, transistors and so forth which are turned on at the time of reading the memory cell 11a.

In this case, unselected bit lines 22 are not driven by the transistors 33a. Each bit line 22 is connected via the associated memory cell 11 to the associated word line 29 which is directly connected to the unillustrated terminating power supply.

In case where the memory cell 11 can have a high resistance and a low operation time, the potential at the time of unselection can be supplied via the memory cell 11 as in this structure.

(Sixth Embodiment)

Figure 36:
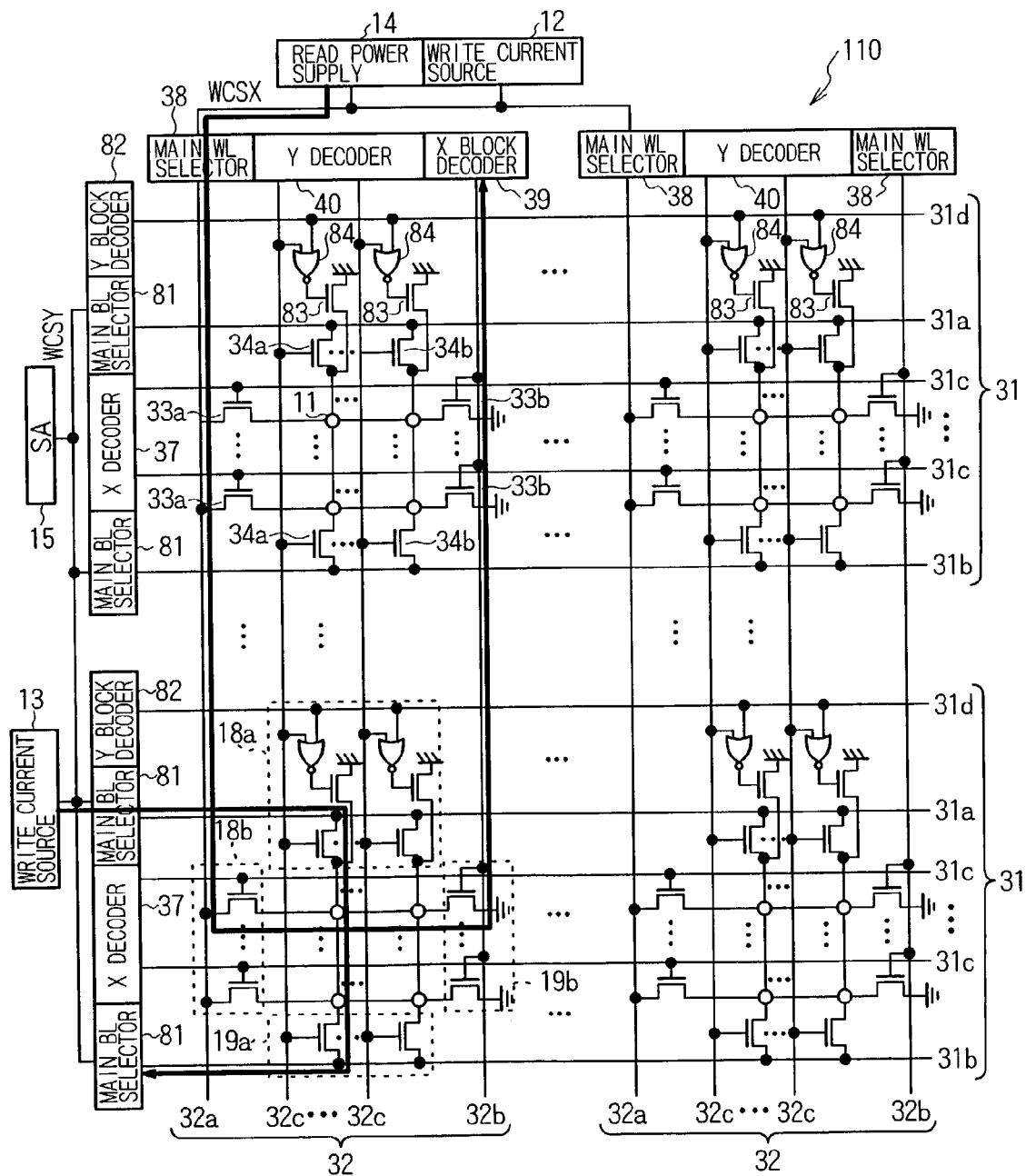
FIG. 36 is a block diagram showing the state of a semiconductor memory device according to a sixth embodiment of the invention in write mode.

FIG. 36 is a block diagram showing the state of a semiconductor memory device 110 according to the sixth embodiment of the invention.

Because the semiconductor memory device 110 in FIG. 36 is anther modification of the semiconductor memory device 80 according to the third embodiment shown in FIG. 27 and same reference symbols are given to those components which are the same as the corresponding components of the semiconductor memory device 80 and their otherwise redundant description will be omitted.

In FIG. 36, the semiconductor memory device 110 differs from the semiconductor memory device 80 shown in FIG. 27 in that an additional main word line selector 38 is provided in place of the X block decoder 39 and the main word lines 32a and 32b are designed to be complementary.

FIG. 36 shows the state of the semiconductor memory device 110 in read mode and shows, in thick lines, those selectors, transistors and so forth which are turned on at the time of writing the memory cell 11a.

The right end of the word line 29 is connected to the main word line 32b, not directly to the unillustrated terminating power supply.

Figure 37:
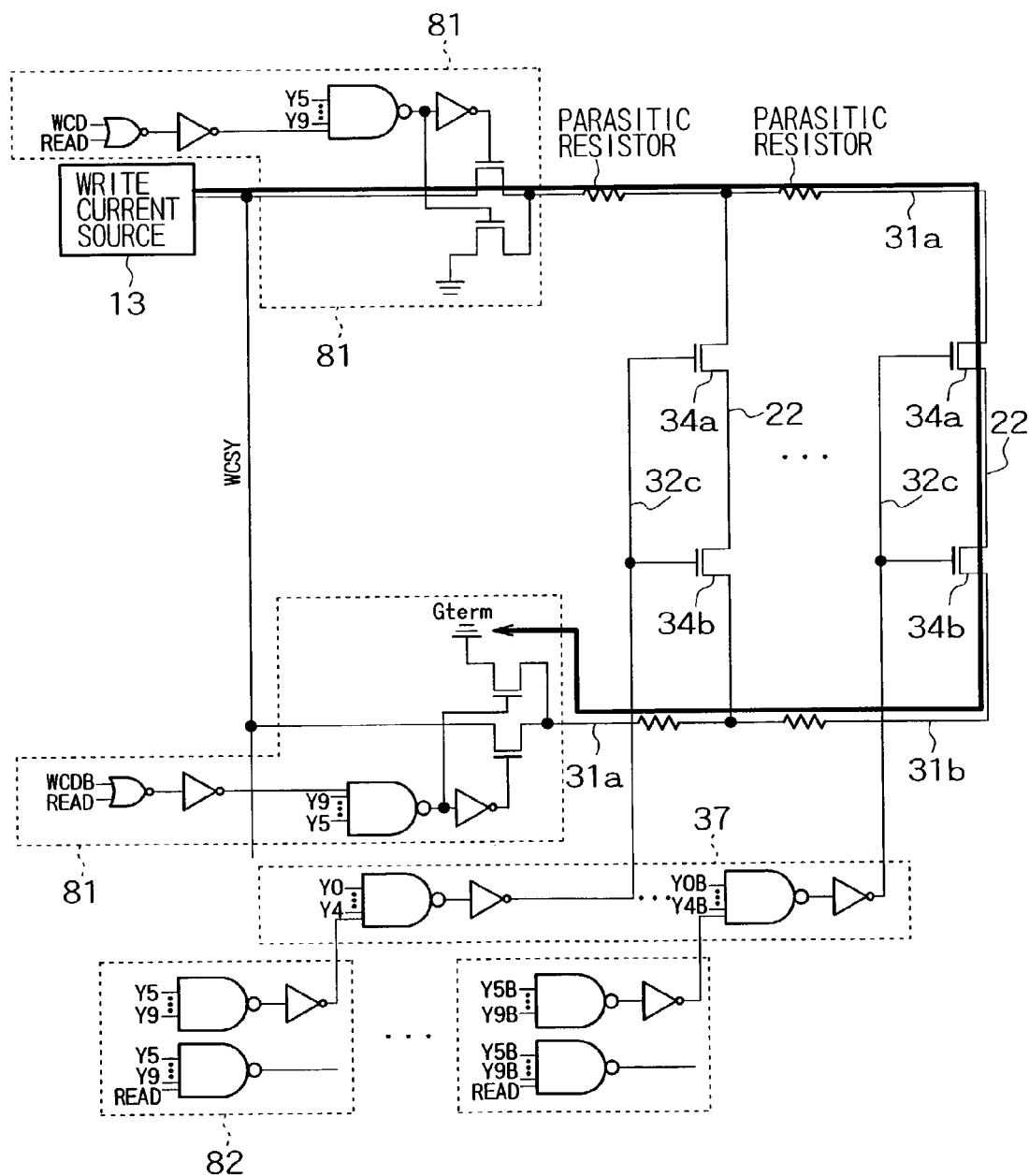
FIG. 37 is a circuit diagram of a write circuit system in the semiconductor memory device in FIG. 36.

FIG. 37 shows a circuit diagram of a write circuit system including the parasitic resistors of the interconnections in the semiconductor memory device 110, and shows, in a thick line, those selectors, transistors and so forth which are turned on at the time of writing the memory cell 11a.

In FIG. 37, one main bit line, 31a, is connected to the write current source 13 while the other main bit line 31b is connected to the unillustrated terminating power supply.

In this case, the direction of the current flowing in the word line 29 can be reversed by switching the main word lines 32a and 32b from one to the other by a signal WCD or its inverted signal WCDB.

Although the curves of magnetic fields with reversed magnetizations should theoretically be symmetrical with respect to the positive and negative signs of the current in the word line 29, they actually often differ slightly. To provide the interconnections with current values with a wider operational margin, therefore, it is desirable to adjust the direction of the current in the word line 29 depending on the addresses of the memory cell array 16 and the memory cells 11.

Figure 38:
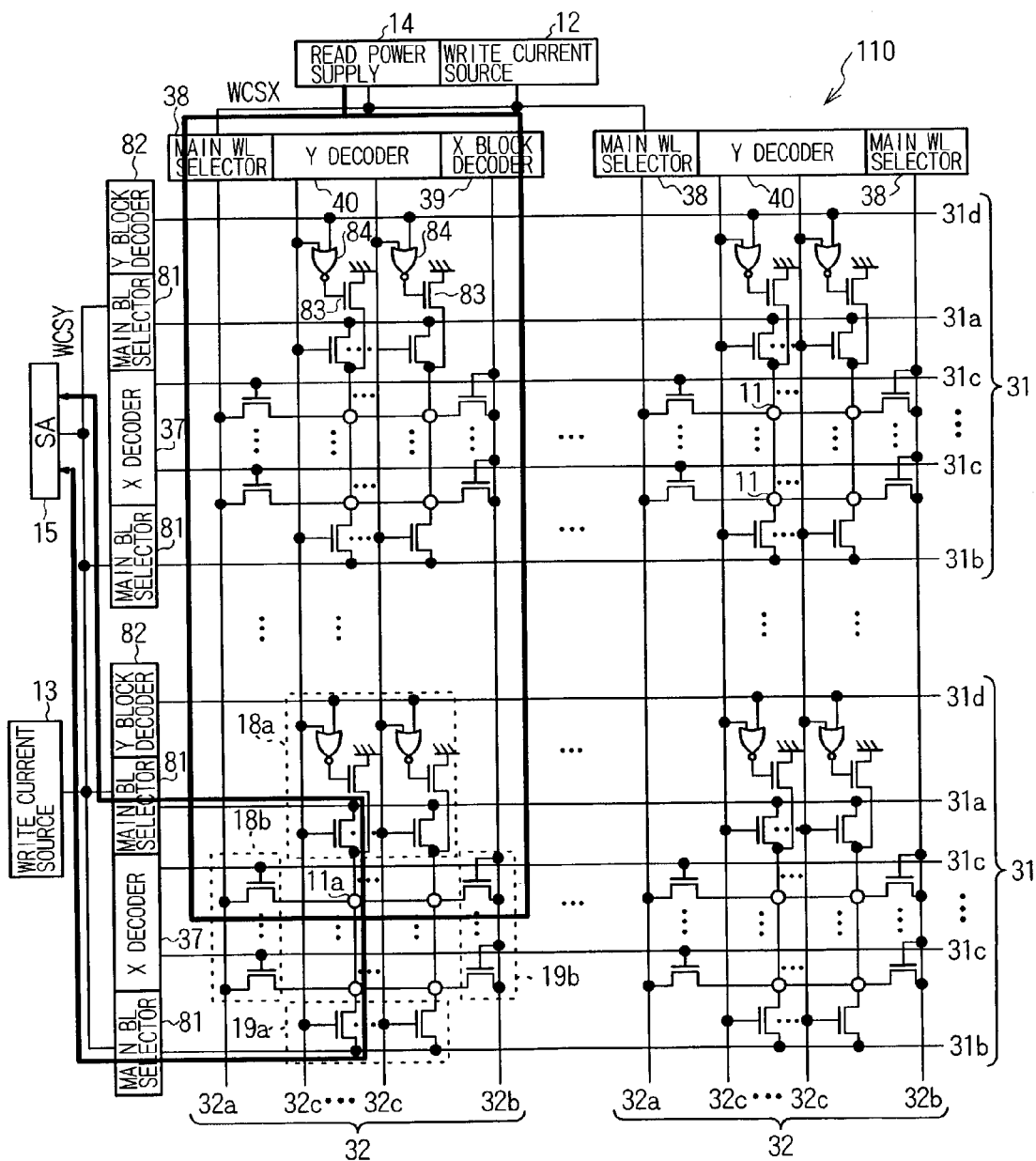
FIG. 38 is a block diagram showing the state of the semiconductor memory device in FIG. 36 in read mode.

FIG. 38 is a block diagram showing the state of the semiconductor memory device 110 in read mode and shows, in thick lines, those selectors, transistors and so forth which are turned on at the time of reading the memory cell 11a.

At the time of reading, both of the complementary main word lines 32a and 32b are used in a way similar to the way the main bit lines 31a and 31b are used.

(Seventh Embodiment)

Figure 39:
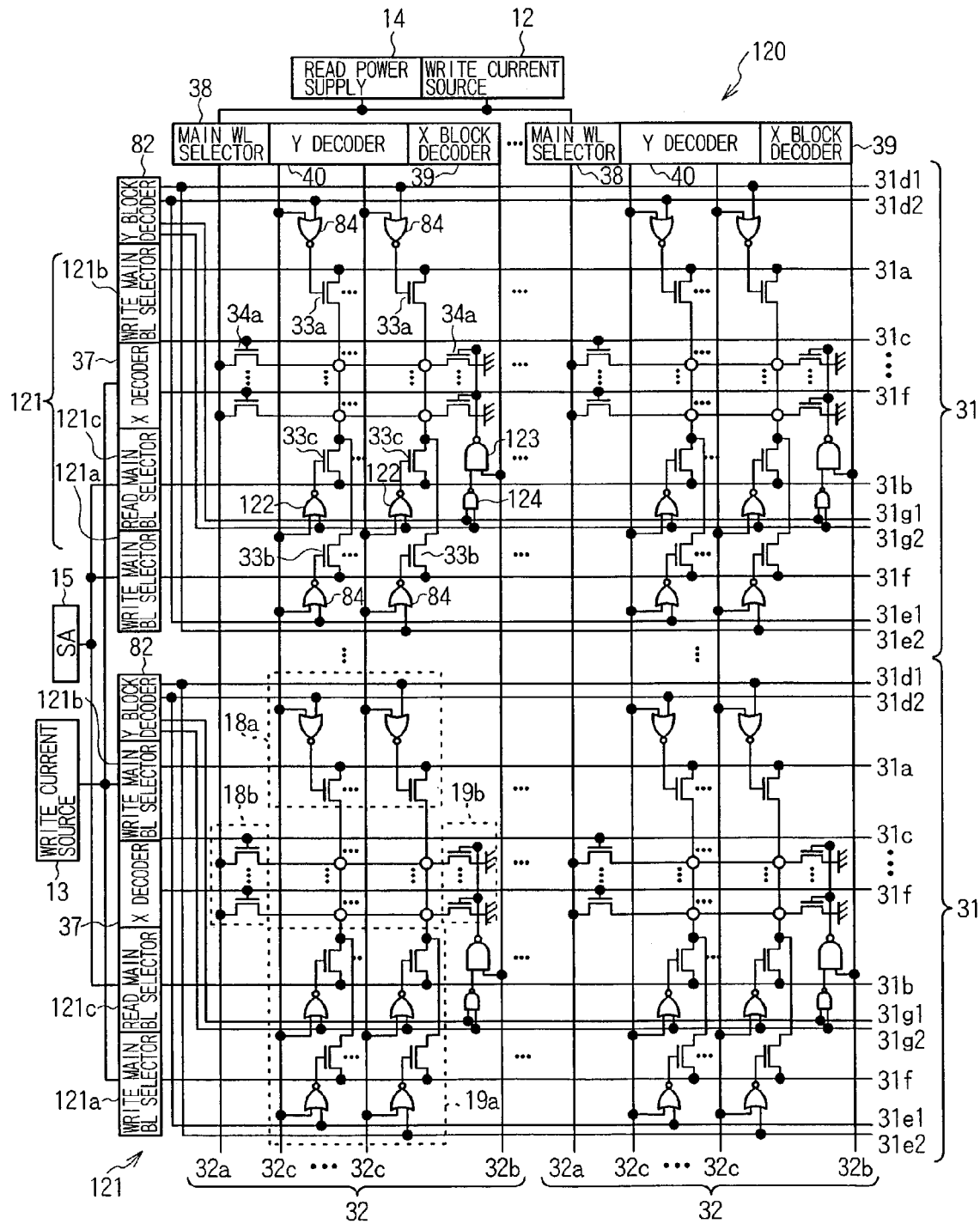
FIG. 39 is a block diagram showing the structure of a semiconductor memory device according to a seventh embodiment of the invention.

FIG. 39 is a block diagram showing the state of a semiconductor memory device 120 according to the seventh embodiment of the invention.

Since the semiconductor memory device 120 in FIG. 39 has almost the same structure as the semiconductor memory device 80 shown in FIG. 27, same reference symbols are given to those components which are the same as the corresponding components of the semiconductor memory device 80 and their otherwise redundant description will be omitted.

In FIG. 39, the semiconductor memory device 120 differs from the semiconductor memory device 80 shown in FIG. 27 in the structures of the main bit line selector, Y block decoder, Y termination circuit and X termination circuit.

A main bit line selector 121 comprises two write main bit line selectors 121a and 121b and a single read main bit line selector 121c.

The write main bit line selector 121b and the read main bit line selector 121c are respectively connected to the main bit lines 31a and 31b.

The write main bit line selector 121a is connected to a main bit line 31f which is provided outside the main bit line 31b. The main bit line 31f is connected to the lower end of the bit line 22 via a transistor 33c provided separate from the transistor 33b.

The transistor 33c exclusive for data reading which has a narrow gate width is provided to reduce, as much as possible, the influence of the parasitic capacitance between the source and drain of the transistor 33b which has a wide gate width to secure a write current of several milliamperes because the parasitic capacitance between the source and drain of the transistor 33b becomes unnegligible in read mode.

The transistor 33c has a gate connected to the output terminal of a NOR gate 122 one of whose input terminals is connected to the word line 29 while the other input terminal is double read-only main bit lines 31g1 and 31g2 connected to the Y block decoder 82.

The gate of the transistor 34b which is connected to the right end of each associated bit line is connected to the output terminal of a common NAND gate 123. One of the input terminals of the NAND gate 123 is connected to the main word line 32b while the other input terminal is double main bit lines 31g1 and 31g2 via a NAND gate 124.

While this design increases the chip area, the reading speed can be improved.

In this case, the outputs of the Y decoder 40 are arranged in such a way that a single output is provided for every two bit lines 22. The Y decoder 40 receives a signal Y0 and applies a logic signal of Y0 to the Y block decoder 36 with a block select signal RTXA in read mode and a block select signal WTXA in write mode as a set.

Figure 40:
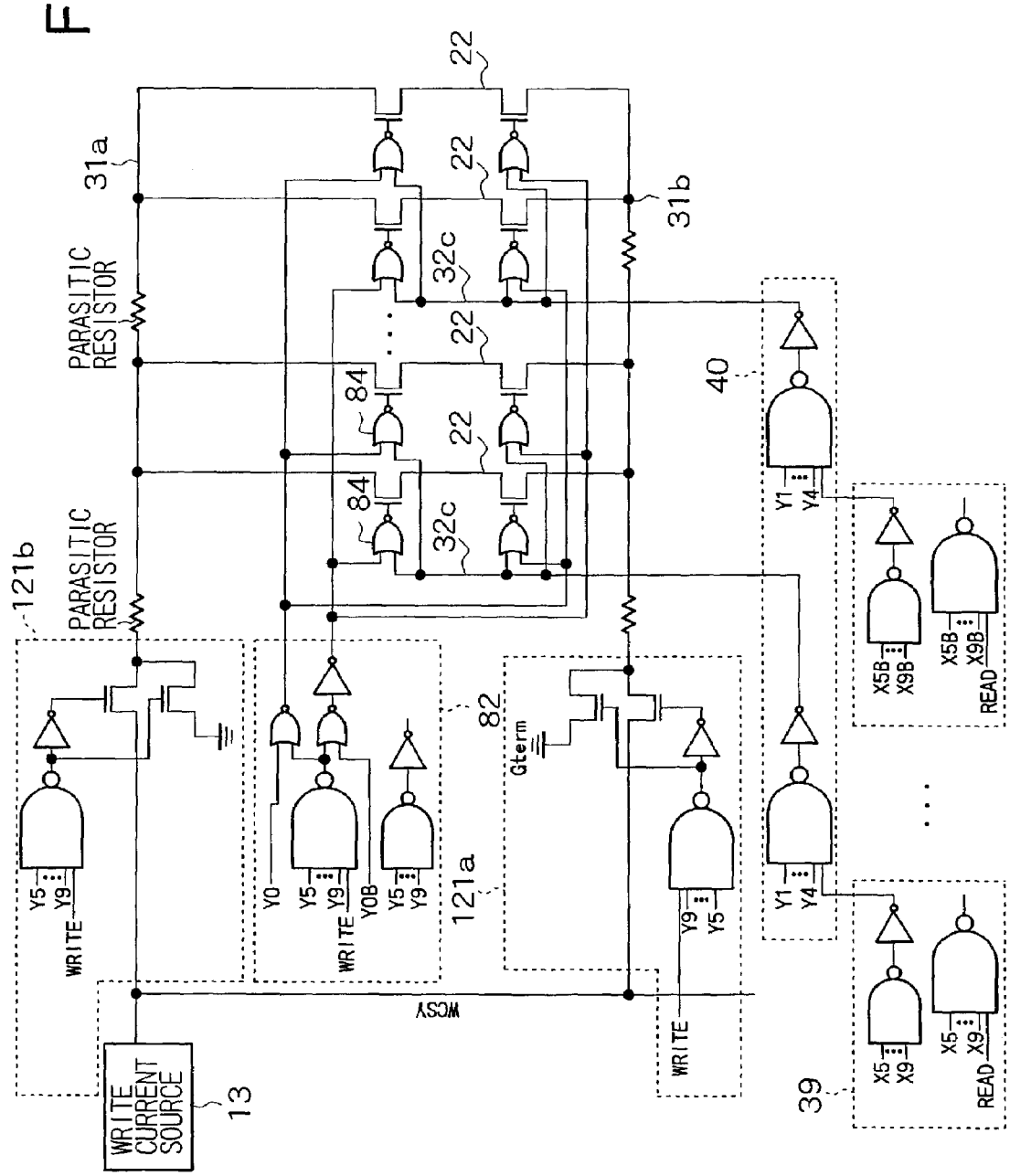
FIG. 40 is a circuit diagram of a write circuit system in the semiconductor memory device in FIG. 39.

FIG. 40 is a circuit diagram of a write circuit system in the semiconductor memory device 120.

In FIG. 40, one of the complementary main bit lines 31a and 31b is selected by a write data signal DATA and its inverted signal DATAB, and the other one is fixed to the termination potential. Accordingly, writing to the memory cell 11a is executed in a way similar to the way done in the semiconductor memory device 70 according to the second embodiment shown in FIG. 22.

Figure 41:
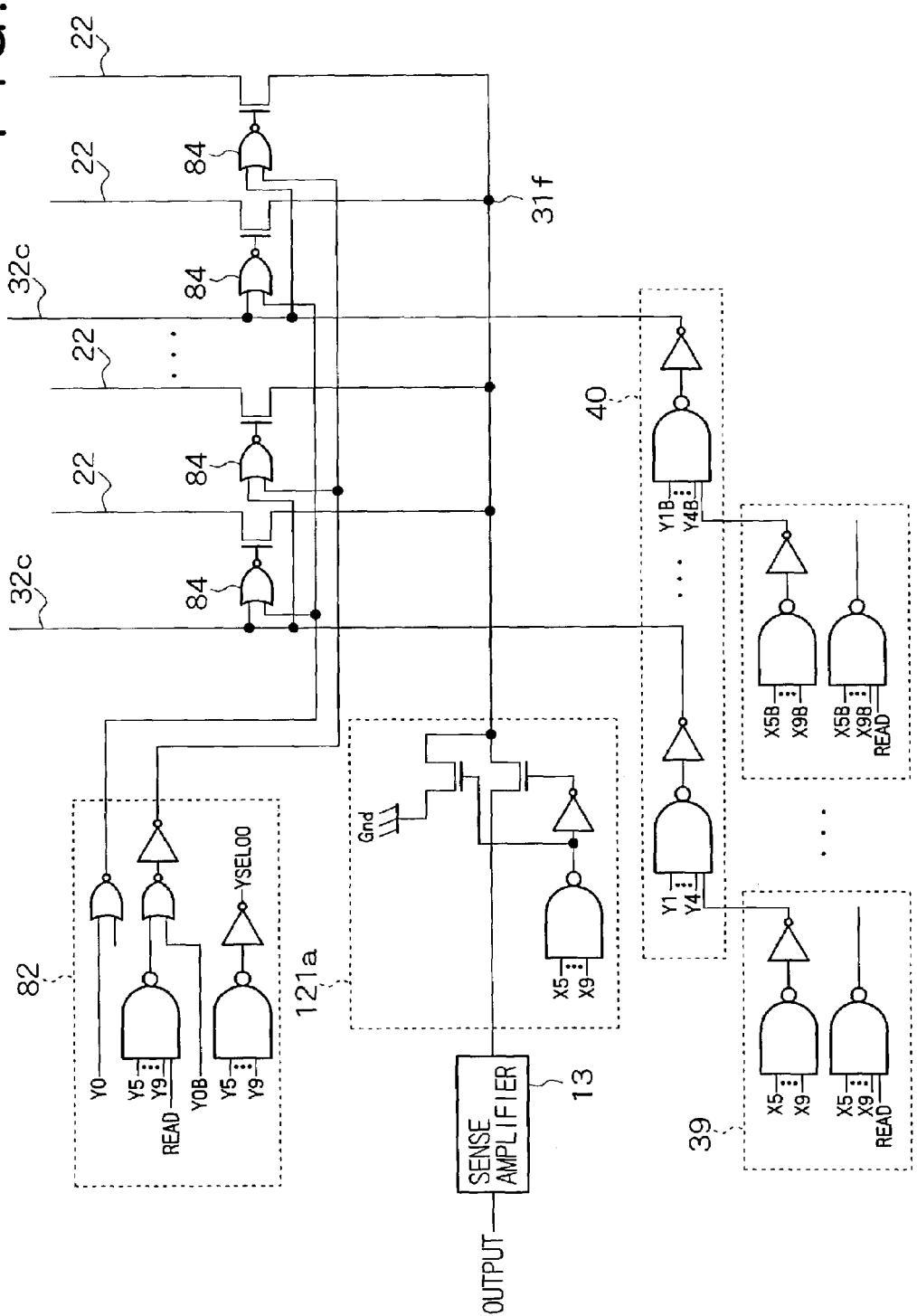
FIG. 41 is a circuit diagram of a read circuit system in the semiconductor memory device in FIG. 39.

FIG. 41 presents a circuit diagram of a read circuit system in the semiconductor memory device 120.

In FIG. 41, in response to a read signal READ which is enabled in read mode, the read main bit line selector 121c detects the current that flows through memory cell 11a via the read-only main bit line 31f and the read-only transistor 33c with a narrow gate width. This can eliminate the influence of the parasitic capacitance between the source and drain of the transistor 33b which has a relatively wide gate width, thereby ensuring accurate data reading from the memory cell 11a.

As the number of the NOR gates to which the block select signals RTXA and WTXA are input and the number of the bit lines 22 can be reduced to substantially a half, the load is reduced so that the access time can be improved.

FIGS. 42 through 59C illustrate semiconductor memory devices according to embodiments of the invention which perform temperature compensation.

(Eighth Embodiment)

Figure 42:
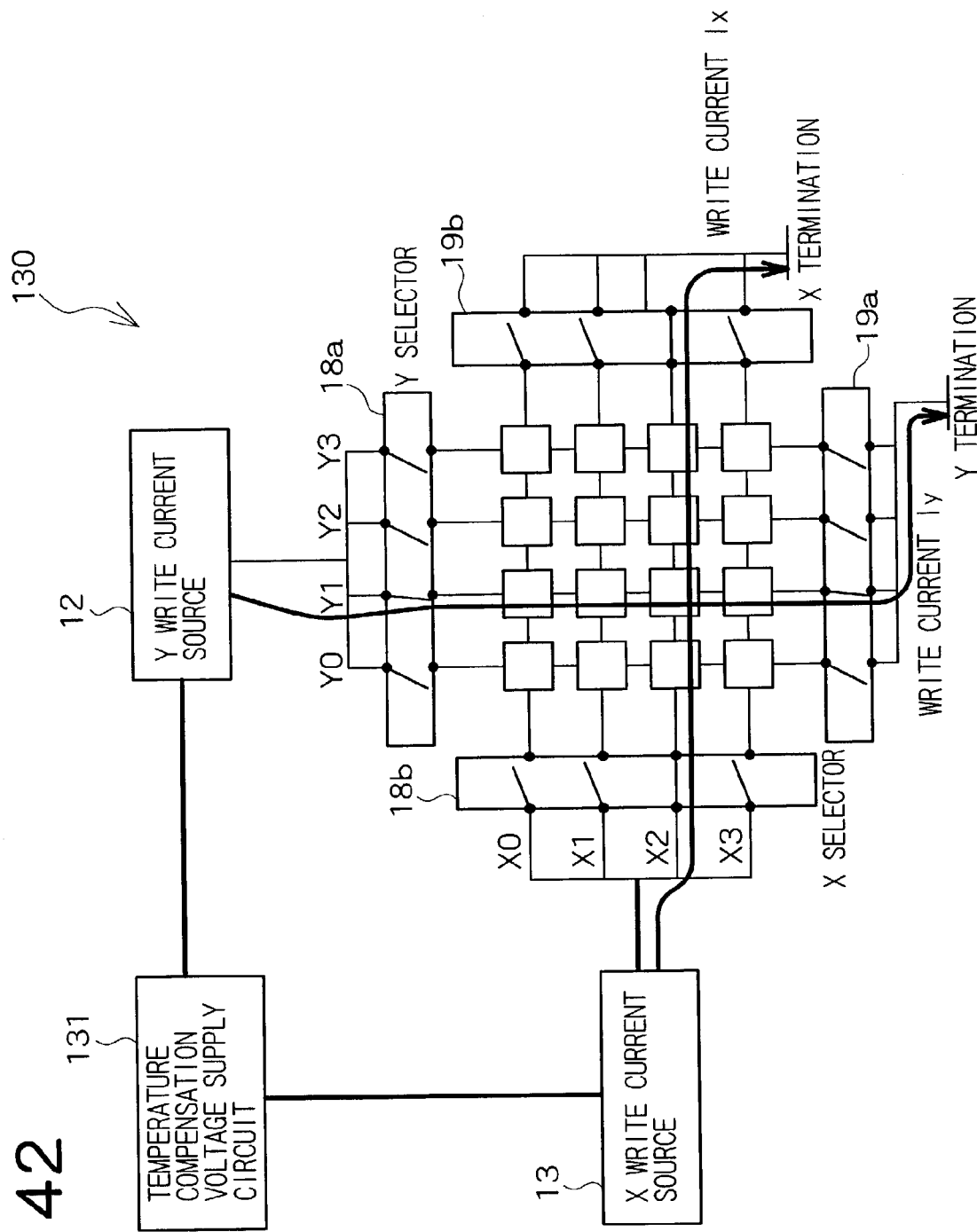
FIG. 42 is a block diagram showing the state of a semiconductor memory device according to an eighth embodiment of the invention in write mode.

FIG. 42 is a block diagram showing a write circuit system of a semiconductor memory device 130 according to the eighth embodiment of the invention.

In FIG. 42, the semiconductor memory device 130 has a temperature compensation voltage supply circuit 131, which characterizes this embodiment, in addition to the memory cell array 16, selector circuit 18b, Y selector circuit 18a, X termination circuit 19b, Y termination circuit 19a, write current sources 12 and 13.

One gate of the selector circuit 18b, one gate of the Y selector circuit 18a, the X termination circuit 19b and the Y termination circuit 19a are enabled by an unillustrated control circuit and the write current sources 12 and 13 operate on the output voltage that is generated by the temperature compensation voltage supply circuit 131, thereby allowing the write current to flow through a desired memory cell.

FIG. 42 shows the state of the semiconductor memory device 130 in write mode and shows, in thick lines, those selectors, transistors and so forth which are turned on at the time of writing the memory cell 11a.

Figure 43:
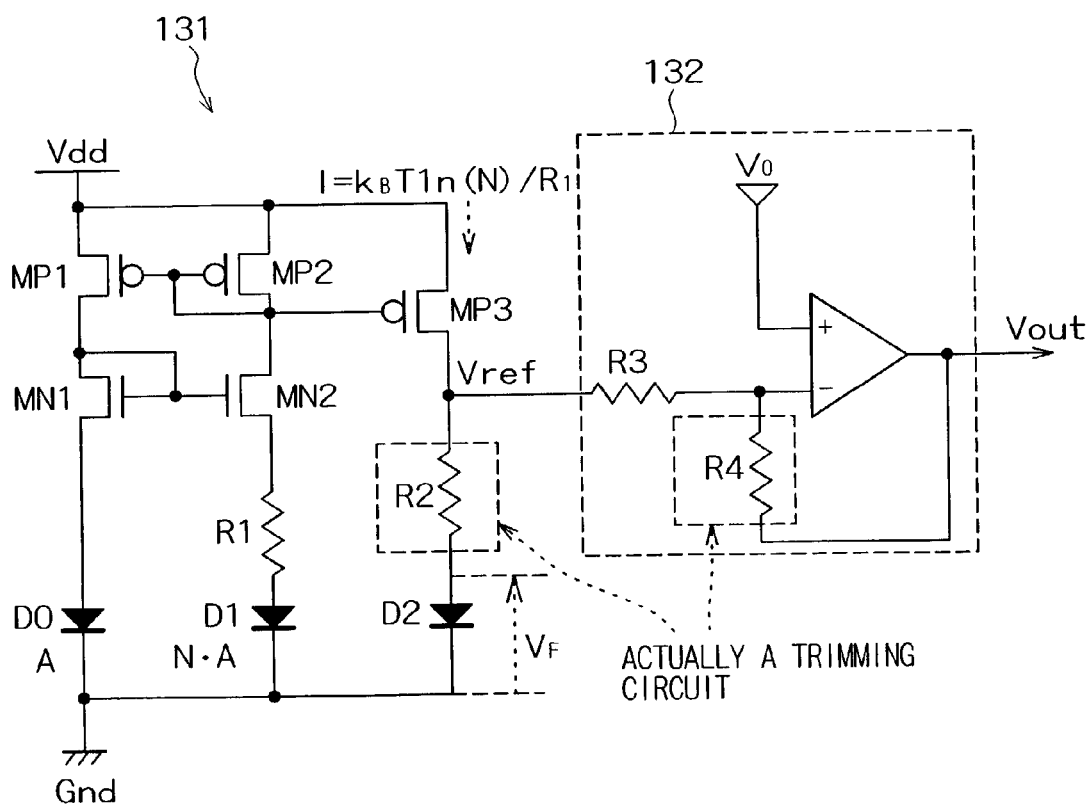
FIG. 43 is a circuit diagram exemplifying the structure of a temperature compensation voltage supply circuit in the semiconductor memory device in FIG. 42.

The operation compensation range of an ordinary LSI is 0° C. to 80° C. The and the temperature gets higher inside the package. In this respect, the temperature compensation voltage supply circuit 131 serves to reduce the reversed magnetization or the write current so that a temperature difference of 100° C. can be coped with during usage. The temperature compensation voltage supply circuit 131 is constituted by a reference voltage circuit as shown in FIG. 43. Specifically, the temperature compensation voltage supply circuit 131 is constructed as a band-gap reference circuit including three diodes D0, D1 and D2 and transistors MP1, MP2, MP3, MN1 and MN2. The diodes D0, D1 and D2 have such characteristics that the band-gap voltage decreases at the rate of about 0–2 mV/° C. as the temperature rises.

In accordance with an increase in temperature, therefore, the source potentials of the transistors MN1 and MN2 drop, thus increasing a current mirror current I. The current mirror current I is given by an equation 1:

$$I = k_B T \ln(N)/R_1 \quad (1)$$

where N is the number of transistors and $k_B$ is Boltzmann's constant.

Therefore, a voltage across a resistor R2 increases as the temperature rises and a reference voltage Vref is given by an equation 2:

$$V_{ref} = V_F + k_B T/q \cdot (R2/R1) \ln(N) \quad (2)$$

where q is the charge elementary quantity. The negative temperature coefficient in the first term and the positive temperature coefficient in the second term in the equation 2 can allow the reference voltage Vref to have a negative characteristic or a positive characteristic in an arbitrary range by adequately selecting the constants of the resistors R1 and R2.

As apparent from the above, the temperature compensation voltage supply circuit 131 works to provide its output voltage, the reference voltage Vref, with an intended temperature dependency.

As the reference voltage Vref is subjected to voltage conversion in a voltage conversion circuit 132, it is possible to generate an output voltage which has two parameters r1 (=R1/R2)) and r2 (=R4/R3) and is given by an equation 3:

$$V_{out} = (1+R4/R3)V_0 - (R4/R3)V_{ref} \quad (3)$$

where $V_0$ is a constant voltage which is generated by a normal temperature compensation circuit and does not have a temperature dependency.

The resistors R2 and R4 are actually constructed as a trimming circuit and can thus perform trimming.

Figure 44:
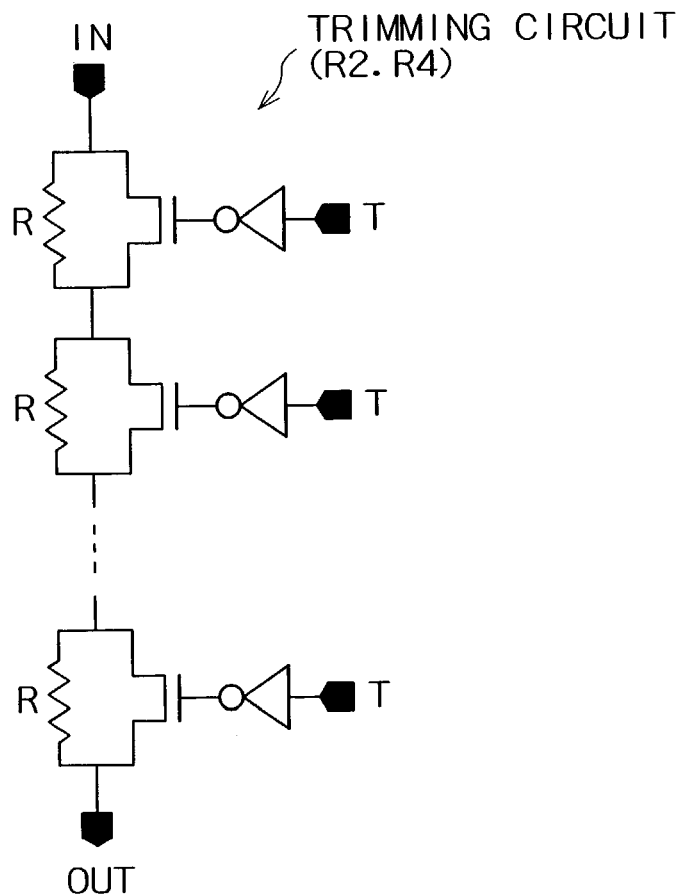
FIG. 44 is a circuit diagram exemplifying the structure of a trimming circuit to be used in the temperature compensation voltage supply circuit in FIG. 43.

Such a trimming circuit is constructed by connecting N sets of parallel-connected resists and transistors in series, as shown in FIG. 44. As a selected transistor T is turned on, the resistor R connected in parallel to the transistor T is short-circuited, so that the adequate resistance as a whole can be obtained.

Figure 45:
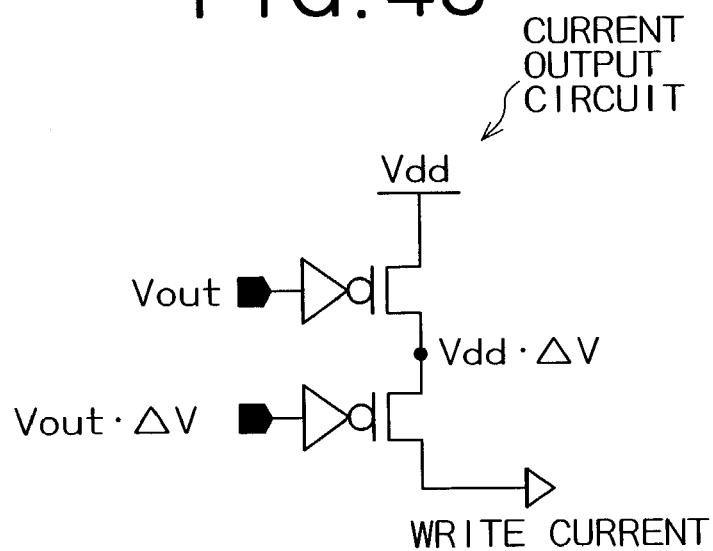
FIG. 45 is a circuit diagram exemplifying the structure of a write current output circuit in the semiconductor memory device in FIG. 42.

As the output voltage Vout is output from the temperature compensation voltage supply circuit 131, the write current sources 12 and 13 apply the output voltage Vout and a voltage Vout−ΔV to the gates of the transistors that constitute the current output circuit as shown in FIG. 45, and output the write currents having the desired temperature dependency in accordance with a variation in gate voltage caused by a temperature change.

Figure 46:
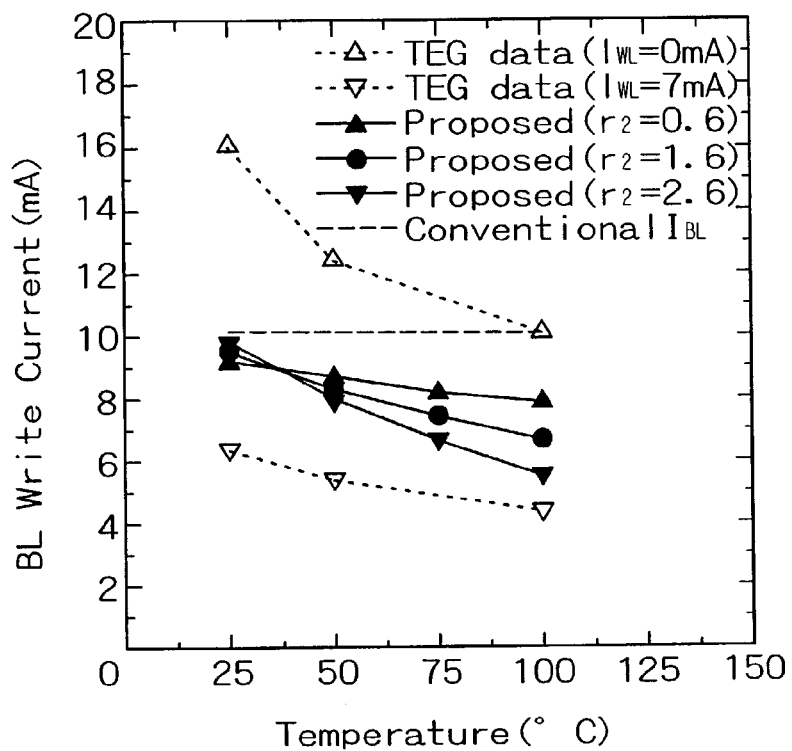
FIG. 46 is a graph showing the temperature characteristic of a write current in the semiconductor memory device in FIG. 42.

Specifically, provided that a variation in Vf is −2 mV/° C., r1=10 and r2 is changed to be equal to 0.6, 1.6 and 2.6, the temperature dependencies of the write currents become as shown in FIG. 46. In the diagram, a broken line indicates the conventional write current value without a temperature dependency. As the conventional write current value coincides with the reversed current of an unselected memory cell at 100° C., erroneous writing occurs. White marks show measured values and black marks show the temperature dependencies of the write currents at the time they are set. When r2=1.6, particularly, the designed write current has a temperature dependency which approximately matches with that of the measured write current for a selected memory cell.

Such a temperature dependency causes the individual magnetic films in the memory cell array 16 (in this example, a 1-Gb cell array constituted by 1 k arrays of 1 Mb) to have a writing variation due to a process variation, such as a variation in shape or composition, or a variation in magnetic interaction with the pin layer. Given that the then standard deviation of a word current $I_W$ is $\sigma(I_W)$ and this distribution is given by a normal distribution $f(x, \mu, \sigma; I_W)$, the probability (Pass ratio) $P(I_W, I_B)$ of accomplishing error-free writing to a selected memory cell when a bit line current $I_B$ and the word line current $I_W$ are let to flow to the selected memory cell is given by the following equation 4.

$$P(I_B, I_W) = [\int_{-\infty}^{I_B} f(x, \mu, \sigma; I_W) dx] - [1 - \int_{-\infty}^{I_B} f(x, \mu, \sigma; 0) dx]^N \quad (4)$$

where $N=10^3$. The results of the calculation of the equation by using the distribution function obtained from the actual measurement are shown by black marks in FIG. 47. In the diagram, the vertical scale represents the number of defective cells or 1 Gb×P ($I_W, I_B$) or the number of write-disabled memory cells or the number of erroneously written memory cells. The horizontal scale represents the standard deviation σ which is standardized by the average value of the current inverted by the bit lines alone.

Figure 47:
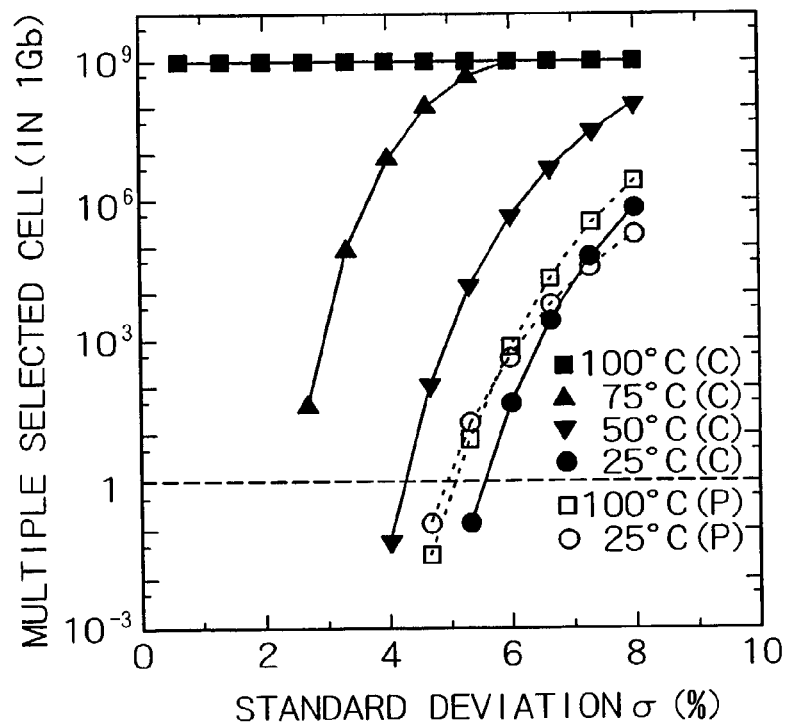
FIG. 47 is a graph showing the effect of temperature compensation in the semiconductor memory device in FIG. 42.

It is apparent from FIG. 47 that in case of using a circuit to which the write current that does not depend on the temperature as per the prior art, σ<6% is required at 25° C. in order to acquire 100% bit-pass, but even with σ=5%, the number of multiple selected memory cells rapidly increases to $10^4$ and $10^8$ as the temperature rises to 50° C. and 75° C. Even at 75° C., σ<2% is required in order to acquire 100% bit-pass. Further, at 100° C., multiple selection is inevitable even σ is set equal to or smaller than 1%.

Figure 48:
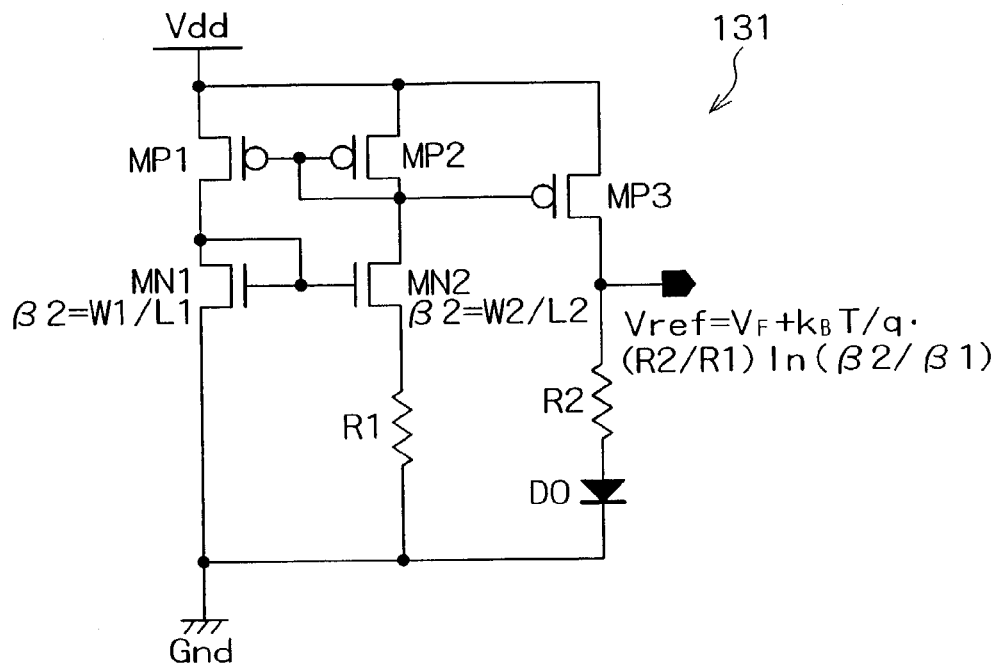
FIG. 48 is a circuit diagram exemplifying another structure of the temperature compensation voltage supply circuit in the semiconductor memory device in FIG. 42.

Although the temperature compensation voltage supply circuit 131 in the above-described semiconductor memory device 130 uses a band-gap reference circuit which uses the diodes D0, D1 and D2 as a reference voltage circuit, the structure is not restrictive and the write current can also be provided with a temperature dependency by using a sub threshold area of transistors as shown in FIG. 48. In this case, the reference voltage Vref is given by an equation 5:

$$V_{ref} = V_F + k_B T/q \cdot (R2/R1)\ln(\beta 2/\beta 1) \quad (5)$$

where β1 and β2 are (gate width S/gate length L) of the transistors MN1 and MN2, respectively.

Figure 49:
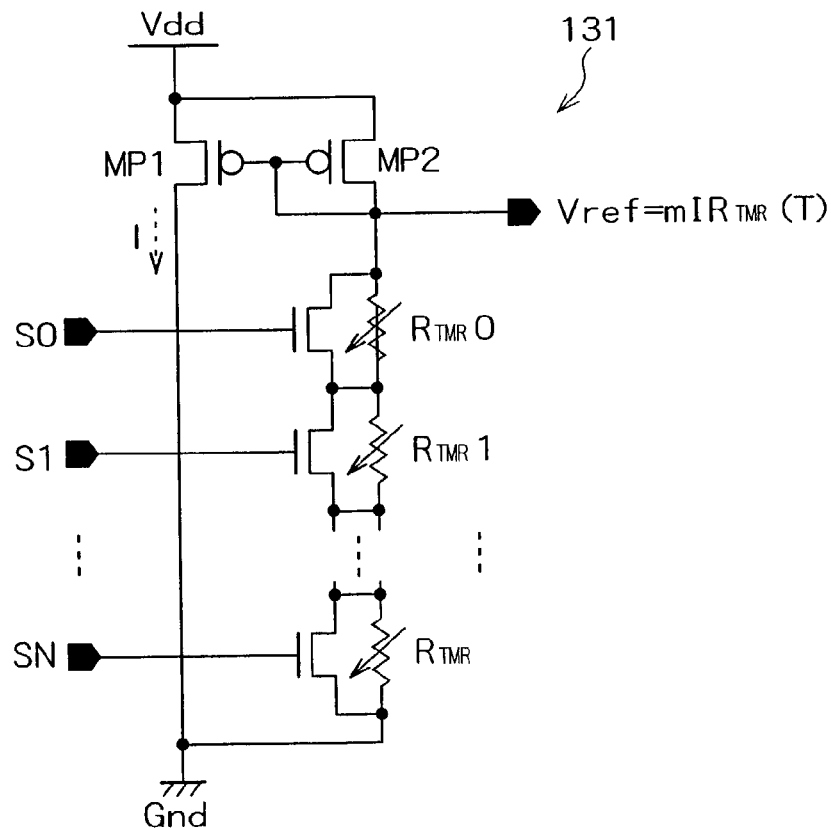
FIG. 49 is a circuit diagram exemplifying a different structure of the temperature compensation voltage supply circuit in the semiconductor memory device in FIG. 42.

The temperature compensation voltage supply circuit 131 may use a reference voltage circuit with a structure as shown in FIG. 49. In this case, although the resistance, $R_{TMR}$, of a reference TMR decreases with an increase in temperature, the output voltage Vref becomes $mIR_{TMR}$ (where m is the number of selected TMRs) by causing a constant current I which does not depend on the temperature to flow to the reference TMR (the temperature dependency of the current mirror current being neglected). As the output voltage Vref is input to a voltage conversion circuit similar to the one shown in FIG. 43 (except that the resistors are constituted by TMRs), therefore, the output voltage Vout is given by the following equation 6.

$$V_{out} = (1 + R4/R3)V_0 - (R4/R3)mIR_{TMR}(T) \quad (6)$$

The output voltage Vout increases with a rise in temperature, and the current which decreases with a rise in temperature is acquired by using this voltage at the input of the write current source (e.g., the gate of the PMOS transistor).

According to the semiconductor memory device 130, therefore, even in a case where the temperature dependency of the resistor and the temperature dependency of the TMR write current are influenced by a process variation or the like and are thud deviated from the matched profile, the adequate write current flow to the memory cells so that writing precision does not get lower.

(Ninth Embodiment)

Figure 50:
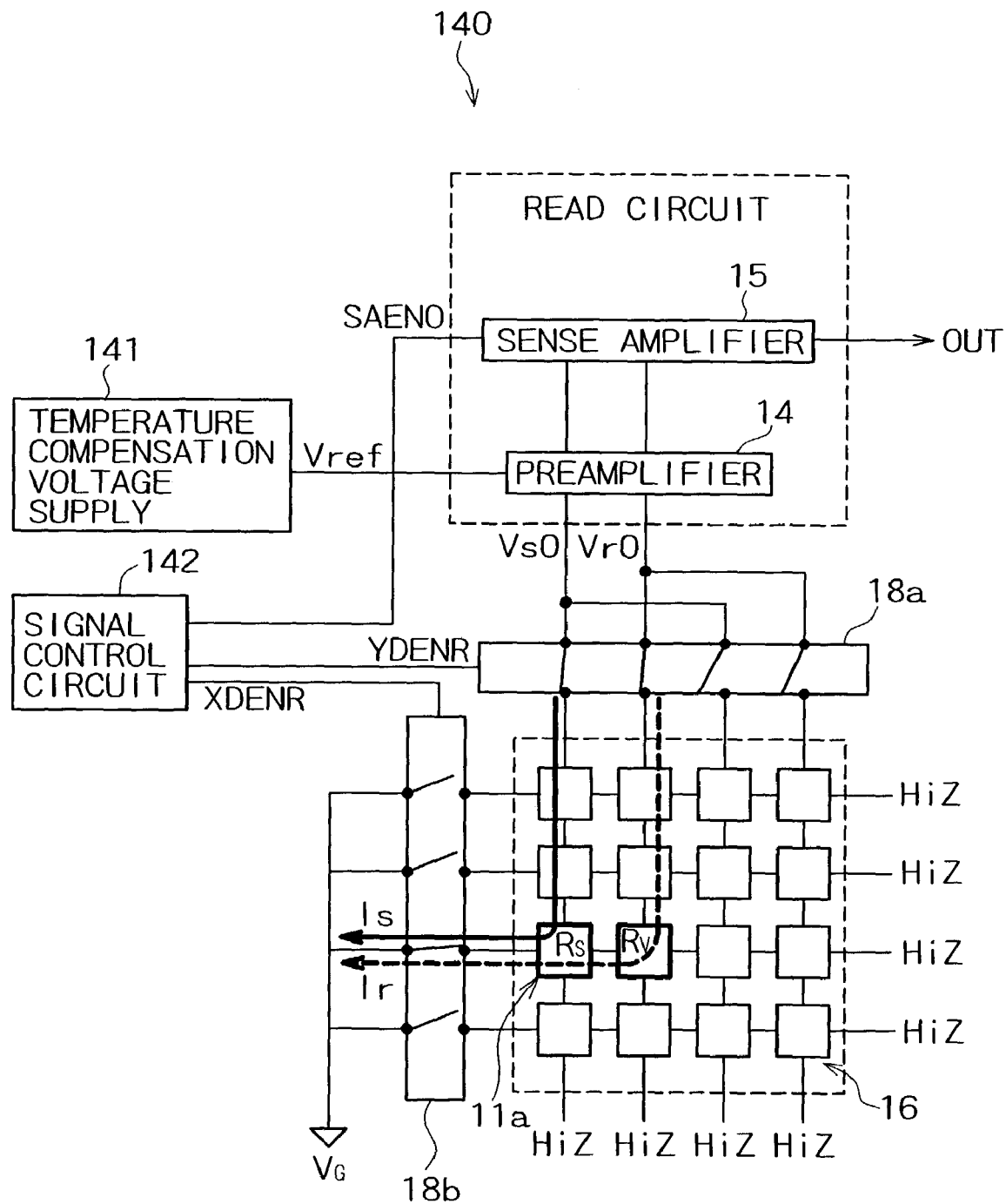
FIG. 50 is a block diagram showing the state of a semiconductor memory device according to a ninth embodiment of the invention in read mode.

FIG. 50 is a block diagram showing a read circuit system of a semiconductor memory device 140 according to the ninth embodiment of the invention.

In FIG. 50, the semiconductor memory device 140 has a temperature compensation voltage supply circuit 141, which characterizes this embodiment, in addition to the memory cell array 16, selector circuit 18b, Y selector circuit 18a, X termination circuit (not shown), Y termination circuit (not shown), the preamplifier 14 as a read power supply and the sense amplifier 15.

The selector circuit 18b, the Y selector circuit 18a, the X termination circuit, the Y termination circuit and the sense amplifier 15 are enabled by a signal control circuit 142 and the preamplifier 14 operates on the output voltage that is generated by the temperature compensation voltage supply circuit 141, thereby allowing the read current to flow to a desired memory cell.

FIG. 50 shows the state of the semiconductor memory device 140 in write mode and shows, in thick lines, those selectors, transistors and so forth which are turned on at the time of writing the memory cell 11a.

In this case, each memory cell 11 comprises two TMR cells in which "0" and "1" or "1" and "0" are respectively written in a complementary fashion.

As the signal control circuit 142 enables read signals XDENR and YDENR, the selected gates in the selector circuit 18b and the Y selector circuit 18a are enabled.

Unselected gates and the termination side are set to HiZ.

Given that Is and Ir are currents respectively flowing through a selected cell Rs and a reference cell Rr, Is<Ir (or Is>Ir) when Rs>Rr (or Rs<Rr).

Figure 51:
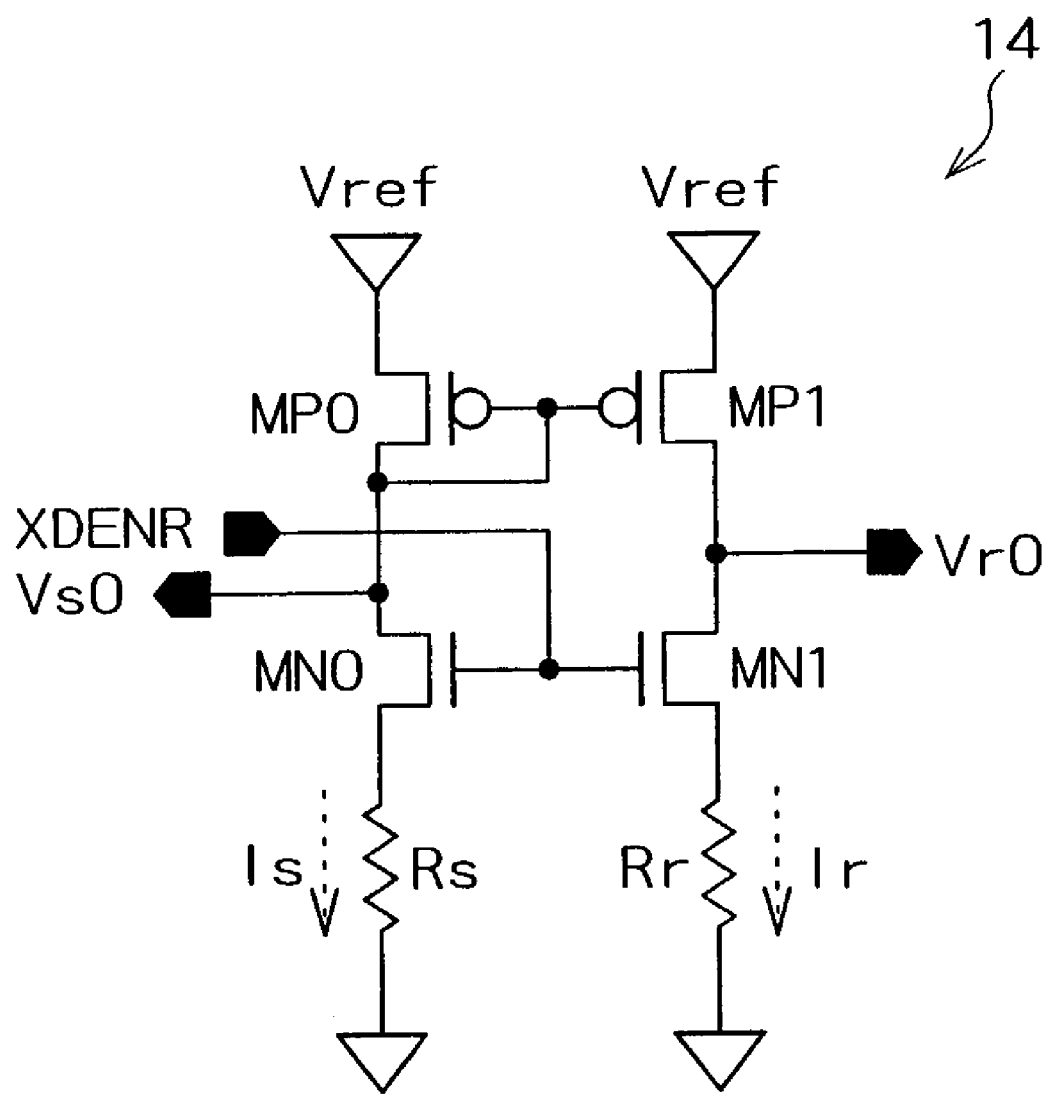
FIG. 51 is a circuit diagram exemplifying the structure of a preamplifier in the semiconductor memory device in FIG. 42.

The preamplifier 14 is constructed as shown in, for example, FIG. 51, and operates to convert the current difference to a voltage. The output voltages of the preamplifier 14 become Vs0 and Vr0. As a result, the sense amplifier 15 outputs "0" (or "1") depending on the positive or negative sign of the voltage difference ΔV (=Vs0–Vr0).

The operation of the sense amplifier 15 will be elaborated below.

Figure 52:
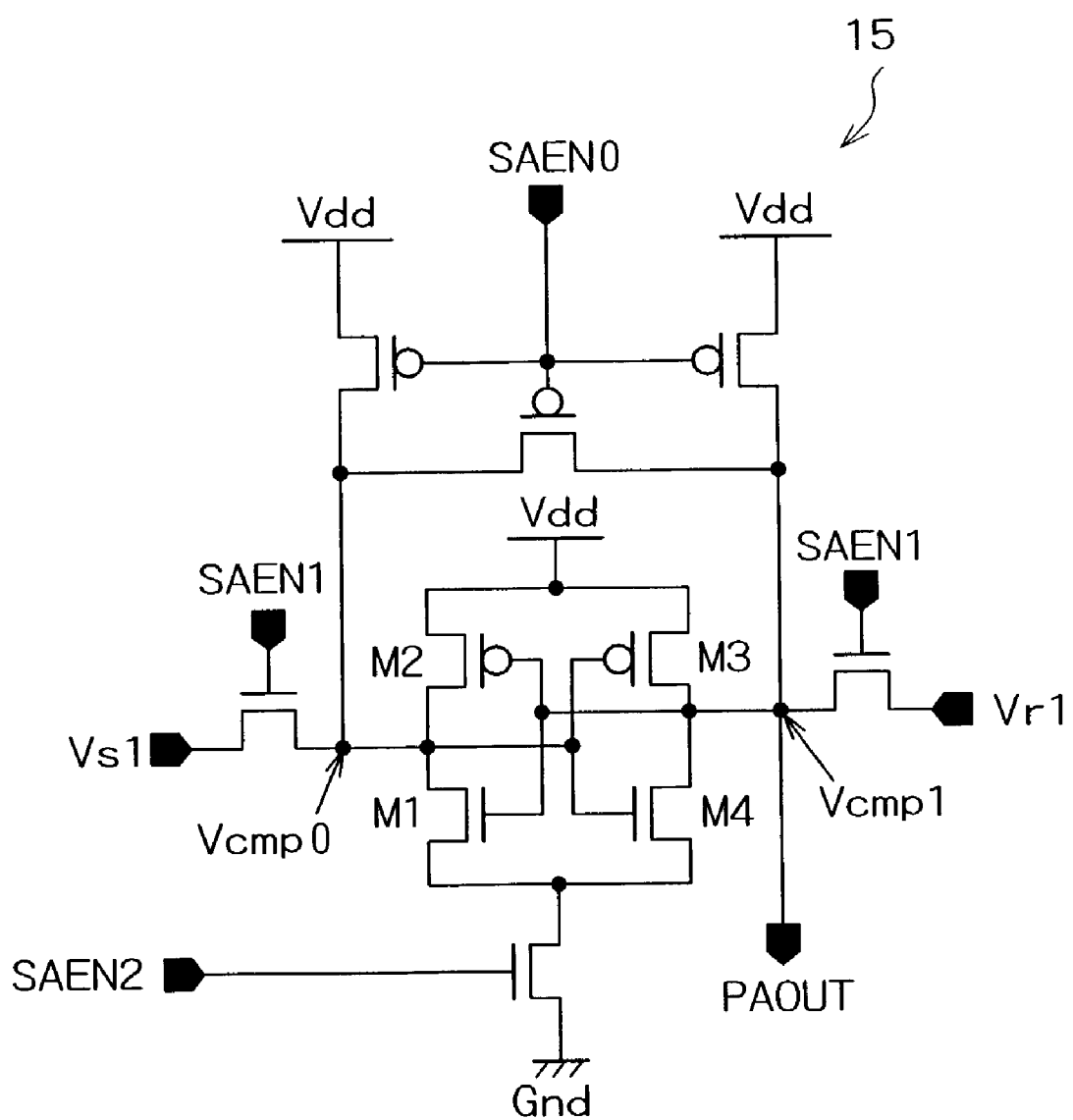
FIG. 52 is a circuit diagram exemplifying the structure of a sense amplifier in the semiconductor memory device in FIG. 42.

The sense amplifier 15 is constructed as shown in, for example, FIG. 52. While SAEN0 is disabled, nodes Vcmp0 and Vcmp1 are precharged to be approximately a constant voltage Vdd. When SAEN0 is enabled by the signal control circuit 142 in read mode, the nodes Vcmp0 and Vcmp1 become floating.

Figure 53:
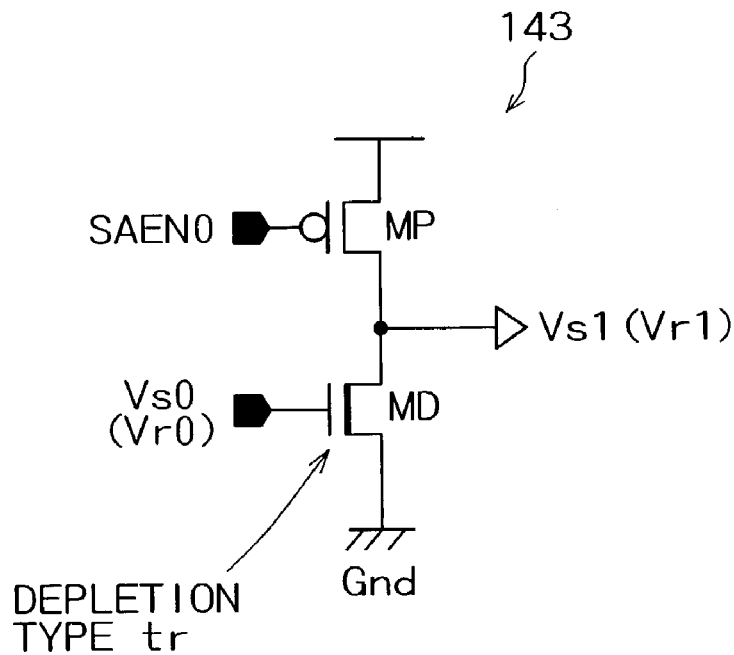
FIG. 53 is a circuit diagram exemplifying the structure of a buffer circuit in the semiconductor memory device in FIG. 42.
Figure 54:
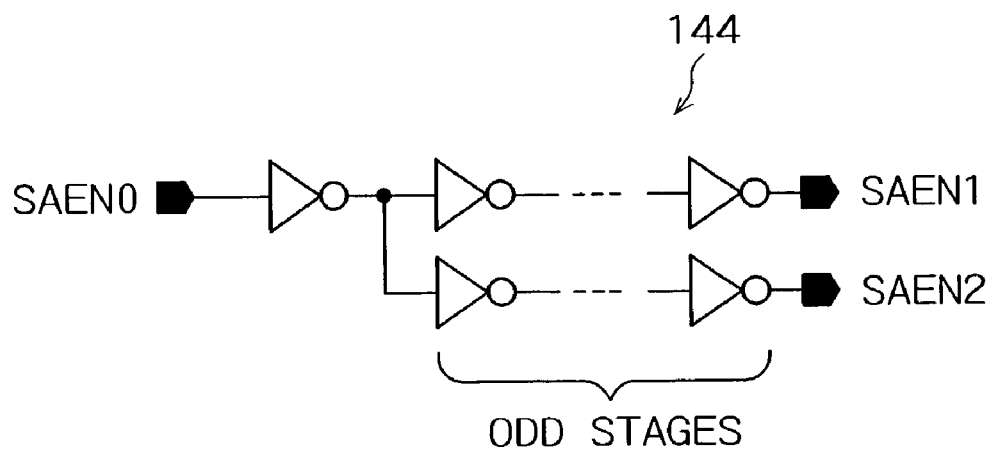
FIG. 54 is a circuit diagram exemplifying the structure of a delay circuit in the semiconductor memory device in FIG. 42.

As the output voltages Vs0 and Vr0 should be low voltages of, for example, about 0.3 to 0.5 V, they are amplified to potentials Vs1 and Vr2 of about Vdd/2 by a buffer circuit 143 as shown in, for example, FIG. 53. At this time, SAEN1 is enabled by a delay circuit 144 with a structure as shown in, for example, FIG. 54, after time t1 (ns) since the enabling of SAEN0, then the output voltages Vs0 and Vr0 are amplified to Vs1 and Vr2.

Subsequently, SAEN2 is enabled by the delay circuit 144 after time t2 (ns) since the enabling of SAEN0. As a result, feedback is applied to a latch circuit comprised of the transistors M1 to M4 of the sense amplifier 15 and the difference between the voltages at the nodes Vcmp0 and Vcmp1 is amplified and a voltage PAOUT is output.

Figure 55:
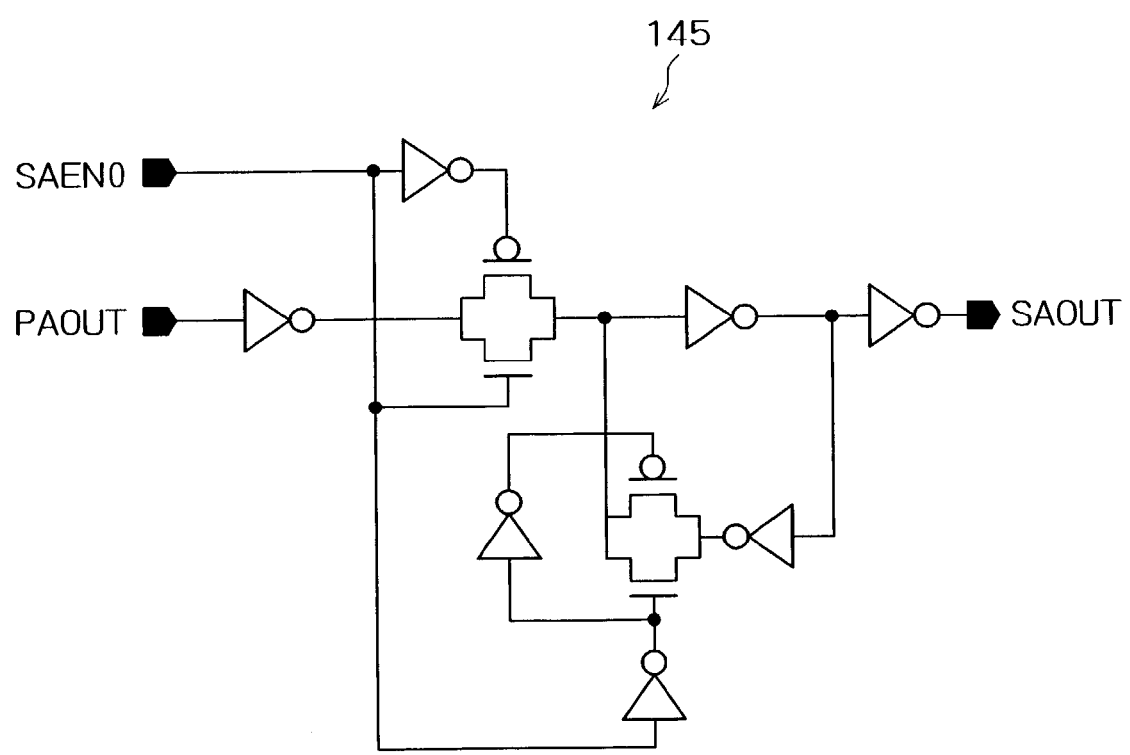
FIG. 55 is a circuit diagram exemplifying the structure of a latch circuit in the semiconductor memory device in FIG. 42.

A latch circuit 145 having a structure as shown in, for example, FIG. 55 latches the voltage PAOUT and reads the value of PAOUT and outputs a signal SAOUT of "0" or "1".

Figure 56:
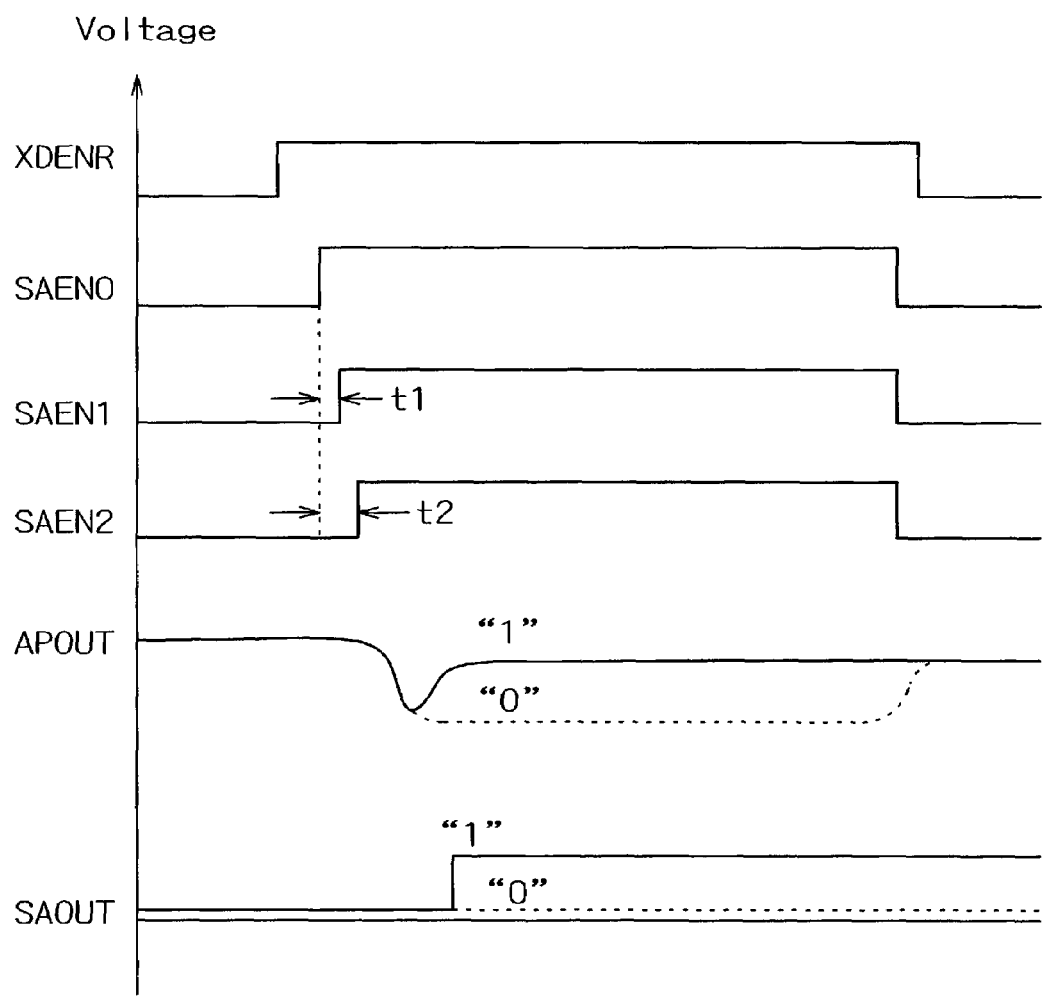
FIG. 56 is a time chart illustrating the relationship among individual signals in the semiconductor memory device in FIG. 42.

The aforementioned signals XDENR, SAEN0, SAEN1 and SAEN2 and the output voltages PAOUT and SAOUT have waveforms as shown in FIG. 56.

When the temperature rises, Rs and Rr decrease, increasing Is and Ir, but ΔI (=Is–Ir) decreases. The voltage Vref that maximizes |ΔI| is shifted to the low voltage side, so that Vref should be lowered as the temperature rises. The profile of the temperature dependency of the optimal value of Vref should be measured and the trimming circuit of the temperature compensation voltage supply circuit 141 should be adjusted in such a way as to generate the temperature dependency that would match the profile at the time of shipment.

Figure 57A:
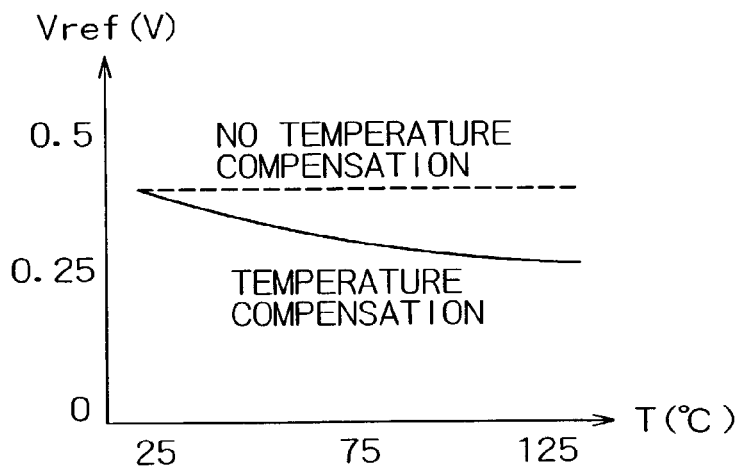
FIGS. 57A through 57C are graphs showing the effects of temperature compensation in the semiconductor memory device in FIG. 50.
Figure 57B:
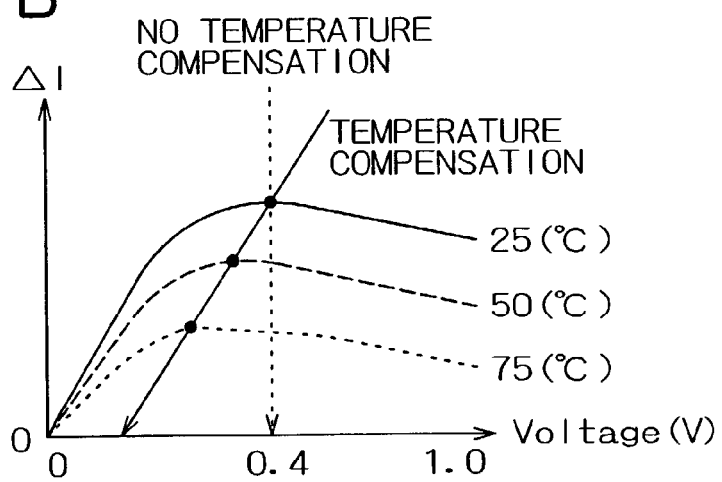
Figure 57C:
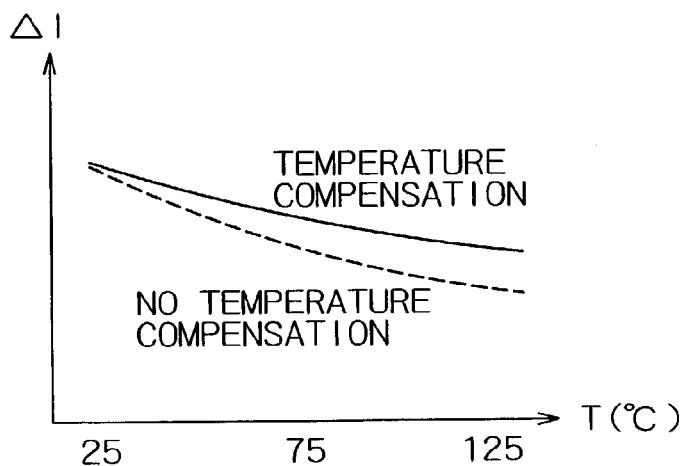

Accordingly, the temperature compensation effects by the temperature compensation voltage supply circuit 141 are acquired as illustrated in FIGS. 57A to 57C. Specifically, as the temperature compensation voltage supply circuit 141 is set in such a way that the read output voltage Vref has the proper temperature dependency as shown in FIG. 57A, the potential difference that maximizes the current difference ΔI in accordance with a temperature change as shown in FIG. 57B is applied across the TMR, suppressing the current difference lower, which would increase the read margin.

(Tenth Embodiment)

Figure 58:
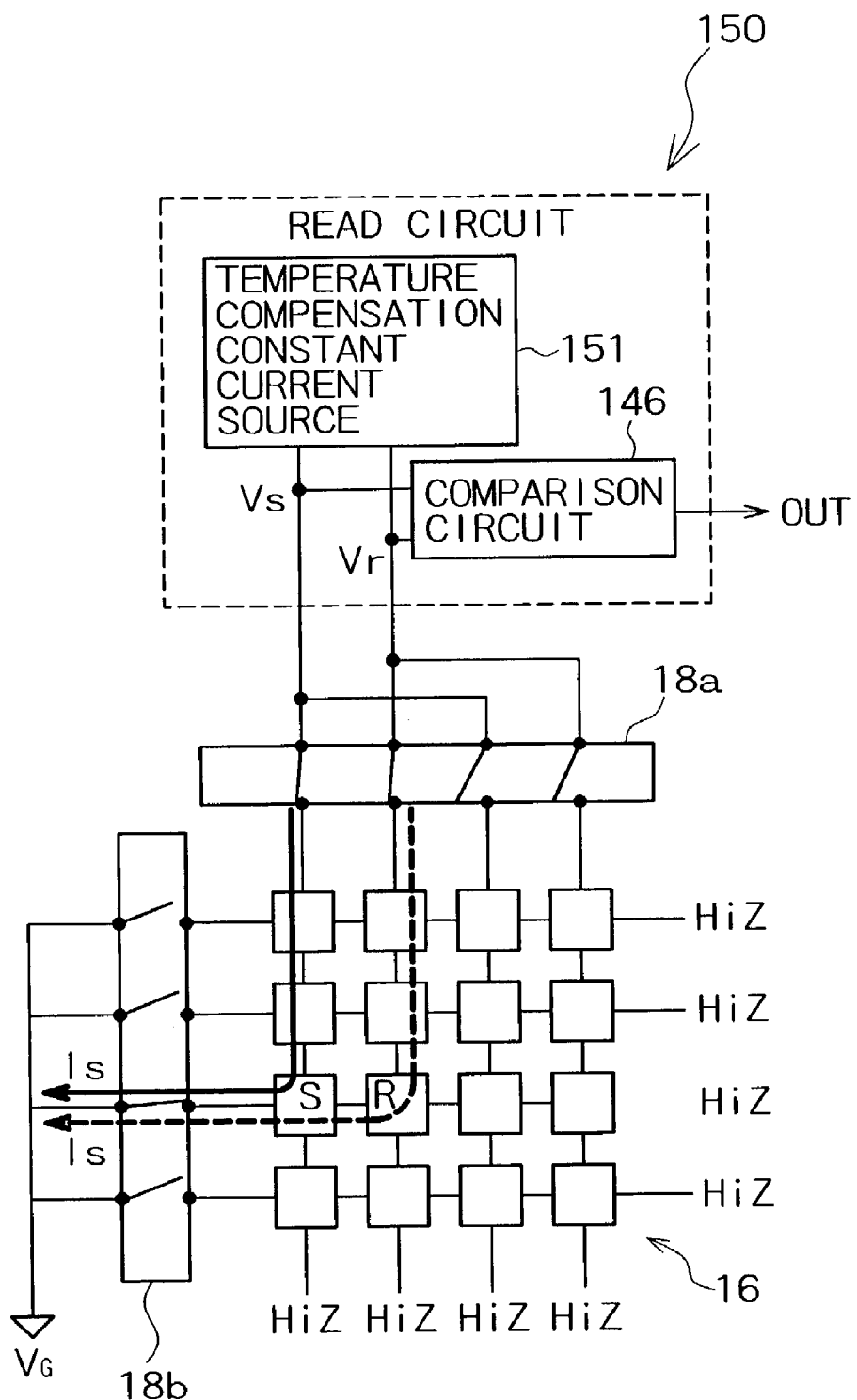
FIG. 58 is a block diagram showing the state of a semiconductor memory device according to a tenth embodiment of the invention in read mode.

Although the semiconductor memory device 140 secures the read margin by using the sense amplifier 15 or the circuit that has a small temperature dependency with respect to a difference between the currents of "0" and "1" as it detects the read current (current sensing), the structure is not restrictive, but the read margin can be guaranteed by voltage sensing as achieved in a semiconductor memory device 150 shown in FIG. 58.

In FIG. 58, the semiconductor memory device 150 allows a nearly constant current Is to flow to the TMR regardless of "0" or "1" and detects a potential difference Vs (=Is·R(T)) across the TMR by means of a comparison circuit 146.

In this case, the read current is let to flow to the TMR in a way similar to the way the write current does in the semiconductor memory device 130 shown in FIG. 42.

Further, the semiconductor memory device 150 has a temperature compensation constant current source circuit 151 to do temperature compensation in place of the preamplifier 14.

The resistance of the TMR generally demonstrates such a characteristic as to be inversely proportional to the temperature, and is approximated by the following equation 7.

$$Rj(T_0+\Delta T)=Rj/(1+bj\Delta T)(j=0, 1) \quad (7)$$

If the read current output from the temperature compensation constant current source circuit 151 is set to have a temperature dependency as given by the following equation 8, therefore, the sense voltage of the TMR takes a value given by an equation 9 given below.

$$Is(T_0+\Delta T)=Is+a\Delta T \quad (8)$$

$$Vsj=Is\cdot Rj([I+a\Delta T/Is]/[1+bj\Delta T]) \quad (9)$$

With a=bj×Is, the sense potential Vsj can be set to a constant value Vsj=IsRs irrespective of the temperature. This makes it possible to guarantee the read margin.

In general, b0<b1, so that the temperature dependencies of both the sense potentials Vs0 and Vs1 cannot be eliminated completely. However, by setting a=(b0+b1)/(2Is), for example, it is possible to reduce variations in both sense potentials of "0" and "1" caused by the temperature dependencies.

Figure 59A:
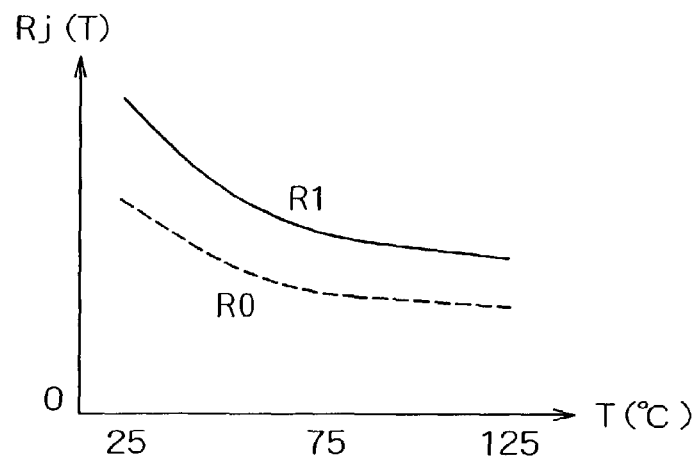
FIGS. 59A through 59C are graphs showing the effects of temperature compensation in the semiconductor memory device in FIG. 58.
Figure 59B:
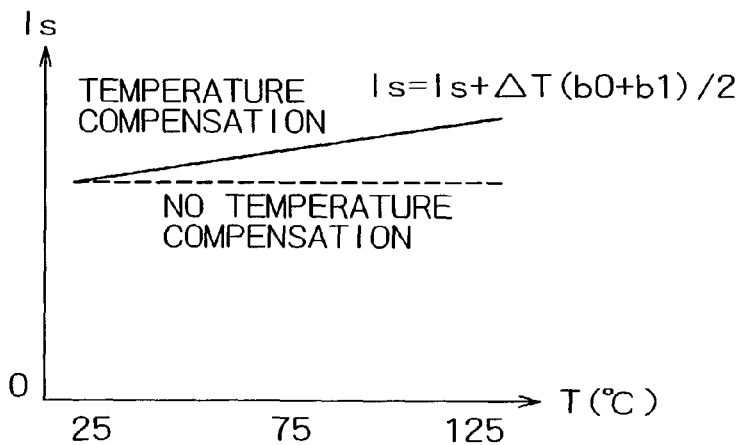
Figure 59C:
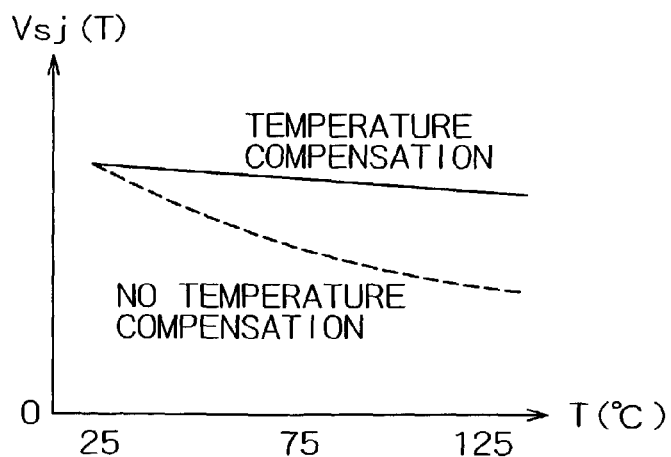

In this manner, the temperature compensation effects by the temperature compensation constant current source circuit 151 are acquired as illustrated in FIGS. 59A to 59C. Specifically, as temperature compensation for the read current Is is performed with respect to the temperature dependency of the resistance of the TMR as shown in FIG. 59A, a variation in sense potential Vsj can be reduced as shown in FIG. 59C, thus increasing the read margin.

In the above-described embodiment, because the temperature dependency of the read current Is should be designed by referring to the temperature dependency profile of the resistor R(T) of the typical TMR element, the read precision may be lowered due to the influence of a process variation or the like. The read current Is can however be controlled by using a reference TMR element as a resistor in the temperature control circuit. This makes the influence of a process variation or the like on the read precision harder.

According to the invention, as described above, the main bit line or main word line which supplies the write current from the write current source to each bit line or word line are so laid out to perpendicularly cross each bit line or word line. This makes it unnecessary to provide the main bit line selector or main word line selector in the memory cell array, so that the sizes of the transistors that constitute the main bit line selector or main word line selector can be made sufficiently large while hardly influencing the size of the chip on which the semiconductor memory device is fabricated.

With the design, therefore, the value of the write current that passes through the main bit line selector or main word line selector can be made sufficiently large, thus ensuring data writing to a desired memory cell with a stable write current. This makes it possible to perform accurate data writing while sufficiently guaranteeing the operational margin for the individual memory cells.

Temperature-dependent changes in the write margin and read margin can be made smaller by suppressing the temperature dependencies of the asteroid characteristics of a TMR element and MRAM as much as possible, thus ensuring the adequate write margin and read margin.

What is claimed is:

1. A semiconductor memory device comprising:
   a memory cell array having a plurality of tunneling magnetoresistive elements laid out in a hierarchical matrix form;
   a plurality of bit lines for letting a current to flow in those memory cells which are aligned in one direction;
   a plurality of word lines for letting a current to flow in those memory cells which are aligned in the other direction in such a way as to cross said bit lines;
   an X decoder for selecting a word line with respect to a selected memory cell;
   a Y decoder for selecting a bit line with respect to said selected memory cell, whereby data is written in said selected memory cell located at an intersection of said selected word line and said selected bit line by a combined magnetic field generated by letting a current to flow in said selected word line and bit line; and
   main bit lines which supply a write current from a write current source to said bit lines and are laid out in such a way as to cross said bit lines perpendicularly.

2. The semiconductor memory device according to claim 1, further comprising a main bit line selector, located outside said memory cell array on a same side as said X decoder, for selecting a main bit line.

3. The semiconductor memory device according to claim 1, wherein each of said main bit lines is designed as complementary main bit lines one of which is connected to said write current source and the other one of which is fixed to a termination to thereby distinguishably write "0" or "1" in a selected memory cell.

4. The semiconductor memory device according to claim 3, wherein said selected memory cell is connected to a sense amplifier in read mode by using both of said complementary main bit lines.

5. The semiconductor memory device according to claim 3, further including exclusive circuit, separate from a selector for selecting a bit line, as a circuit for fixing a potential of unselected bit lines.

6. The semiconductor memory device according to claim 3, wherein a power supply line for a terminating power supply in write mode is separated from other power supply lines in a chip which constitutes said semiconductor memory device.

7. The semiconductor memory device according to claim 1, wherein each of said main word lines is designed as complementary main word lines one of which is connected to said write current source and the other one of which is fixed to a termination to thereby change a direction of said write current.

8. The semiconductor memory device according to claim 7, wherein said selected memory cell is connected to a sense amplifier in read mode by using both of said complementary main word lines.

9. The semiconductor memory device according to claim 1, wherein a write main bit line and a read main bit line are separately provided as each of said main bit lines.

10. The semiconductor memory device according to claim 1, wherein a selection switch element provided in a sub array has a logical sum operation function for ORing an output of said X decoder or said Y decoder and a block select signal.

11. The semiconductor memory device according to claim 10, wherein said block select signal includes information of operation modes including a write or read mode.

12. A semiconductor memory device comprising:
a memory cell array having a plurality of tunneling magnetoresistive elements laid out in a hierarchical matrix form;
a plurality of bit lines for letting a current to flow in those memory cells which are aligned in one direction;
a plurality of word lines for letting a current to flow in those memory cells which are aligned in the other direction in such a way as to cross said bit lines;
an X decoder for selecting a word line with respect to a selected memory cell;
a Y decoder for selecting a bit line with respect to said selected memory cell, whereby data is written in said selected memory cell located at an intersection of said selected word line and said selected bit line by a combined magnetic field generated by letting a current to flow in said selected word line and bit line; and
main word lines which supply a write current from a write current source to said word lines and are laid out in such a way as to cross said word lines perpendicularly.

13. The semiconductor memory device according to claim 12, further comprising a main word line selector, located outside said memory cell array on a same side as said Y decoder, for selecting a main word line.

14. The semiconductor memory device according to claim 12, wherein each of said main bit lines is designed as complementary main bit lines one of which is connected to said write current source and the other one of which is fixed to a termination to thereby distinguishably write "0" or "1" in a selected memory cell.

15. The semiconductor memory device according to claim 14, wherein said selected memory cell is connected to a sense amplifier in read mode by using both of said complementary main bit lines.

16. The semiconductor memory device according to claim 14, further including exclusive circuit, separate from a selector for selecting a bit line, as a circuit for fixing a potential of unselected bit lines.

17. The semiconductor memory device according to claim 14, wherein a power supply line for a terminating power supply in write mode is separated from other power supply lines in a chip which constitutes said semiconductor memory device.

18. The semiconductor memory device according to claim 12, wherein each of said main word lines is designed as complementary main word lines one of which is connected to said write current source and the other one of which is fixed to a termination to thereby change a direction of said write current.

19. The semiconductor memory device according to claim 18, wherein said selected memory cell is connected to a sense amplifier in read mode by using both of said complementary main word lines.

20. The semiconductor memory device according to claim 12, wherein a write main bit line and a read main bit line are separately provided as each of said main bit lines.

21. The semiconductor memory device according to claim 12, wherein a selection switch element provided in a sub array has a logical sum operation function for ORing an output of said X decoder or said Y decoder and a block select signal.

22. The semiconductor memory device according to claim 21, wherein said block select signal includes information of operation modes including a write or read mode.

23. A semiconductor memory device comprising:
a memory cell array having a plurality of tunneling magnetoresistive elements laid out in a matrix form;
a plurality of bit lines for letting a current to flow in those memory cells which are aligned in one direction;
a plurality of word lines for letting a current to flow in those memory cells which are aligned in the other direction in such a way as to cross said bit lines;
an X decoder for selecting a word line with respect to a selected memory cell;
a Y decoder for selecting a bit line with respect to said selected memory cell, whereby data is written in said selected memory cell located at an intersection of said selected word line and said selected bit line by a combined magnetic field generated by letting a current to flow in said selected word line and bit line; and
a first circuit for changing a write current from a write current source independently depending on a direction of said write current and fixing a value of said changed write current.

24. The semiconductor memory device according to claim 23, wherein said first circuit has a register circuit having a capability of fixing a value, said register circuit includes a first memory element comprised of two or more of at least some of tunneling magnetoresistive elements in such a way that said tunneling magnetoresistive elements are connected in series to one another when said first memory element is in read mode, and at least a part of said first memory element is used as a memory location for a defective portion of said semiconductor memory device.

25. The semiconductor memory device according to claim 23, wherein said first circuit can change a write current value for a bit line or a word line in accordance with an address of said selected memory cell.

26. The semiconductor memory device according to claim 23, wherein a terminating power supply for terminating said write current has a test mode for stopping a power supply circuit, and an external terminal for leading a node of said terminating power supply to outside.

27. The semiconductor memory device according to claim 23, wherein said write current source has a basic transistor and an adjusting transistor as output transistors and said basic transistor in said output transistors has a minimum gate length while said adjusting transistor has a gate length greater than said minimum value.

28. A semiconductor memory device comprising:
a memory cell array having a plurality of tunneling magnetoresistive elements laid out in a hierarchical matrix form;
a plurality of bit lines, formed in sub array, for letting a current to flow in those memory cells which are aligned in one direction;
a plurality of word lines formed in a sub array, for letting a current to flow in those memory cells which are aligned in the other direction in such a way as to cross said bit lines;
an X decoder for selecting a word line with respect to a selected memory cell;
a Y decoder for selecting a bit line with respect to said selected memory cell, whereby data is written in said selected memory cell located at an intersection of said selected word line and said selected bit line by a combined magnetic field generated by letting a current to flow in said selected word line and bit line; and a switching element through which potentials of unselected word lines or unselected bit lines are fixed, which potentials of the other ones of said unselected word lines and unselected bit lines are fixed via associated memory cells.

29. The semiconductor memory device according to claim 28, wherein each of said main word lines is designed as complementary main word lines one of which is connected to said write current source and the other one of which is fixed to a termination to thereby change a direction of said write current.

30. The semiconductor memory device according to claim 29, wherein said selected memory cell is connected to a sense amplifier in read mode by using both of said complementary main word lines.

31. The semiconductor memory device according to claim 28, wherein a write main bit line and a read main bit line are separately provided as each of said main bit lines.

32. The semiconductor memory device according to claim 28, wherein a selection switch element provided in a sub array has a logical sum operation function for ORing an output of said X decoder or said Y decoder and a block select signal.

33. The semiconductor memory device according to claim 32, wherein said block select signal includes information of operation modes including a write or read mode.

* * * * *